US012386467B2

(12) United States Patent
Kim et al.

(10) Patent No.: US 12,386,467 B2
(45) Date of Patent: Aug. 12, 2025

(54) ELECTRONIC DEVICE CONFIGURED TO SENSE A PEN

(71) Applicant: Samsung Display Co., Ltd., Yongin-si (KR)

(72) Inventors: Hyungbae Kim, Yongin-si (KR); Gayoung Kim, Yongin-si (KR); Sanghyun Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/821,771

(22) Filed: Aug. 30, 2024

(65) Prior Publication Data
US 2025/0147628 A1 May 8, 2025

(30) Foreign Application Priority Data
Nov. 2, 2023 (KR) .......................... 10-2023-0149722

(51) Int. Cl.
*G06F 3/044* (2006.01)
(52) U.S. Cl.
CPC ................................. *G06F 3/0442* (2019.05)
(58) Field of Classification Search
CPC ...................................................... G06F 3/0442
See application file for complete search history.

(56) References Cited

U.S. PATENT DOCUMENTS

| 8,674,967 B2 | 3/2014 | Fukushima et al. | |
| 9,916,049 B2* | 3/2018 | Cho | G06F 3/03545 |
| 11,068,099 B2* | 7/2021 | Kim | G06F 3/0446 |
| 11,385,739 B2* | 7/2022 | Kurasawa | G06F 3/04166 |
| 11,625,127 B2* | 4/2023 | Losh | G06F 3/0443 345/174 |
| 11,675,456 B2* | 6/2023 | Kurasawa | G06F 3/0443 345/174 |
| 2017/0108972 A1* | 4/2017 | Kurasawa | G06F 3/0412 |
| 2017/0262102 A1* | 9/2017 | Mizuhashi | G06F 3/0412 |

(Continued)

FOREIGN PATENT DOCUMENTS

| JP | 7073230 B2 | 5/2022 |
| KR | 10-2019-0080067 A | 7/2019 |

OTHER PUBLICATIONS

Extended European Search Report issued in corresponding EP Application No. 24209856.4, dated Jun. 13, 2025, 19 pages.

*Primary Examiner* — Chun-Nan Lin
(74) *Attorney, Agent, or Firm* — Womble Bond Dickinson (US) LLP

(57) ABSTRACT

Disclosed is an electronic device including a sensor layer and a sensor driver. The sensor layer includes a plurality of first sensing electrodes, a plurality of first electrodes, a plurality of second sensing electrodes, a plurality of second electrodes, and a plurality of lines. The plurality of lines includes a first line electrically connected to one of the plurality of second sensing electrodes and in a first peripheral region, a second line electrically connected to another one of the plurality of second sensing electrodes and in a second peripheral region, wherein, in a sensing mode to sense an input of the pen, the sensor driver is configured to apply a first weighting value to a first sensing signal received from the first line and a second weighting value, different from the first weighting value, to a second sensing signal received from the second line.

11 Claims, 38 Drawing Sheets

(56) References Cited

U.S. PATENT DOCUMENTS

| | | | |
|---|---|---|---|
| 2018/0011598 A1* | 1/2018 | Ku | G06F 3/04166 |
| 2018/0018029 A1* | 1/2018 | Lim | G06F 3/0446 |
| 2018/0150184 A1* | 5/2018 | Kim | G09G 3/3677 |
| 2019/0064944 A1* | 2/2019 | Kobori | G06F 3/0412 |
| 2019/0361549 A1* | 11/2019 | Gu | G06F 3/046 |
| 2022/0147212 A1* | 5/2022 | Kim | G06F 3/04162 |
| 2022/0187979 A1* | 6/2022 | Jung | G06F 3/04166 |
| 2022/0236850 A1* | 7/2022 | Lee | G06F 3/04162 |
| 2022/0334700 A1* | 10/2022 | Lim | G06F 3/03545 |
| 2022/0404931 A1 | 12/2022 | Kim et al. | |
| 2023/0125764 A1* | 4/2023 | Kim | G06F 3/0441 |
| | | | 345/173 |

* cited by examiner

FIG. 22

| | Gain Value |
|---|---|
| First Electrodes | GAIN_A |
| First Electrode Group | GAIN_B |
| Second Electrode Group | GAIN_B |

FIG. 23

| | DVA1 | DVA2 | DVA3 |
|---|---|---|---|
| First Electrodes | GAIN_A | GAIN_A | GAIN_A |
| First Electrode Group | GAIN_1 | GAIN_B | GAIN_B |
| Second Electrode Group | GAIN_B | GAIN_B | GAIN_2 |

|  |  | DVA1 | DVA2 | DVA3 |
|---|---|---|---|---|
| First Electrode Group | Second Electrode | GAIN_1a | GAIN_2a | GAIN_3a |
|  | ⋮ | ⋮ | ⋮ | ⋮ |
|  | Second Electrode | GAIN_1b | GAIN_2b | GAIN_3b |
| Second Electrode Group | Second Electrode | GAIN_1c | GAIN_2c | GAIN_3c |
|  | ⋮ | ⋮ | ⋮ | ⋮ |
|  | Second Electrode | GAIN_1d | GAIN_2d | GAIN_3d |

ELECTRONIC DEVICE CONFIGURED TO SENSE A PEN

CROSS-REFERENCE TO RELATED APPLICATIONS

The present application claims priority to and the benefit of Korean Patent Application No. 10-2023-0149722 filed on Nov. 2, 2023, in the Korean Intellectual Property Office, the entire disclosures of each of which are incorporated herein by reference.

BACKGROUND

Aspects of some embodiments of the present disclosure described herein relate to an electronic device capable of sensing an input by a pen.

Various multimedia electronic devices such as televisions, mobile phones, tablet personal computers (tablet PCs), notebook computers, navigation systems, game consoles, and the like, may include a display device that displays images. In addition to a general input method such as a button, a keyboard, a mouse, or the like, such multimedia electronic devices may include a sensor layer (or an input sensor) capable of providing a touch-based input mechanism that allows users to enter information or commands relatively easily and intuitively. The sensor layer may sense a user's touch or pressure. In the meantime, there is an increasing demand for employing a pen for a fine touch input for a user who is accustomed to entering information by using writing instruments or for a specific application (e.g., an application for sketching or drawing).

The above information disclosed in this Background section is only for enhancement of understanding of the background and therefore the information discussed in this Background section does not necessarily constitute prior art.

SUMMARY

Aspects of some embodiments of the present disclosure include an electronic device that may be capable of sensing an input by a pen.

According to some embodiments of the present disclosure, an electronic device includes: a sensor layer including a peripheral region having a first peripheral region and second peripheral region, and a main region between the first peripheral region and the second peripheral region; and a sensor driver configured to drive the sensor layer, wherein the sensor layer further includes: a plurality of first sensing electrodes arranged along a first direction; a plurality of first electrodes arranged along the first direction, and overlapping the plurality of first sensing electrodes, respectively; a plurality of second sensing electrodes arranged along a second direction crossing the first direction; and a plurality of lines in the peripheral region and including: a first line electrically connected to one of the plurality of second sensing electrodes and in the first peripheral region; a second line electrically connected to another one of the plurality of second sensing electrodes and in the second peripheral region, a third line connected to a first end of one of the plurality of first electrodes; and a fourth line connected to a second end of the one of the plurality of first electrodes, wherein, in a driving mode to generate a magnetic field for charging a pen, the sensor driver is configured to apply a first signal to the third line and a second signal, different from the first signal, to the fourth line at a first time, and wherein, in a sensing mode to sense an input of the pen, the sensor driver is configured to apply a first weighting value to a first sensing signal received from the first line and a second weighting value, different from the first weighting value, to a second sensing signal received from the second line.

According to some embodiments, each of the first weighting value and the second weighting value may be at least one of a gain and a weight.

According to some embodiments, the sensor driver may be further configured to drive the sensor layer in a pre-pen sensing driving mode, and the sensor driver may be configured to determine at least one of the gain or the weight applied to the first sensing signal and the second sensing signal.

According to some embodiments, the sensor driver may include a charge voltage amplifier electrically connected to at least one of the plurality of second sensing electrodes, and a resistor and a capacitor, which may be connected to an input terminal and an output terminal of the charge voltage amplifier, and the sensor driver may be further configured to adjust the gain by changing at least one of the resistor or the capacitor.

According to some embodiments, the sensor driver may include an analog-to-digital converter electrically connected to at least one of the plurality of second sensing electrodes, and the sensor driver may be configured to apply the weight to a digital signal output from the analog-to-digital converter.

According to some embodiments, the main region may comprise a plurality of division areas defined along the first direction, and the sensor driver may be further configured to: drive the sensor layer in a pre-pen sensing driving mode; and detect an active area of the sensor layer corresponding to the input from among the plurality of division areas that corresponds to a pen location according to the input.

According to some embodiments, the sensor driver may be further configured to adjust at least one of the gain or the weight applied to at least one of the first sensing signal or the second sensing signal according to a location of the active area.

According to some embodiments, the main region may comprise a first outer division area, a central division area, and a second outer division area aligned along the first direction, wherein the sensor driver may be configured to control a first gain applied to the first sensing signal to be equal to a second gain applied to the second sensing signal based on the active area corresponding to the central division area, and wherein the sensor driver may be configured to control a first weight applied to the first sensing signal to be equal to a second weight applied to the second sensing signal based on the active area corresponding to the central division area.

According to some embodiments, the sensor driver may be configured to control the first gain applied to the first sensing signal to be different from the second gain applied to the second sensing signal based on the active area corresponding to the first outer division area or the second outer division area.

According to some embodiments, the sensor driver may be configured to control the first weight applied to the first sensing signal to be different from the second weight applied to the second sensing signal based on the active area corresponding to the first outer division area or the second outer division area.

According to some embodiments, the one of the plurality of second sensing electrodes may comprise a first portion and a second portion, and the first portion may be closer to the first line than the second portion, wherein, in a sensing mode to sense input of the pen, based on an input from the pen being detected at the first portion, the sensor driver may be configured to receive a first induced current induced by the magnetic field generated from the pen from the first line, based on an input from the pen being detected at the second portion, the sensor driver may be configured to receive a second induced current induced by the magnetic field generated from the pen from the first line, and wherein an intensity of the first induced current may be different from an intensity of the second induced current.

According to some embodiments of the present disclosure, an electronic device may include: a sensor layer including a main region and a peripheral region; and a sensor driver configured to drive the sensor layer, wherein the sensor layer may further include: a plurality of first sensing electrodes arranged along a first direction; a plurality of first electrodes arranged along the first direction, and overlapping the plurality of first sensing electrodes, respectively; a plurality of second sensing electrodes arranged along a second direction crossing the first direction; and a plurality of lines in the peripheral region and including: a first line electrically connected to one second sensing electrode of the plurality of second sensing electrodes; a second line electrically connected to a first end of one first electrode of the plurality of first electrodes; and a third line electrically connected to a second end of the one first electrode; wherein the one second sensing electrode comprises a first portion and a second portion, and the first portion is closer to the first line than the second portion, wherein, in a driving mode to generate a magnetic field for charging a pen, the sensor driver is configured to apply a first signal to the second line and a second signal, different from the first signal, to the third line at a first time, and wherein, in a sensing mode to sense an input of the pen, based on an input from the pen being detected at the first portion, the sensor driver is configured to apply a first weighting value to a signal received from the first line, and based on an input from the pen being detected at the second portion, the sensor driver is configured to apply a second weighting value, different from the first weighting value, to a signal received from the first line.

According to some embodiments, each of the first weighting value and the second weighting value may be at least one of a gain and a weight.

According to some embodiments, the sensor driver may be further configured to drive the sensor layer in a pre-pen sensing driving mode, and the sensor driver may be configured to determine at least one of the gain or the weight applied to the signal.

According to some embodiments, the main region may include a first outer division area, a central division area, and a second outer division area, which may be defined in the first direction, wherein the plurality of lines may further comprises a fourth line electrically connected to another one second sensing electrode of the plurality of second sensing electrodes, wherein the main region may be between the first line and the fourth line, wherein the sensor driver may be configured to receive a first sensing signal from the one second sensing electrode and a second sensing signal from the another one second sensing electrode, and wherein, based on an active area of the sensor layer corresponding to the input being located in the central division area, a first gain applied to the first sensing signal may be equal to a second gain applied to the second sensing signal, and a first weight applied to the first sensing signal may be equal to a second weight applied to the second sensing signal.

According to some embodiments, based on the active area being located in the first outer division area or the second outer division area, the first gain may be different from the second gain or the first weight may be different from the second weight.

According to some embodiments, in the sensing mode to sense the input of the pen, based on an input from the pen being detected at the first portion, the sensor driver may be configured to receive a first induced current induced by the magnetic field generated from the pen from the first line, based on an input from the pen being detected at the second portion, the sensor driver may be configured to receive a second induced current induced by the magnetic field generated from the pen from the first line, and wherein an intensity of the first induced current may be different from an intensity of the second induced current.

According to some embodiments, the intensity of the first induced current may be greater than the intensity of the second induced current.

According to some embodiments of the present disclosure, in a method of driving an electronic device, the electronic device includes: a sensor layer including a sensing area to detect a pen comprising an RLC resonance circuit; and a plurality of sensing electrodes extending in a first direction and arranged along a second direction intersecting the first direction, and located in the sensing area; and a sensor driver configured to drive the sensor layer, the method includes: in a pre-pen sensing driving mode before the pen is detected: receiving a first sensing signal from one sensing electrode of the plurality of sensing electrodes; receiving a second sensing signal from another one sensing electrode of plurality of sensing electrode; and applying a first weighting value to the first sensing signal, and applying a second weighting value, which is equal to the first weighting value, to the second sensing signal, and in a pen sensing driving mode after the pen is detected: receiving a third sensing signal from the one sensing electrode; receiving a fourth sensing signal from the another one sensing electrode; and applying a third weighting value to the third sensing signal, and applying a fourth weighting value, different from the third weighting value, to the fourth sensing signal.

According to some embodiments, each of the first weighting value, the second weighting value, the third weighting value, and the fourth weighting value may be at least one of a gain and a weight.

According to some embodiments, the method may further include: receiving signals from the sensor layer in the pre-pen sensing driving mode; detecting, based on the signals, an active area within the sensing area; adjusting at least one of the gain or the weight based on a location of the active area.

According to some embodiments, the sensing area may include a first outer division area, a central division area, and a second outer division area, which may be defined in the first direction, the method further comprising determining where the active area may be located among the first outer division area, the central division area, and the second outer division area.

According to some embodiments, the method may further include adjusting, based on the active area being located in the first outer division area or the second outer division area, a first gain applied to the third sensing signal and a second gain applied to the fourth sensing signal to be different from each other.

According to some embodiments, the method may further include adjusting, based on the active area being located in the first outer division area or the second outer division area, a first weight applied to a third signal and a second weight applied to a fourth signal to be different from each other.

According to some embodiments of the present disclosure, an electronic device includes: a sensor layer including a main region and a peripheral region; and a sensor driver configured to drive the sensor layer, wherein the sensor layer further includes: a plurality of first sensing electrodes arranged along a first direction; a plurality of first electrodes arranged along the first direction and overlapping the plurality of first sensing electrodes, respectively; a plurality of second sensing electrodes arranged along a second direction crossing the first direction; and a plurality of lines in the peripheral region and including: a first line electrically connected to one second sensing electrode of the plurality of second sensing electrodes; a second line electrically connected to a first end of one first electrode of the plurality of first electrodes; and a third line electrically connected to a second end of the one first electrodes, wherein the one second sensing electrode comprises a first portion and a second portion, and the first portion is closer to the first line than the second portion, wherein, in a driving mode to generate a magnetic field for charging a pen, the sensor driver configured to apply a first signal to the second line and a second signal, different from the first signal, to the third line at a first time, wherein, in a sensing mode to sense input of the pen, based on an input from the pen being detected at the first portion, the sensor driver is configured to receive a first induced current induced by the magnetic field generated from the pen from the first line, based on an input from the pen being detected at the second portion, the sensor driver is configured to receive a second induced current induced by the magnetic field generated from the pen from the first line, and wherein an intensity of the first induced current is different from an intensity of the second induced current.

According to some embodiments, the intensity of the first induced current may be greater than the intensity of the second induced current.

According to some embodiments, in a sensing mode to sense an input of the pen, based on an input from the pen being detected at the first portion, the sensor driver may be configured to apply a first weighting value to a first sensing signal comprising the first induced current, and based on an input from the pen being detected at the second portion, the sensor driver may be configured to apply a second weighting value, different from the first weighting value, to a second sensing signal comprising the second induced current.

According to some embodiments, each of the first weighting value and the second weighting value may be at least one of a gain and a weight, and wherein the sensor driver may be further configured to drive the sensor layer in a pre-pen sensing driving mode, and the sensor driver may be configured to determine at least one of the gain or the weight applied to at least one of the first sensing signal or the second sensing signal.

According to some embodiments, the main region may include a first outer division area, a central division area, and a second outer division area, which may be defined in the first direction, wherein the plurality of lines may further comprise a fourth line electrically connected to another one second sensing electrode of the plurality of second sensing electrodes, wherein the main region may be between the first line and the fourth line, wherein the sensor driver may be configured to receive a first sensing signal from the one second sensing electrode and a second sensing signal from the another one second sensing electrode, and wherein, based on an active area of the sensor layer corresponding to the input being located in the central division area, a first gain applied to the first sensing signal may be equal to a second gain applied to the second sensing signal, and a first weight applied to the first sensing signal may be equal to a second weight applied to the second sensing signal.

According to some embodiments, based on the active area being located in the first outer division area or the second outer division area, the first gain may be different from the second gain or the first weight may be different from the second weight.

BRIEF DESCRIPTION OF THE FIGURES

The above and other aspects and features of some embodiments of the present disclosure will become more apparent by describing in more detail aspects of some embodiments thereof with reference to the accompanying drawings.

FIG. 22 is a diagram showing gain values corresponding to channels, according to some embodiments of the present disclosure.

FIG. 23 is a diagram showing gain values corresponding to channels, according to some embodiments of the present disclosure.

DETAILED DESCRIPTION

Figure 1A:
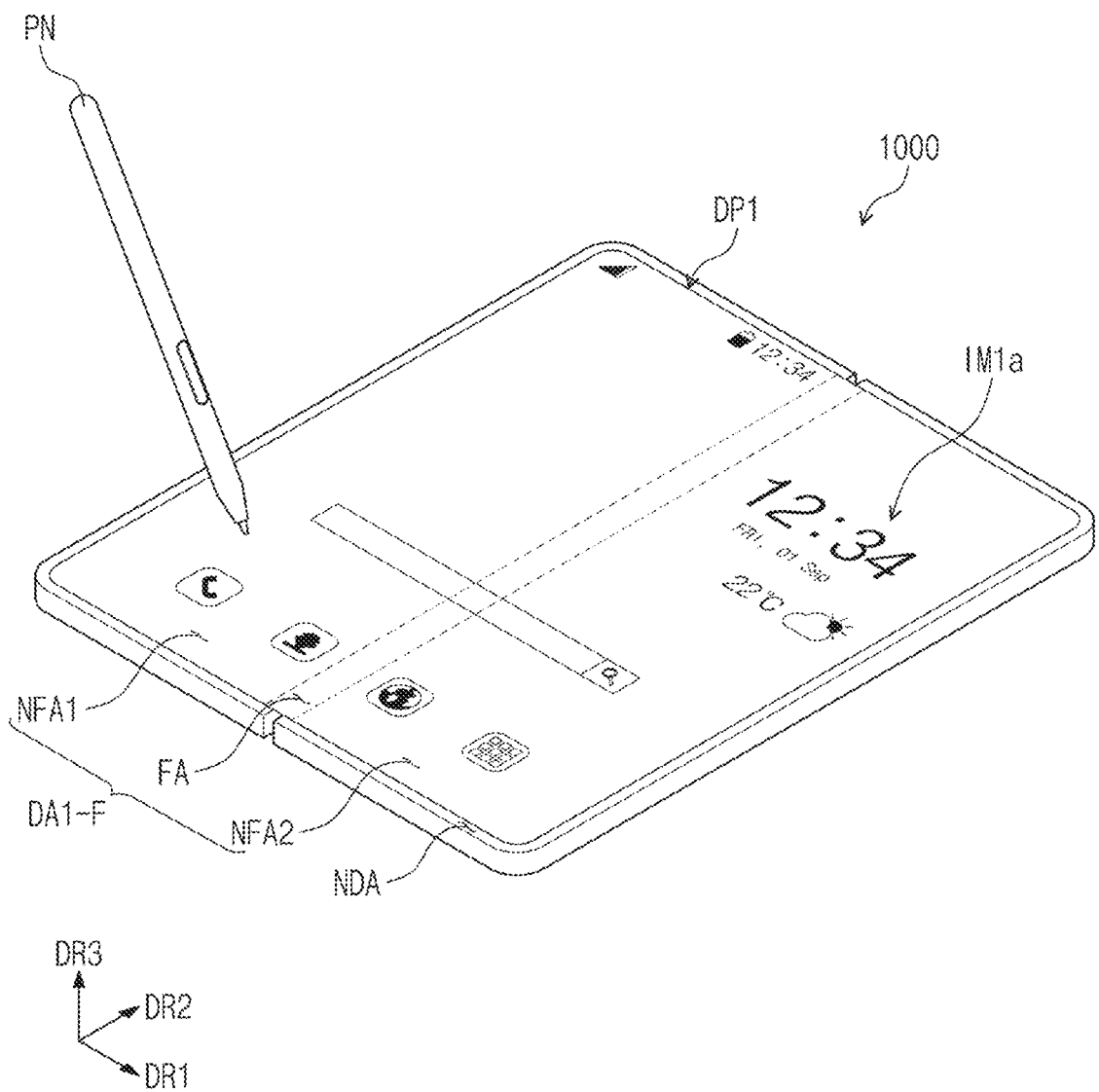
FIG. 1A is a perspective view of an electronic device, according to some embodiments of the present disclosure.

In the specification, the expression that a first component (or region, layer, part, portion, etc.) is "on", "connected with", or "coupled with" a second component means that the first component is directly on, connected with, or coupled with the second component or means that a third component is interposed therebetween.

The same reference numerals refer to the same components. Also, in drawings, the thickness, ratio, and dimension of components are exaggerated for effectiveness of description of technical contents. The term "and/or" includes one or more combinations in each of which associated elements are defined.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The articles "a," "an," and "the" are singular in that they have a single referent, but the use of the singular form in the specification should not preclude the presence of more than one referent.

Also, the terms "under", "below", "on", "above", etc. are used to describe the correlation of components illustrated in drawings. The terms that are relative in concept are described based on a direction shown in drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Terms "part" and "unit" mean a software component or hardware component that performs a specific function. For example, the hardware component may include a field-programmable gate array (FPGA) or an application-specific integrated circuit (ASIC). The software component may refer to executable codes and/or data used by the executable codes in an addressable storage medium. Accordingly, the software components may be, for example, object-oriented software components, class components, and task components, and may include processes, functions, attributes, procedures, subroutines, program code segments, drivers, firmware, microcodes, circuits, data, databases, data structures, tables, arrays, or variables.

Hereinafter, aspects of some embodiments of the present disclosure will be described in more detail with reference to accompanying drawings.

Figure 1B:
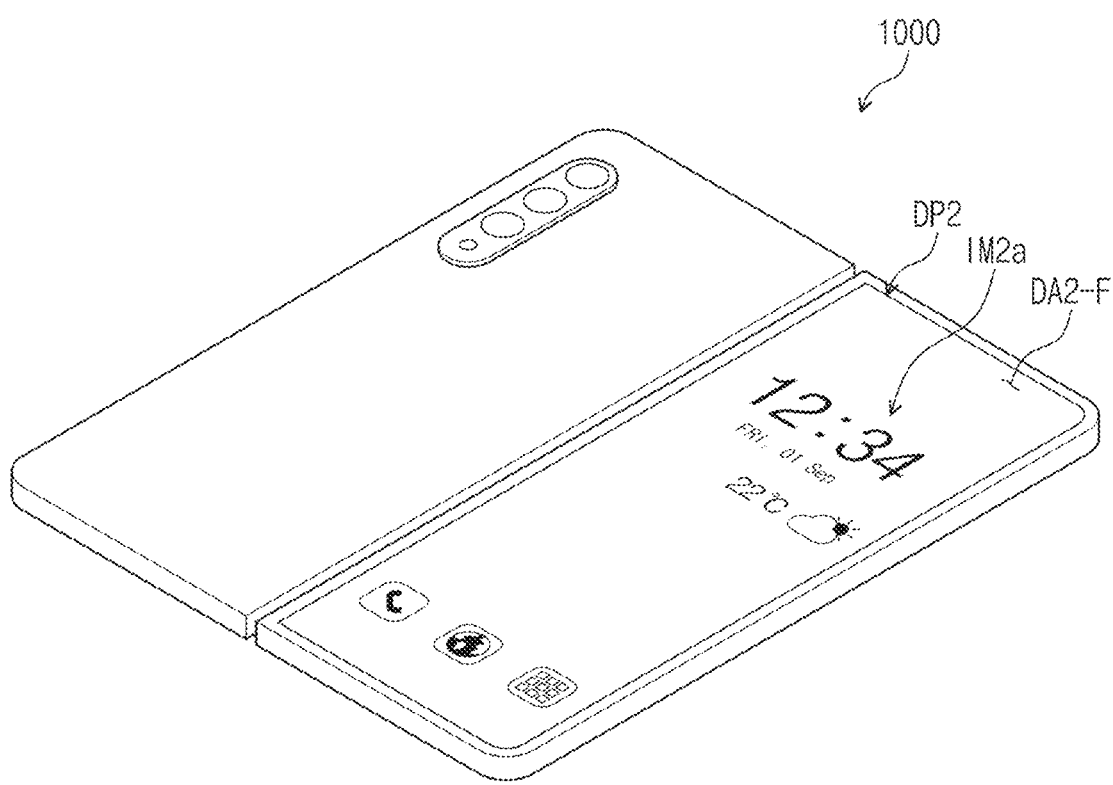
FIG. 1B is a rear perspective view of an electronic device, according to some embodiments of the present disclosure.

FIG. 1A is a perspective view of an electronic device 1000, according to some embodiments of the present disclosure. FIG. 1B is a rear perspective view of the electronic device 1000, according to some embodiments of the present disclosure.

Referring to FIGS. 1A and 1B, the electronic device 1000 may be a device that is configured to be activated based on, or according to, an electrical signal. For example, the electronic device 1000 may be configured to display images and may be configured to sense inputs (e.g., an external input) applied from the outside (e.g., from an external device or object). The external input may be a user input. The user input may include various types of external inputs such as a part of the body of a user (e.g., a user's finger), a pen (or stylus) PN, light, heat, and/or pressure.

The electronic device 1000 may include a first display panel DP1 and a second display panel DP2. The first display panel DP1 and the second display panel DP2 may be panels that are separate from each other. For example, as described in more detail below, the first display panel DP1 and the second display panel DP2 may be located at opposite sides of the electronic device 1000. The first display panel DP1 may be referred to as a "main display panel". The second display panel DP2 may be referred to as an "auxiliary display panel" or "external display panel". According to some embodiments, as described in more detail below, the first display panel DP1 may be located at a side of the electronic device 1000 that is internal when the electronic device 1000 is in a folded state, such that different non-folding areas of the first display panel DP1 on opposite sides of a folding area of the first display panel DP1 face each other in the folded state. According to some embodiments, the second display panel DP2 may be located at an externally-facing side of the electronic device 1000 when the electronic device 1000 is in the folded state.

The first display panel DP1 may include a first display unit DA1-F (e.g., as shown in FIG. 1A). The second display panel DP2 may include a second display unit DA2-F (e.g., as shown in FIG. 1B). An area of the second display panel DP2 may be smaller than an area of the first display panel DP1. The area of the first display unit DA1-F may be greater than the area of the second display unit DA2-F so as to correspond to the size of the first display panel DP1 and the size of the second display panel DP2.

While the electronic device 1000 is unfolded, the first display unit DA1-F may have a plane parallel (or substantially parallel) to a plane defined by the first direction DR1 and the second direction DR2. A thickness direction of the electronic device 1000 may be parallel to a third direction DR3 intersecting the first direction DR1 and the second direction DR2. Accordingly, front surfaces (or upper surfaces) and back surfaces (or lower surfaces) of members constituting the electronic device 1000 may be defined with respect to the third direction DR3.

The first display panel DP1 or the first display unit DA1-F may include a folding area FA, which is configured to be folded and unfolded (e.g., without damaging the electronic device 1000), and a plurality of non-folding areas NFA1 and NFA2 spaced from each other with the folding area FA therebetween. The second display panel DP2 may overlap one of the plurality of non-folding areas NFA1 and NFA2. For example, the second display panel DP2 may overlap the first non-folding area NFA1.

A display direction of a first image IM1a displayed in a part (e.g., the first non-folding area NFA1) of the first display panel DP1 may be opposite to a display direction of a second image IM2a displayed in the second display panel DP2. For example, the first image IM1a may be displayed in the third direction DR3, and the second image IM2a may be displayed in a fourth direction DR4, which is the opposite direction to the third direction DR3.

According to some embodiments of the present disclosure, the folding area FA may be bent based on (e.g., around) a folding axis extending in a direction (e.g., the second direction DR2) parallel to a long side of the electronic device 1000. While the electronic device 1000 is folded, the folding area FA has a curvature and radius of curvature (e.g., a set or predetermined curvature and radius of curvature). The first non-folding area NFA1 and the second non-folding area NFA2 may face each other, and the electronic device 1000 may be inner-folded such that the first display unit DA1-F is not exposed to the outside.

According to some embodiments of the present disclosure, the electronic device 1000 may be outer-folded such that the first display unit DA1-F is exposed to the outside. According to some embodiments of the present disclosure, the electronic device 1000 may be capable of both in-folding and out-folding in an unfolded state, but embodiments according to the present disclosure are not limited thereto.

FIG. 1A illustrates that one folding area FA is defined in the electronic device 1000, but embodiments according to the present disclosure are not limited thereto. For example, a plurality of folding axes and a plurality of folding areas corresponding thereto may be defined in the electronic device 1000. The electronic device 1000 may be in-folded or out-folded in a state where each of the plurality of folding areas is unfolded.

According to some embodiments of the present disclosure, at least one of the first display panel DP1 or the second display panel DP2 may be configured to sense an input by the pen PN even when it does not include a digitizer. Accordingly, because the digitizer for sensing the pen PN may be omitted, an increase in the thickness of the electronic device 1000, an increase in the weight of the electronic device 1000, or a decrease in flexibility of the electronic device 1000 may not occur due to the addition of a digitizer. Accordingly, not only the first display panel DP1, but also the second display panel DP2 may be designed to sense the pen PN.

Figure 2:
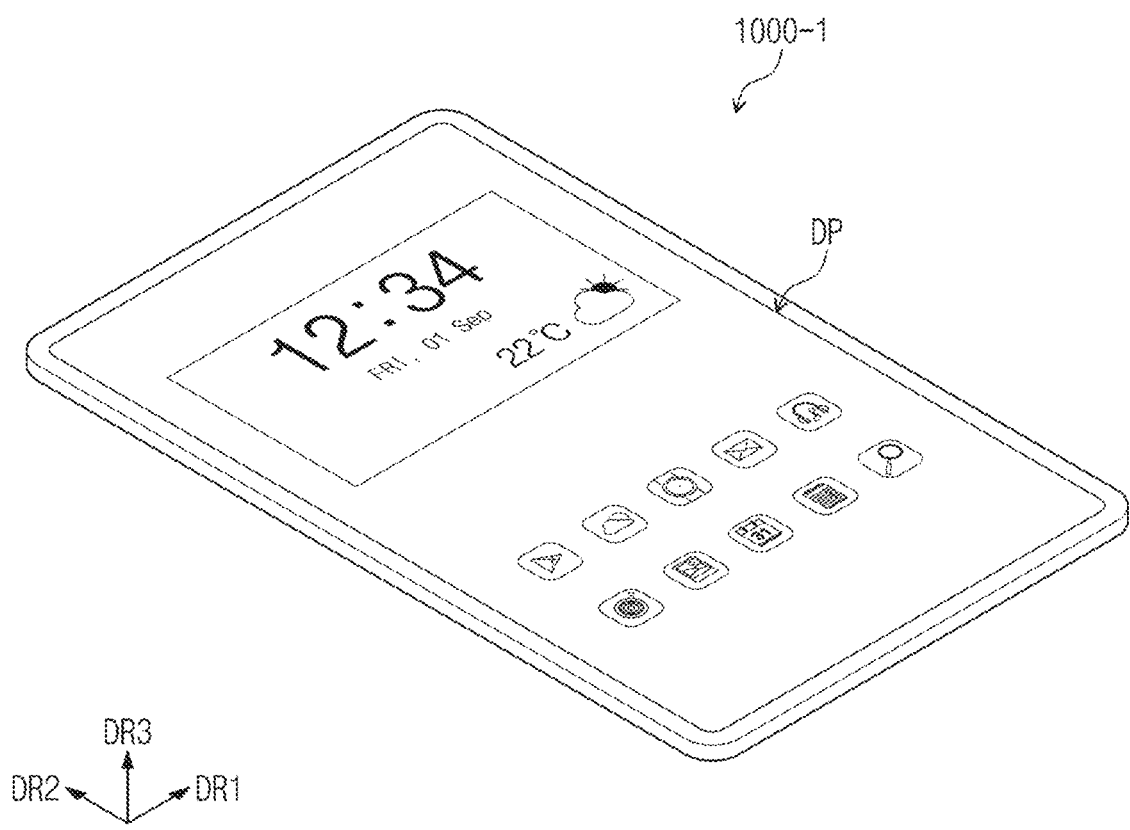
FIG. 2 is a perspective view of an electronic device, according to some embodiments of the present disclosure.

FIG. 2 is a perspective view of an electronic device 1000-1, according to some embodiments of the present disclosure.

FIG. 2 shows that the electronic device 1000-1 is a mobile phone, and the electronic device 1000-1 may include a display panel DP.

According to some embodiments of the present disclosure, the display panel DP may be configured to sense inputs applied from the outside (e.g., external input). The external input may be a user input. The user input may include various types of external inputs such as a part of the body of a user (e.g., a user's finger), a pen PN (see FIG. 1A), light, heat, or pressure.

According to some embodiments of the present disclosure, the display panel DP may be configured to sense an input by the pen PN even though the display panel DP does not include a digitizer. Accordingly, because the digitizer for sensing the pen PN may be omitted, the thickness and weight of the electronic device 1000-1 may not increase due to the addition of a digitizer.

FIG. 1A shows a foldable type of the electronic device 1000, and FIG. 2 shows a bar (or non-foldable or flat panel or tablet) type of the electronic device 1000-1. However, embodiments according to the present disclosure described in more detail below are not limited thereto. For example, the descriptions described below may be applied to various electronic devices, such as a rollable type of an electronic device, a slidable type of an electronic device, and a stretchable type of an electronic device.

Figure 3:
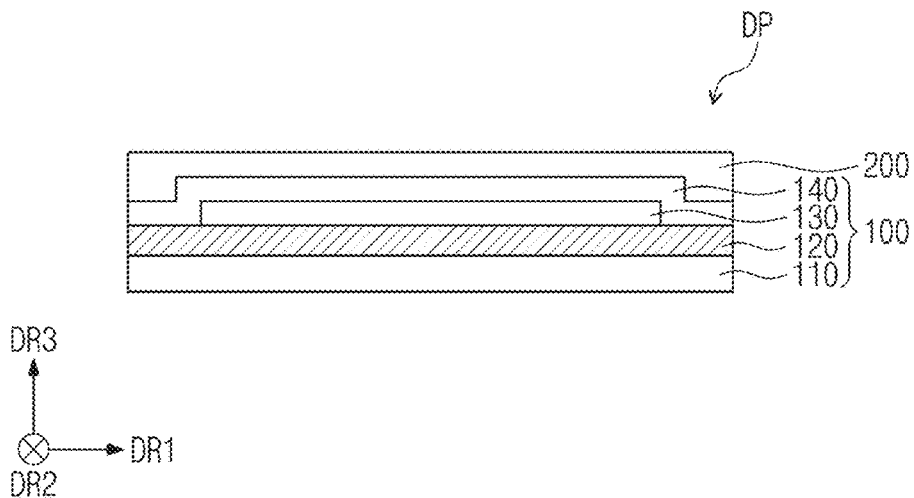
FIG. 3 is a schematic cross-sectional view of a display panel, according to some embodiments of the present disclosure.

FIG. 3 is a schematic cross-sectional view of the display panel DP, according to some embodiments of the present disclosure.

Referring to FIG. 3, the display panel DP may include a display layer 100 and a sensor layer 200.

The display layer 100 may be a component that substantially generates or displays images. The display layer 100 may be a light emitting display layer. For example, the display layer 100 may be an organic light emitting display layer, an inorganic light emitting display layer, an organic-inorganic light emitting display layer, a quantum dot display layer, a micro-LED display layer, or a nano-LED display layer. The display layer 100 may include a base layer 110, a circuit layer 120, a light emitting element layer 130, and an encapsulation layer 140.

The base layer 110 may be a member that provides a base surface on which the circuit layer 120 is located. The base layer 110 may include a multi-layer structure or a single layer structure. The base layer 110 may be a glass substrate, a metal substrate, a silicon substrate, or a polymer substrate, but embodiments according to the present disclosure are not particularly limited thereto.

The circuit layer 120 may be located on the base layer 110. The circuit layer 120 may include an insulating layer, a semiconductor pattern, a conductive pattern, and a signal line. The insulating layer, the semiconductor layer, and the conductive layer may be formed on the base layer 110 in a manner such as coating, evaporation, or the like. Afterward, the insulating layer, the semiconductor layer, and the conductive layer may be selectively patterned by performing a photolithography process multiple times.

The light emitting element layer 130 may be located on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro-LED, or a nano-LED.

The encapsulation layer 140 may be located on the light emitting element layer 130. The encapsulation layer 140 may protect the light emitting element layer 130 from foreign substances or contaminants such as moisture, oxygen, and dust particles.

The sensor layer 200 may be located on the display layer 100. The sensor layer 200 may sense an external input applied from the outside. The sensor layer 200 may be an integrated sensor formed continuously during the manufacturing process of the display layer 100, or may be an external sensor attached to the display layer 100. In the present disclosure, the sensor layer 200 may be referred to as a sensor, an input sensing layer, an input sensing panel, or an electronic device for sensing input coordinates.

According to some embodiments of the present disclosure, the sensor layer 200 may sense both inputs from a passive-type input source such as the user's body and an input device for generating a magnetic field of a resonant frequency (e.g., a set or predetermined resonant frequency) (e.g., an active-type input source). The input device may be referred to as a "pen", an "input pen", a "magnetic pen", a "stylus pen", or an "electromagnetic resonance pen".

Figure 4:
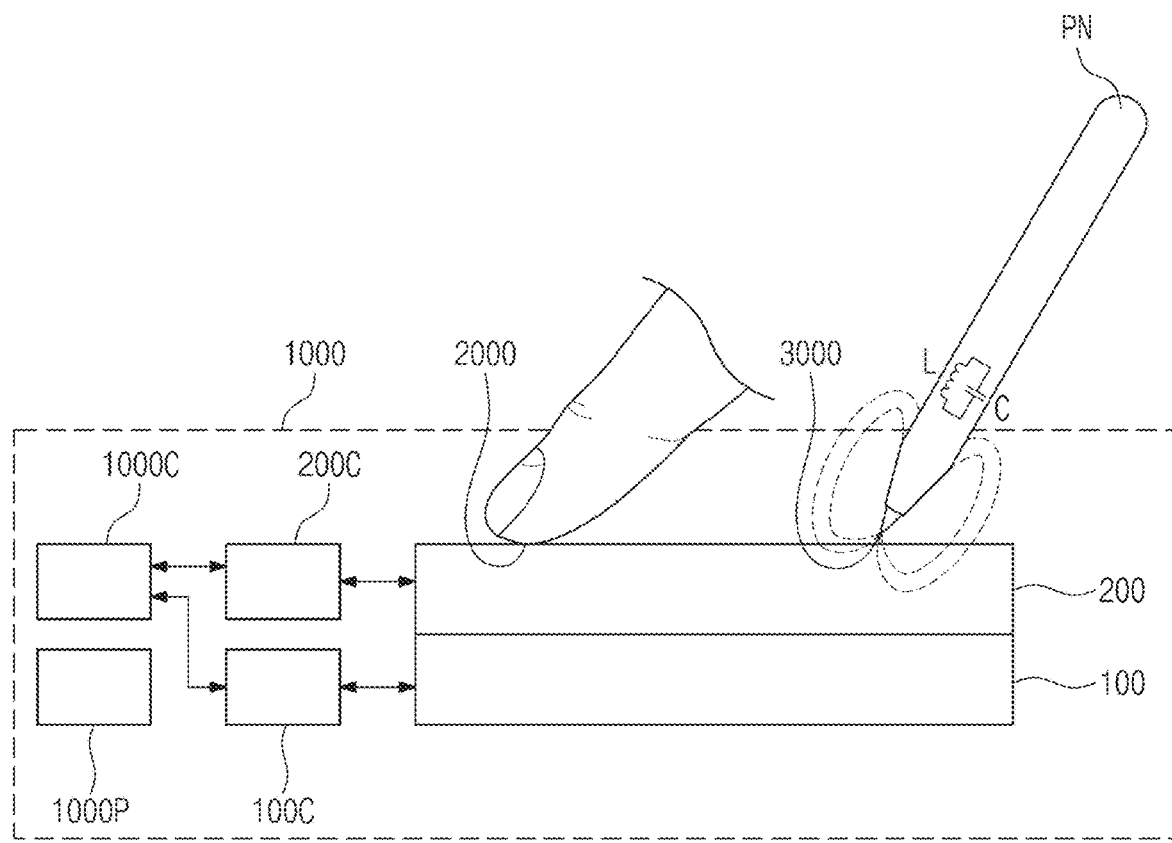
FIG. 4 is a block diagram for describing an operation of an electronic device, according to some embodiments of the present disclosure.

FIG. 4 is a block diagram for describing an operation of the electronic device 1000, according to some embodiments of the present disclosure.

Referring to FIG. 4, the display device 1000 may include a display layer 100, a sensor layer 200, a display driver 100C (e.g., a first driver circuit), a sensor driver 200C (e.g., a second driver circuit), a main driver 1000C (e.g., a third circuit), and a power supply circuit 1000P.

The sensor layer 200 may sense a first input 2000 or a second input 3000 applied from the outside (e.g., an external input from an external source). Each of the first input 2000 and the second input 3000 may be an input means or input source capable of providing a change in the capacitance of the sensor layer 200 or an input means capable of causing an induced current in the sensor layer 200. For example, the first input 2000 may be a passive type of an input method such as a user's body (e.g., a user's finger). The second input 3000 may be an input by the pen PN or an input by an RFIC tag. For example, the pen PN may be a passive-type pen or an active-type pen.

According to some embodiments of the present disclosure, the pen PN may be a device that generates a magnetic field of resonant frequency (e.g., a set or predetermined resonant frequency). The pen PN may be configured to transmit an output signal based on an electromagnetic resonance method. The pen PN may be referred to as an "input device", an "input pen", a "magnetic pen", a "stylus pen", or an "electromagnetic resonance pen".

The pen PN may include an RLC resonant circuit, and the RLC resonant circuit may include an inductor L and a capacitor C. According to some embodiments of the present disclosure, the RLC resonant circuit may be a variable resonant circuit that varies a resonance frequency. In this case, the inductor L may be a variable inductor and/or the capacitor C may be a variable capacitor, but embodiments according to the present disclosure are not particularly limited thereto.

The inductor L generates a current by a magnetic field formed in the sensor layer 200. However, embodiments according to the present disclosure are not particularly limited thereto. For example, when the pen PN operates as an active type of input device, the pen PN may generate a current even when the pen PN does not receive a magnetic field from the outside. The generated current is delivered to the capacitor C. The capacitor C charges the current input from the inductor L, and discharges the charged current to the inductor L. Afterwards, the inductor L may emit a magnetic field at the resonant frequency. An induced current may flow in the sensor layer 200 by the magnetic field emitted by the pen PN, and the induced current may be delivered to the sensor driver 200C as a reception signal (or a sensing signal).

The main driver 1000C may control overall operations of the electronic device 1000. For example, the main driver 1000C may control operations of the display driver 100C and the sensor driver 200C. The main driver 1000C may include at least one microprocessor and may further include a graphics controller. The main driver 1000C may be referred to as an "application processor", "central processing unit", or "main processor".

The display driver 100C may drive the display layer 100. The display driver 100C may receive image data and a control signal from the main driver 1000C. The control signal may include various signals. For example, the control signal may include an input vertical synchronization signal, an input horizontal synchronization signal, a main clock signal, and a data enable signal.

The sensor driver 200C may drive the sensor layer 200. The sensor driver 200C may receive a control signal from the main driver 1000C. The control signal may include a clock signal of the sensor driver 200C. Moreover, the control signal may further include a mode determination signal for determining operating modes of the sensor driver 200C and the sensor layer 200.

The sensor driver 200C may be implemented as an integrated circuit (IC) and may be electrically connected to the sensor layer 200. For example, the sensor driver 200C may be mounted directly on an area (e.g., a set or predetermined area) of the display panel or mounted on a separate printed circuit board in a chip-on-film (COF) method to be electrically connected to the sensor layer 200.

The sensor driver 200C and the sensor layer 200 may selectively operate in a first mode or a second mode. For example, the first mode may be a mode in which a touch input, for example, the first input 2000 is sensed. The second mode may be a mode in which an input of the pen PN, for example, the second input 3000 is sensed. The first mode may be referred to as a "touch sensing mode", and the second mode may be referred to as a "pen sensing mode".

The switching between the first mode and the second mode may be accomplished in a variety of manners. For example, the sensor driver 200C and the sensor layer 200 may be driven in a time-division method in the first mode and the second mode and may sense the first input 2000 and the second input 3000. Alternatively, the switching between the first mode and the second mode may occur due to a user's selection (e.g., via a user interface) or the user's specific action, either the first mode or the second mode may be activated or deactivated by activating or deactivating a specific application, or one mode may be switched the other mode. Alternatively, while operating alternately in the first mode and the second mode, the sensor driver 200C and the sensor layer 200 may be maintained in the first mode when the first input 2000 is sensed, or may be maintained in the second mode when the second input 3000 is sensed.

The sensor driver 200C may calculate coordinate information of an input based on a signal received from the sensor layer 200 and may provide the main driver 1000C with a coordinate signal having the coordinate information. The main driver 1000C executes an operation corresponding to a user input based on the coordinate signal. For example, the main driver 1000C may operate the display driver 100C such that a new application image is displayed on the display layer 100.

The power supply circuit 1000P may include a power management integrated circuit (PMIC). The power supply circuit 1000P may generate a plurality of driving voltages for driving the display layer 100, the sensor layer 200, the display driver 100C, and the sensor driver 200C. For example, the plurality of driving voltages may include a gate high voltage, a gate low voltage, a first driving voltage (e.g., ELVSS voltage), a second driving voltage (e.g., ELVDD voltage), an initialization voltage, and the like, but embodiments according to the present disclosure are not particularly limited thereto.

Figure 5:
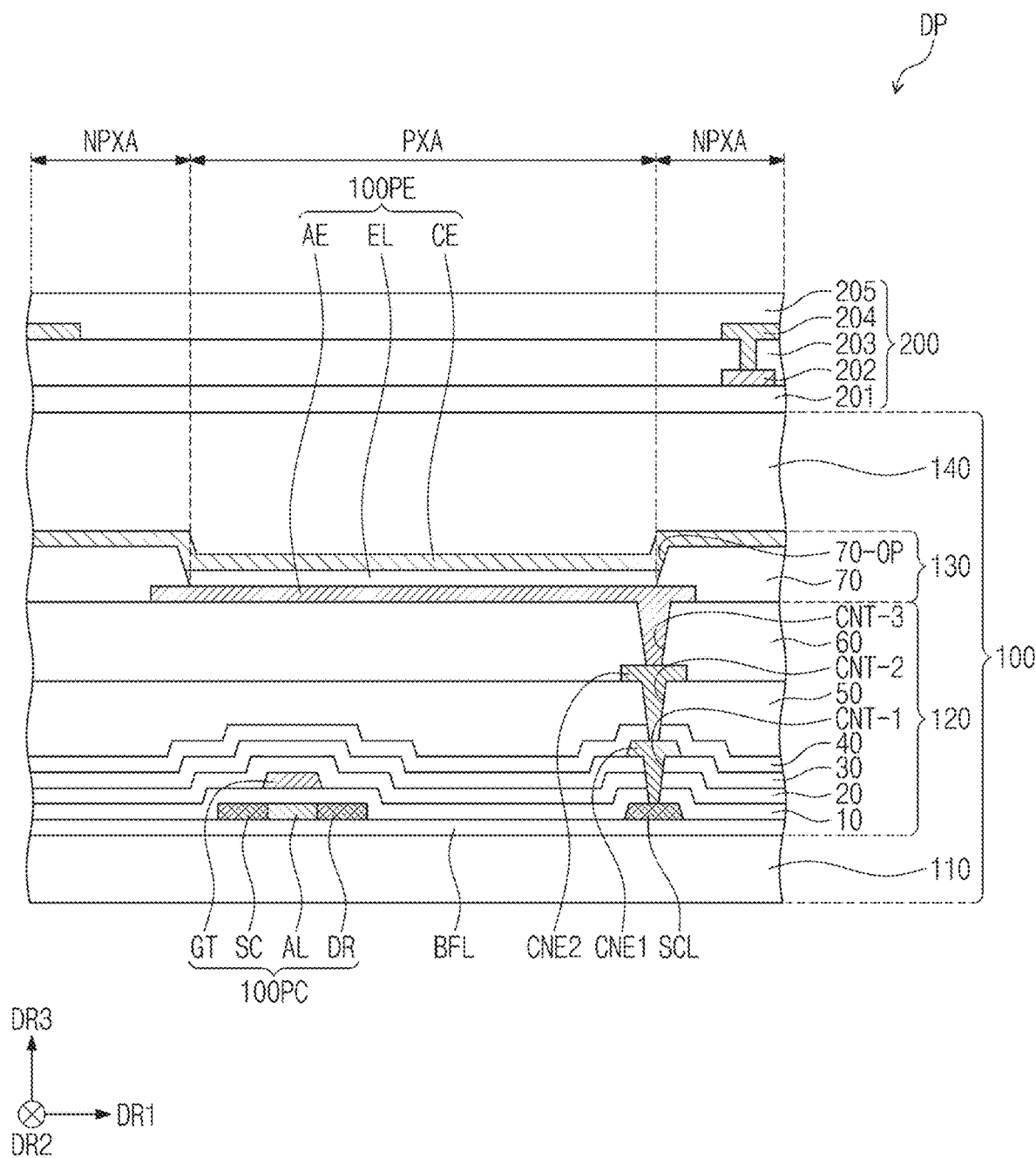
FIG. 5 is a cross-sectional view of a display panel, according to some embodiments of the present disclosure.

FIG. 5 is a cross-sectional view of the display panel DP, according to some embodiments of the present disclosure.

Referring to FIG. 5, at least one buffer layer BFL is formed on an upper surface of a base layer 110. The buffer layer BFL may improve a bonding force between the base layer 110 and a semiconductor pattern. The buffer layer BFL may be formed of multiple layers. Alternatively, the display layer 100 may further include a barrier layer. The buffer layer BFL may include at least one of silicon oxide, silicon nitride, or silicon oxynitride. For example, the buffer layer BFL may include a structure in which a silicon oxide layer and a silicon nitride layer are stacked alternately.

The semiconductor patterns SC, AL, DR, and SCL may be located on the buffer layer BFL. The semiconductor patterns SC, AL, DR, and SCL may include polysilicon. However, embodiments according to the present disclosure are not limited thereto. For example, the semiconductor patterns SC, AL, DR, and SCL may include amorphous silicon, low-temperature polycrystalline silicon, or an oxide semiconductor.

FIG. 5 only illustrates a part of the semiconductor patterns SC, AL, DR, and SCL, and the semiconductor pattern may be further located in another area. The semiconductor patterns SC, AL, DR, and SCL may be arranged across pixels in a specific rule. The semiconductor patterns SC, AL, DR, and SCL may have different electrical properties depending on whether the semiconductor patterns SC, AL, DR, and SCL are doped. The semiconductor patterns SC, AL, DR, and SCL may include the first areas SC, DR, and SCL having a high conductivity, and the second area AL having a low conductivity. The first areas SC, DR, and SCL may be doped with an N-type dopant or a P-type dopant. A P-type transistor may include an area doped with the P-type dopant, and an N-type transistor may include an area doped with the N-type dopant. The second area AL may be an undoped area or an area doped with a concentration lower than a concentration in the first area SC, DR, and SCL.

A conductivity of each of the first areas SC, DR, and SCL is greater than a conductivity of the second area AL. The first areas SC, DR, and SCL may substantially serves as an electrode or a signal line. The second area AL may actually correspond to an active area AL (or a channel) of a transistor 100PC. In other words, a portion AL of the semiconductor patterns SC, AL, DR, and SCL may be the active area AL of a transistor 100PC; other parts SC and DR may be the source area SC or the drain area DR of the transistor 100PC; and the other part SCL may be a connection electrode or a connection signal line SCL.

Each of pixels may be expressed by an equivalent circuit including 7 transistors, one capacitor, and a light emitting element, and the equivalent circuit of the pixel may be modified in various forms, and the circuit of the pixel may include additional components or fewer components without departing from the spirit and scope of embodiments according to the present disclosure. One transistor 100PC and the one light emitting element 100PE included in a pixel are illustrated in FIG. 5 by way of example.

The source area SC, the active area AL, and the drain area DR of the transistor 100PC may be formed from the semiconductor patterns SC, AL, DR, and SCL. The source area SC and the drain area DR may extend in directions opposite to each other from the active area AL in a cross-sectional view. A portion of the connection signal line SCL formed from the semiconductor patterns SC, AL, DR, and SCL is illustrated in FIG. 5. According to some embodiments, the connection signal line SCL may be connected to the drain area DR of the transistor 100PC in a plan view.

A first insulating layer 10 may be located on the buffer layer BFL. The first insulating layer 10 may overlap a plurality of pixels in common and may cover the semiconductor patterns SC, AL, DR, and SCL. The first insulating layer 10 may be an inorganic layer and/or an organic layer, and may have a single layer or multi-layer structure. The first insulating layer 10 may include at least one of aluminum oxide, titanium oxide, silicon oxide, silicon nitride, silicon oxynitride, zirconium oxide, or hafnium oxide. According to some embodiments, the first insulating layer 10 may be a silicon oxide layer having a single layer structure. Not only the first insulating layer 10 but also an insulating layer of the circuit layer 120 to be described in more detail later may be an inorganic layer and/or an organic layer, and may have a single layer structure or a multi-layer structure. The inorganic layer may include at least one of the above-described materials, but embodiments according to the present disclosure are not limited thereto.

A gate GT of the transistor 100PC is located on the first insulating layer 10. The gate GT may be a part of a metal pattern. The gate GT overlaps the active area AL. The gate GT may function as a mask in a process of reducing the semiconductor patterns SC, AL, DR, and SCL.

A second insulating layer 20 is located on the first insulating layer 10 and may cover the gate GT. The second insulating layer 20 may overlap a plurality of pixels in common. The second insulating layer 20 may be an inorganic layer and/or an organic layer, and may have a single layer structure or a multi-layer structure. The second insulating layer 20 may include at least one of silicon oxide, silicon nitride, or silicon oxynitride. According to some embodiments, the second insulating layer 20 may have a multi-layer structure including a silicon oxide layer and a silicon nitride layer.

A third insulating layer 30 may be located on the second insulating layer 20. The third insulating layer 30 may have a single layer structure or a multi-layer structure. For example, the third insulating layer 30 may have a multi-layer structure including a silicon oxide layer and a silicon nitride layer.

A first connection electrode CNE1 may be located on the third insulating layer 30. The first connection electrode CNE1 may be connected to the connection signal line SCL through a contact hole CNT-1 penetrating through the first, second, and third insulating layers 10, 20, and 30.

A fourth insulating layer 40 may be located on the third insulating layer 30. The fourth insulating layer 40 may be a single silicon oxide layer. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be located on the fifth insulating layer 50 and may cover the second connection electrode CNE2. The sixth insulating layer 60 may be an organic layer.

The light emitting element layer 130 may be located on the circuit layer 120. The light emitting element layer 130 may include a light emitting element 100PE. For example, the light emitting element layer 130 may include an organic light emitting material, an inorganic light emitting material, an organic-inorganic light emitting material, a quantum dot, a quantum rod, a micro-LED, or a nano-LED. Hereinafter, the description will be given in the context of the light emitting element 100PE being an organic light emitting element, but embodiments according to the present disclosure are limited thereto.

The light emitting element 100PE may include a first electrode AE, a light emitting layer EL, and a second electrode CE.

The first electrode AE may be located on the sixth insulating layer 60. The first electrode AE may be connected to the second connection electrode CNE2 through a contact hole CNT-3 penetrating through the sixth insulating layer 60.

A pixel defining layer 70 may be located on the sixth insulating layer 60 and may cover a portion of the first electrode AE. An opening 70-OP is defined in the pixel defining layer 70. The opening 70-OP of the pixel defining layer 70 exposes at least a portion of the first electrode AE.

The active area 1000A (see FIG. 1A) may include an emission area PXA and a non-emission area NPXA adjacent to the emission area PXA. The non-emission area NPXA may surround (e.g., in a periphery or outside a footprint of) the emission area PXA. According to some embodiments, the emission area PXA is defined to correspond to a partial area of the first electrode AE, which is exposed by the opening 70-OP. For example, according to some embodiments, the first electrode AE may be located within the emission area PXA and may extend into the non-emission area NPXA in a plan view.

The light emitting layer EL may be located on the first electrode AE. The light emitting layer EL may be located in an area corresponding to the opening 70-OP. That is, the light emitting layer EL may be separately formed on each of pixels. When the light emitting layers EL are separately formed in each of pixels, each of the light emitting layers EL may emit light of at least one of a blue color, a red color, or a green color. However, embodiments according to the present disclosure are not limited thereto. For example, the light emitting layer EL may be included in a plurality of pixels in common while having an integral shape. In this case, the light emitting layer EL may provide blue light or white light.

The second electrode CE may be located on the light emitting layer EL. The second electrode CE may be included in a plurality of pixels in common while having an integral shape.

According to some embodiments of the present disclosure, a hole control layer may be interposed between the first electrode AE and the light emitting layer EL. The hole control layer may be arranged in common in the emission area PXA and the non-emission area NPXA. The hole control layer may include a hole transport layer and may further include a hole injection layer. An electron control layer may be interposed between the light emitting layer EL and the second electrode CE. The electron control layer may include an electron transport layer, and may further include an electron injection layer. The hole control layer and the electron control layer may be formed in common in a plurality of pixels by using an open mask or inkjet process.

The encapsulation layer 140 may be located on the light emitting element layer 130. The encapsulation layer 140 may include an inorganic layer, an organic layer, and an inorganic layer sequentially stacked, and layers constituting the encapsulation layer 140 are not limited thereto. The inorganic layers may protect the light emitting element layer 130 from impurities or contaminants such as moisture and oxygen, and the organic layer may protect the light emitting element layer 130 from a foreign material or contaminants such as dust particles. The inorganic layers may include a silicon nitride layer, a silicon oxynitride layer, a silicon oxide layer, a titanium oxide layer, an aluminum oxide layer, or the like. The organic layer may include, but is not limited to, an acrylic-based organic layer.

The sensor layer 200 may include a base layer 201, a first conductive layer 202, an intermediate insulating layer 203, a second conductive layer 204, and a cover insulating layer 205.

The base layer 201 may be an inorganic layer including at least one of silicon nitride, silicon oxynitride, or silicon oxide. Alternatively, the base layer 201 may be an organic layer including an epoxy resin, an acrylate resin, or an imide-based resin. The base layer 201 may have a single layer structure or may have a multi-layer structure stacked in the third direction DR3.

Each of the first conductive layer 202 and the second conductive layer 204 may have a single layer structure or may have a multi-layer structure in which layers are stacked in the third direction DR3.

Each of the first conductive layer 202 and the second conductive layer 204 of a single layer structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium zinc tin oxide (IZTO), or the like. Besides, the transparent conductive layer may include a conductive polymer such as poly(3,4-ethylenedioxythiophene) (PEDOT), a metal nano wire, graphene, and the like.

Each of the first conductive layer 202 and the second conductive layer 204 of the multi-layer structure may include metal layers. For example, the metal layers may have a three-layer structure of titanium/aluminum/titanium. The conductive layer of the multi-layer structure may include at least one metal layer and at least one transparent conductive layer.

At least one of the intermediate insulating layer 203 or the cover insulating layer 205 may include an inorganic film. The inorganic film may include at least one of aluminum oxide, titanium oxide, silicon oxide, silicon nitride, silicon oxynitride, zirconium oxide, or hafnium oxide.

At least one of the intermediate insulating layer 203 or the cover insulating layer 205 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, or perylene-based resin.

Figure 6:
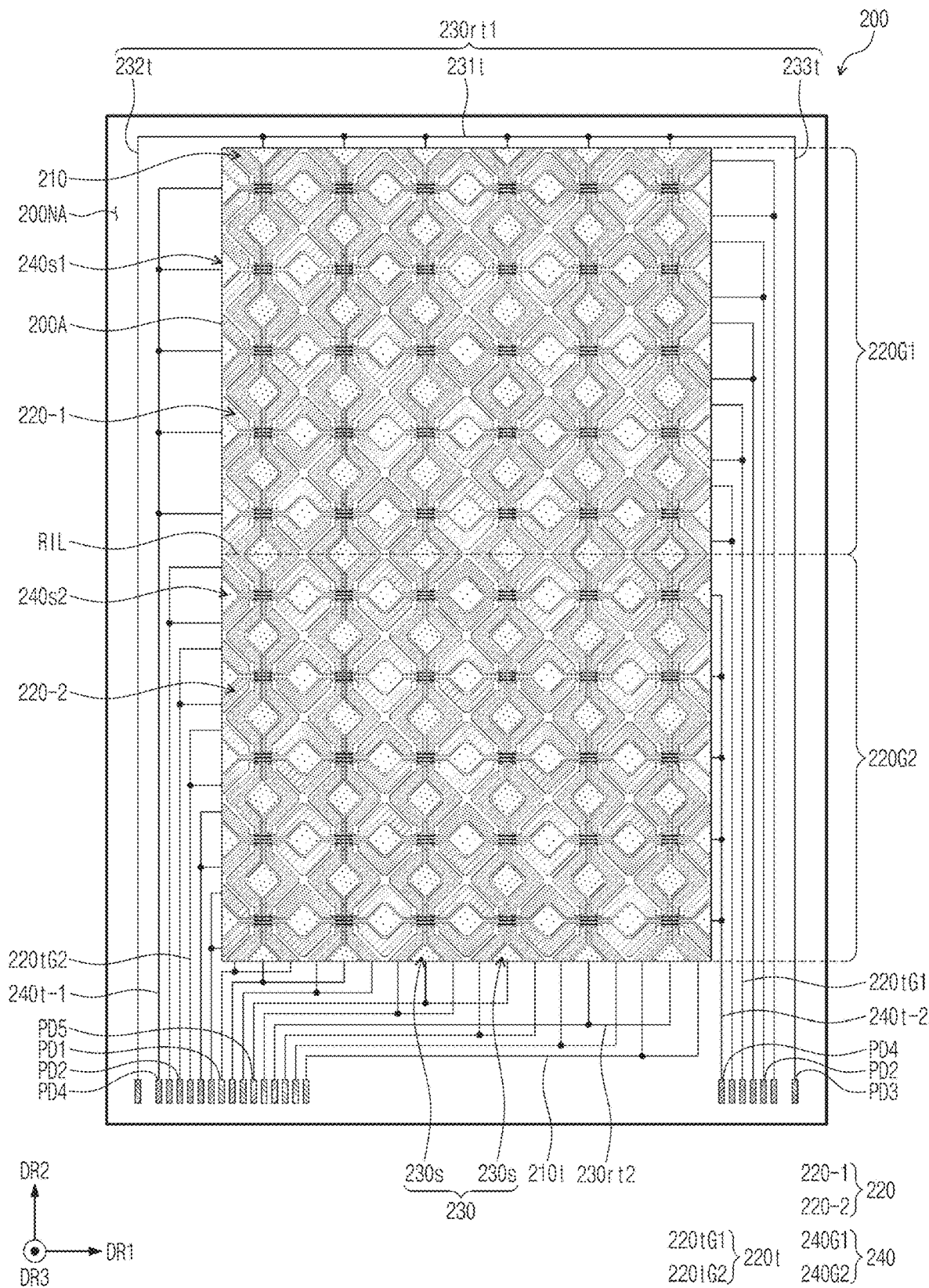
FIG. 6 is a plan view of a sensor layer, according to some embodiments of the present disclosure.
Figure 7:
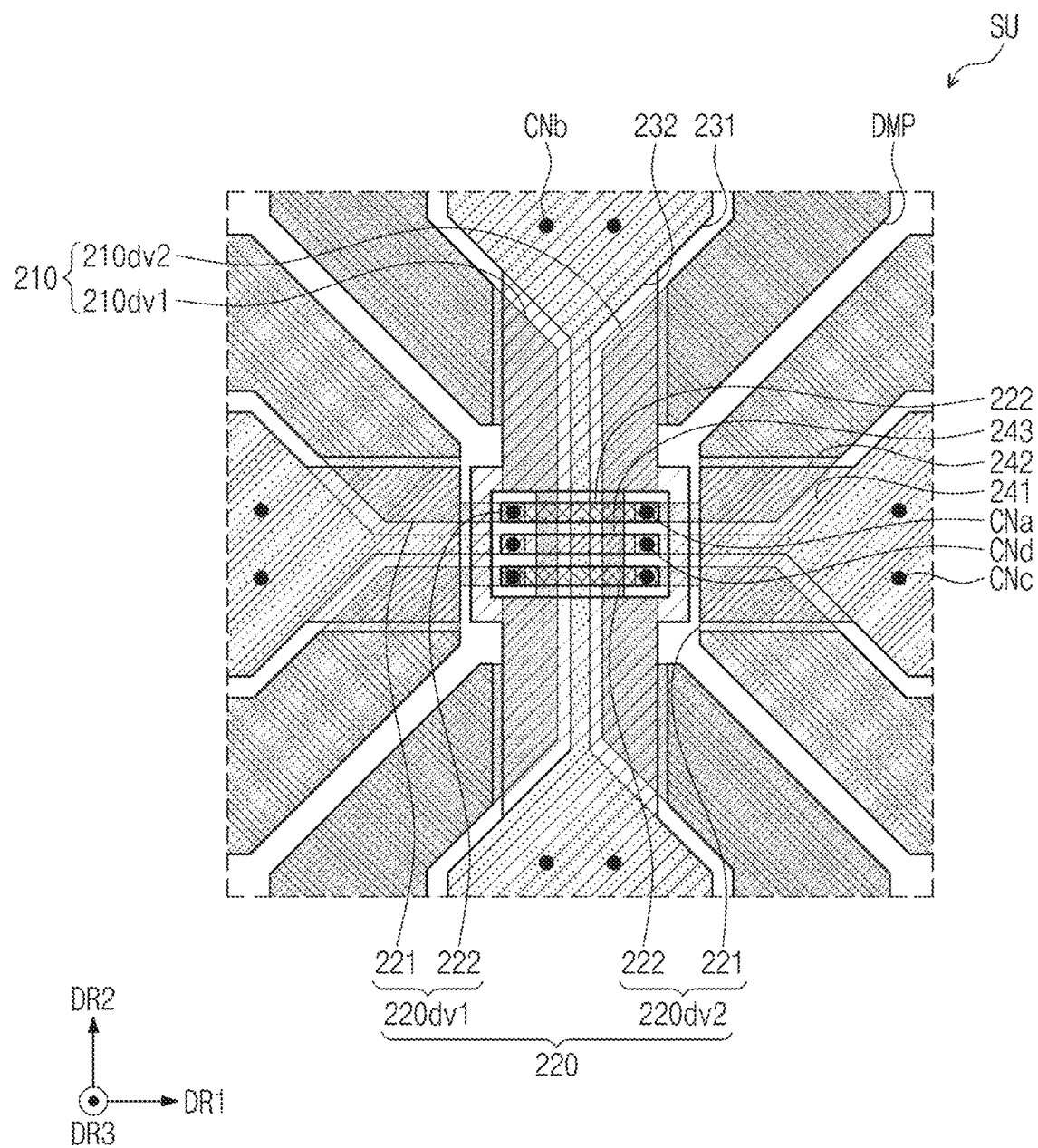
FIG. 7 is an enlarged plan view of one sensing unit, according to some embodiments of the present disclosure.
Figure 8A:
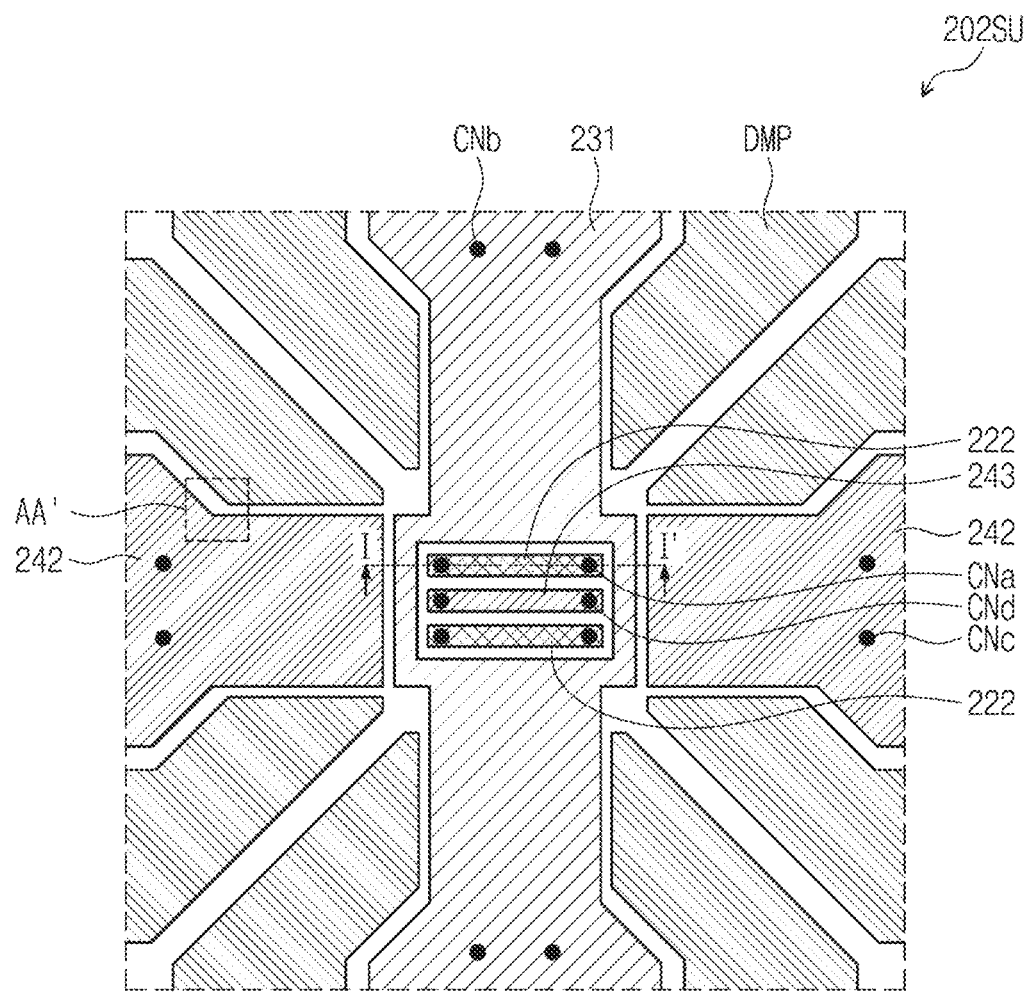
FIG. 8A is a plan view showing a first conductive layer of a sensing unit, according to some embodiments of the present disclosure.
Figure 8B:
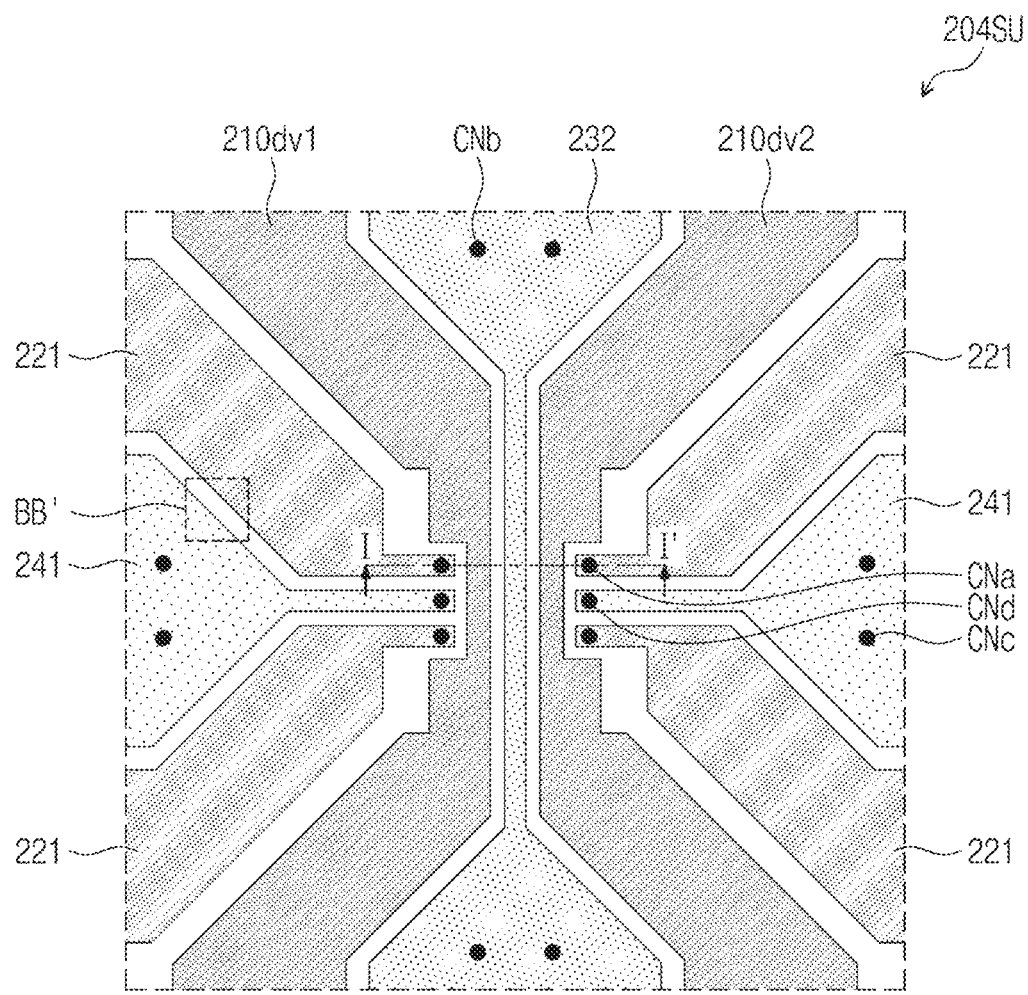
FIG. 8B is a plan view showing a second conductive layer of a sensing unit, according to some embodiments of the present disclosure.
Figure 9:
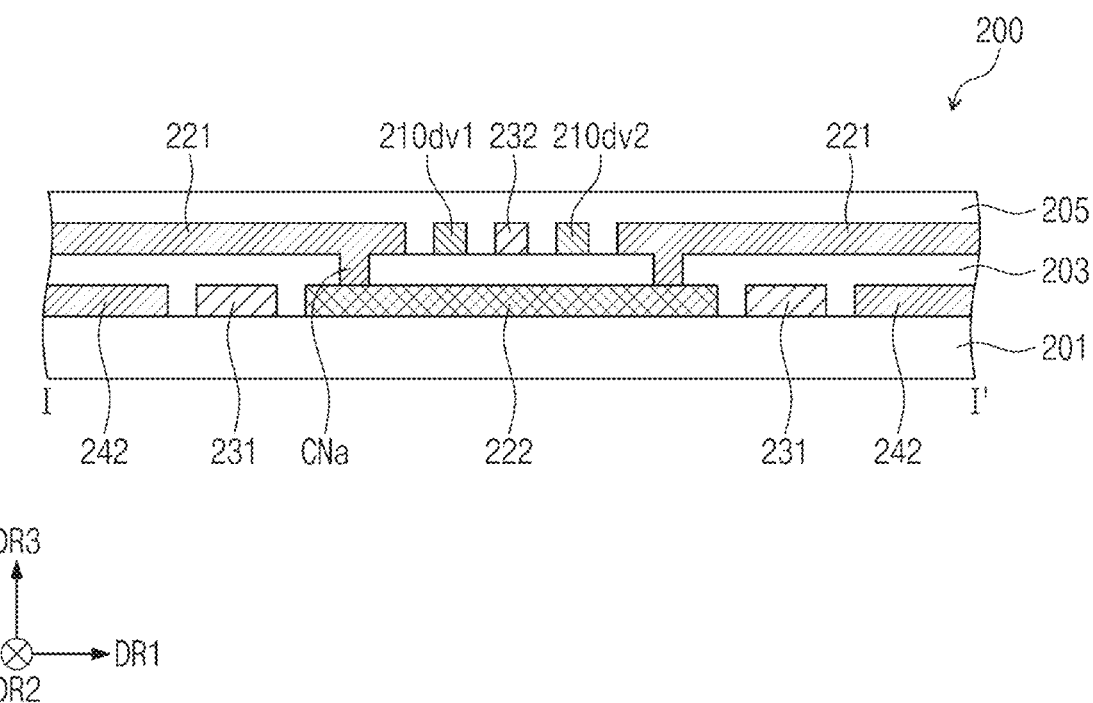
FIG. 9 is a cross-sectional view of a sensor layer taken along line I-I' shown in FIGS. 8A and 8B, according to some embodiments of the present disclosure.

FIG. 6 is a plan view of the sensor layer 200, according to some embodiments of the present disclosure. FIG. 7 is an enlarged plan view of one sensing unit SU, according to some embodiments of the present disclosure. FIG. 8A is a plan view showing a first conductive layer 202SU of the sensing unit SU, according to some embodiments of the present disclosure. FIG. 8B is a plan view showing a second conductive layer 204SU of the sensing unit SU, according to some embodiments of the present disclosure. FIG. 9 is a cross-sectional view of the sensor layer 200 taken along line I-I' shown in FIGS. 8A and 8B, according to some embodiments of the present disclosure.

Referring to FIG. 6, a sensing area 200A and a peripheral area (or peripheral region) 200NA adjacent to (e.g., in a periphery or outside a footprint of) the sensing area 200A may be defined in the sensor layer 200.

The sensor layer 200 may include a plurality of first electrodes 210, a plurality of second electrodes 220, a plurality of third electrodes 230, and a plurality of fourth electrodes 240, which are located in the sensing area 200A. The first electrodes 210 may be referred to as first sensing electrodes, the second electrodes 220 may be referred to as second sensing electrodes, the third electrodes 230 may be referred to as first electrodes, and the fourth electrodes 240 may be referred to as second electrodes.

The first electrodes 210, the second electrodes 220, the third electrodes 230, and the fourth electrodes 240 may correspond to a main region, between first and second peripheral regions on opposite sides (e.g., the left and right sides in FIG. 6). Thus, the main region of the sensor layer 200 may be located between a first peripheral region (e.g., the left side of the peripheral area 200NA) and a second peripheral region (e.g., the right side of the peripheral area 200NA). The main region of the sensor layer 200 may be the sensing area 200A.

The first electrodes 210 may intersect the second electrodes 220. Each of the first electrodes 210 may extend in the second direction DR2. The first electrodes 210 may be arranged to be spaced apart from each other in the first direction DR1. Each of the second electrodes 220 may extend in the first direction DR1. The second electrodes 220 may be arranged to be spaced apart from each other in the second direction DR2. The sensing unit SU of the sensor layer 200 may be an area where the one first electrode 210 intersects the one second electrode 220.

FIG. 6 illustrates the six first electrodes 210 and the ten second electrodes 220, and illustrates the 60 sensing units SU. However, the number of first electrodes 210 and the number of second electrodes 220 are not limited thereto.

Referring to FIGS. 6 and 7, each of the first electrodes 210 may include first division electrodes 210$dv$1 and 210$dv$2. The first division electrodes 210$dv$1 and 210$dv$2 may extend in the second direction DR2 and may be spaced apart from each other in the first direction DR1. The first division electrodes 210$dv$1 and 210$dv$2 may have a line-symmetrical shape with respect to a line extending in the second direction DR2.

Each of the second electrodes 220 may include second division electrodes 220$dv$1 and 220$dv$2. The second electrodes 220 extend in the first direction DR1 and may be spaced from each other in the second direction DR2. The second division electrodes 220$dv$1 and 220$dv$2 may have a line-symmetrical shape with respect to a line extending in the first direction DR1.

Referring to FIGS. 7, 8A, 8B, and 9, each of the second division electrodes 220$dv$1 and 220$dv$2 may include a sensing pattern 221 and a bridge pattern 222. The sensing pattern 221 and the bridge pattern 222 may be located or formed on different layers, and the sensing pattern 221 and the bridge pattern 222 may be electrically connected to each other through a first contact CNa. For example, the bridge pattern 222 may be included in a first conductive layer 202SU. The sensing pattern 221 and the first division electrodes 210$dv$1 and 210$dv$2 may be included in a second conductive layer 204SU. The first conductive layer 202SU may be included in the first conductive layer 202 of FIG. 5, and the second conductive layer 204SU may be included in the second conductive layer 204 of FIG. 5.

Each of the third electrodes 230 may extend in the second direction DR2. The third electrodes 230 may be arranged to be spaced apart from each other in the first direction DR1. According to some embodiments of the present disclosure, each of the third electrodes 230 may include a plurality of first auxiliary electrodes 230$s$ that are electrically connected in parallel. The number of first auxiliary electrodes 230$s$ included in each of the third electrodes 230 may be varied. For example, as the number of first auxiliary electrodes 230$s$ included in each of the third electrodes 230 increases, the resistance of each of the third electrodes 230 may be lowered. Accordingly, power efficiency may be relatively improved and sensing sensitivity may be relatively improved. On the other hand, as the number of first auxiliary electrodes 230$s$ included in each of the third electrodes 230 decreases, the loop coil pattern formed by using the third electrodes 230 may be implemented in diverse forms.

FIG. 6 illustrates that the one third electrode 230 includes the two first auxiliary electrodes 230s, but embodiments according to the present disclosure are not particularly limited thereto. The first auxiliary electrodes 230s may be arranged in a one-to-one correspondence with the first electrodes 210. Accordingly, the one sensing unit SU may include a portion of the one first auxiliary electrode 230s.

A coupling capacitor may be defined between the one first electrode 210 and the one first auxiliary electrode 230s. In this case, the current induced when a pen is sensed may be delivered from the first auxiliary electrode 230s to the first electrode 210 through the coupling capacitor. In other words, the first auxiliary electrode 230s may compensate for a signal delivered from the first electrode 210 to the sensor driver 200C. Accordingly, the greatest effect may be achieved when a phase of the signal induced in the first auxiliary electrode 230s matches a phase of the signal induced in the first electrode 210. Therefore, the center of each of the first electrodes 210 in the first direction DR1 may overlap the center of each of the first auxiliary electrodes 230s in the first direction DR1.

According to some embodiments of the present disclosure, because the one third electrode 230 includes the two first auxiliary electrodes 230s, the one third electrode 230 may correspond to (or overlap) the two first electrodes 210. Accordingly, the number of first electrodes 210 included in the sensor layer 200 may be greater than the number of third electrodes 230. For example, the number of first electrodes 210 may be equal to the product of the number of third electrodes 230 included in the sensor layer 200 and the number of first auxiliary electrodes 230s included in each of the third electrodes 230. In FIG. 6, the number of first electrodes 210 may be 6; the number of third electrodes 230 may be 3; and the number of first auxiliary electrodes 230s included in each of the third electrodes 230 may be 2, although embodiments according to the present disclosure are not limited thereto, and the number of first, third, and first auxiliary electrodes may vary according to various embodiments.

The fourth electrodes 240 may be arranged in the second direction DR2, and the fourth electrodes 240 may extend in the first direction DR1. According to some embodiments of the present disclosure, each of the fourth electrodes 240 may include second auxiliary electrodes 240s1 or 240s2 electrically connected to each other. The second auxiliary electrodes 240s1 or 240s2 may be referred to as the 2-1st auxiliary electrode 240s1 and the 2-2nd auxiliary electrode 240s2.

Routing directions of the second auxiliary electrode 240s1 and the second auxiliary electrode 240s2 may be different from each other. FIG. 6 illustrates the two fourth electrodes 240 and the five second auxiliary electrodes 240s1 or 240s2 included in each of the fourth electrodes 240.

In this specification, the fact that the routing directions are different from each other means that connection locations of electrodes and trace lines are different from each other. For example, a first connection location of a fourth trace line 240t-1 electrically connected to the second auxiliary electrode 240s1 may be different from a second connection location of a fourth trace line 240t-2 electrically connected to the second auxiliary electrode 240s2. The first connection location may be placed at a left end based on the second auxiliary electrode 240s1. The second connection location may be placed at a right end of the second auxiliary electrode 240s2.

FIG. 6 shows that the five second auxiliary electrodes 240s1 are electrically connected to each other, and the five second auxiliary electrodes 240s2 are electrically connected to each other. That is, the area ratio of the two fourth electrodes 240 or the number ratio of the second auxiliary electrode included in each of the two fourth electrodes 240 may have a ratio of 1:1. However, embodiments according to the present disclosure are not particularly limited thereto. For example, according to some embodiments, the number of second auxiliary electrodes 240s1 may be different from the number of second auxiliary electrodes 240s2.

According to some embodiments of the present disclosure, when each of the fourth electrodes 240 includes the second auxiliary electrodes 240s1 or 240s2 connected in parallel, the area of one fourth electrode may be increased. Furthermore, as the resistance of each of the fourth electrodes 240 is lowered, the sensing sensitivity for the second input 3000 (see FIG. 4) may be relatively improved.

A coupling capacitor may be defined between the one second electrode 220 and the one second auxiliary electrode 240s1. In this case, the current induced when a pen is sensed may be delivered from the second auxiliary electrode 240s1 to the second electrode 220 through the coupling capacitor. In other words, the second auxiliary electrode 240s1 may compensate for a signal delivered from the second electrode 220 to the sensor driver 200C. Accordingly, the greatest effect may be achieved when a phase of the signal induced in the second auxiliary electrode 240s1 matches a phase of the signal induced in the second electrode 220. Therefore, the center of each of the first electrodes 220 in the second direction DR2 may overlap the center of each of the second auxiliary electrodes 240s1 in the second direction DR2.

Referring to FIGS. 6, 8A, and 8B, each of the first auxiliary electrodes 230s included in the third electrode 230 may include a 3-1st pattern 231 and a 3-2nd pattern 232. The 3-1st pattern 231 and the 3-2nd pattern 232 may be placed on different layers. The 3-1st pattern 231 and the 3-2nd pattern 232 may be electrically connected to each other through a second contact CNb. The 3-1st pattern 231 may be included in the first conductive layer 202SU. The 3-2nd pattern 232 may be included in the second conductive layer 204SU.

According to some embodiments of the present disclosure, a part of the 3-1st pattern 231 may overlap a part of each of the first division electrodes 210dv1 and 210dv2. Accordingly, coupling capacitance may be provided (or formed) between the first electrode 210 and the third electrode 230.

Referring to FIGS. 6, 8A, and 8B, the second auxiliary electrodes 240s1 or 240s2 included in the fourth electrode 240 may include a 4-1st pattern 241, a 4-2nd pattern 242, and a 4-3rd pattern 243. The 4-2nd pattern 242 and the 4-3rd pattern 243 may be placed on the same layer as each other. The 4-1st pattern 241 may be placed on a different layer from the 4-2nd pattern 242 and the 4-3rd pattern 243. The 4-1st pattern 241 and the 4-2nd pattern 242 may be electrically connected to each other through a third contact CNc. The 4-1st pattern 241 and the 4-3rd pattern 243 may be electrically connected to each other through a fourth contact CNd. The 4-2nd pattern 242, and the 4-3rd pattern 243 may be included in the first conductive layer 202SU, and the 4-1st pattern 241 may be included in the second conductive layer 204SU.

According to some embodiments of the present disclosure, a part of the 4-2nd pattern 242 may overlap the sensing pattern 221 of each of the second division electrodes 220dv1 and 220dv2. Accordingly, coupling capacitor may be defined (or provided/formed) between the second electrode 220 and the fourth electrode 240.

According to some embodiments of the present disclosure, the first conductive layer 202SU may further include dummy patterns DMP. Each of the dummy patterns DMP may be electrically floated or electrically grounded. According to some embodiments of the present disclosure, the dummy patterns DMP may be omitted. Alternatively, the dummy patterns DMP may be electrically connected to the first electrode 210 or the second electrode 220.

The sensor layer 200 may further include a plurality of second trace lines 210t placed in the peripheral area 200NA, the plurality of first pads PD1 connected to the first trace lines 210t in a one-to-one correspondence, a plurality of second trace lines 220t, and a plurality of second pads PD2 connected to the second trace lines 220t in a one-to-one correspondence.

The first trace lines 210t may be electrically connected to the first electrodes 210 in a one-to-one correspondence. The two first division electrodes 210dv1 and 210dv2 included in the one first electrode 210 may be connected to one of the first trace lines 210t. Each of the first trace lines 210t may include a plurality of branch units to be connected to the two first division electrodes 210dv1 and 210dv2. According to some embodiments of the present disclosure, the two first division electrodes 210dv1 and 210dv2 may be connected to each other within the sensing area 200A.

The second trace lines 220t may be electrically connected to the second electrodes 220 in a one-to-one correspondence. The two second division electrodes 220dv1 and 220dv2 included in the one second electrode 220 may be connected to one of the second trace lines 220t. Each of the second trace lines 220t may include a plurality of branch units to be connected to the two second division electrodes 220dv1 and 220dv2. According to some embodiments of the present disclosure, the two second division electrodes 220dv1 and 220dv2 may be connected to each other within the sensing area 200A.

According to some embodiments of the present disclosure, the second electrodes 220 may be classified into (or divided into) a first electrode group 220G1 and a second electrode group 220G2. The first electrode group 220G1 and the second electrode group 220G2 may be adjacent in the second direction DR2. Some second electrodes 220-1 (hereinafter referred to as "2-1st electrodes") among the second electrodes 220 may be included in the first electrode group 220G1, and some second electrodes 220-2 (hereinafter referred to as "2-2nd electrodes") of the remaining second electrodes 220-2 among the second electrodes 220 may be included in the second electrode group 220G2.

A boundary RIL may be defined between the first electrode group 220G1 and the second electrode group 220G2. Accordingly, the 2-1st electrodes 220-1 and the 2-2nd electrodes 220-2 may be spaced apart from each other with the boundary RIL therebetween. A routing direction of each of the 2-1st electrodes 220-1 may be different from a routing direction of each of the 2-2nd electrodes 220-2.

The second trace lines 220t may be classified into a first trace group 220tG1 electrically connected to the first electrode group 220G1 and a second trace group 220tG2 electrically connected to the second electrode group 220G2. The first trace group 220tG1 and the second trace group 220tG2 may be spaced apart from each other with the sensing area 200A therebetween.

The sensor layer 200 may further include a third trace line 230rt1 placed in the peripheral area 200NA, a plurality of third pads PD3 connected to one end and the other end of the third trace line 230rt1, fourth trace lines 240t-1 and 240t-2, fourth pads PD4 connected to the fourth trace lines 240t-1 and 240t-2 in a one-to-one correspondence, fifth trace lines 230rt2, and a fifth pad PD5 connected to the fifth trace lines 230rt2 in a one-to-one correspondence.

The third trace line 230rt1 may be electrically connected to all of the third electrodes 230. The third trace line 230rt1 may include a first line portion 231t extending in the first direction DR1 and electrically connected to the third electrodes 230, a second line portion 232t extending from a first end of the first line portion 231t in the second direction DR2, and a third line portion 233t extending from a second end of the first line portion 231t in the second direction DR2.

According to some embodiments of the present disclosure, each of the resistance of the second line portion 232t and the resistance of the third line portion 233t may be substantially the same as the resistance of a third electrode of one of the third electrodes 230. Accordingly, the second line portion 232t and the third line portion 233t may serve as the third electrodes 230, and the same effect that the third electrodes 230 are also placed in the peripheral area 200NA may be obtained. For example, one of the second line portion 232t and the third line portion 233t and one of the third electrodes 230 may form a coil. Accordingly, a pen located in an area adjacent to the peripheral area 200NA may also be sufficiently charged by a loop including the second line portion 232t or the third line portion 233t.

According to some embodiments of the present disclosure, to adjust the resistance of each of the second line portion 232t and the third line portion 233t, the width of each of the second line portion 232t and the third line portion 233t in the first direction DR1 may be adjusted. However, this is only an example, and the first to third line portions 231t, 232t, and 233t may have the same (or substantially the same) width as each other.

The fifth trace lines 230rt2 may be connected to the third electrodes 230 in a one-to-one correspondence. In other words, the number of fifth trace lines 230rt2 may correspond to the number of third electrodes 230. In FIG. 6, the three fifth trace lines 230rt2 are shown.

According to some embodiments of the present disclosure, the fifth trace lines 230rt2 and the fifth pad PD5 may be omitted, and a charging driving mode for charging a pen may be omitted. In this case, the sensor layer 200 may sense an input from an active-type pen capable of emitting a magnetic field even when a magnetic field is not provided from the sensor layer 200.

According to some embodiments of the present disclosure, the fourth electrodes 240 may include one fourth electrode 240G1 (hereinafter referred to as a "4-1st electrode") overlapping the first electrode group 220G1 and the other fourth electrode 240G2 (hereinafter referred to as a "4-2nd electrode") overlapping the second electrode group 220G2. The 4-1st electrode 240G1 may include a 2-1st auxiliary electrodes 240s1. The 4-2nd electrode 240G2 may include a 2-2nd auxiliary electrodes 240s2.

The fourth trace lines 240t-1 and 240t-2 may be spaced apart from each other with the sensing area 200A therebetween. The fourth trace line 240t-1 (hereinafter referred to as a "4-1st trace line") among the fourth trace lines 240t-1 and 240t-2 may be electrically connected to the 4-1st electrode 240G1. The other fourth trace line 240t-2 (hereinafter referred to as a "4-2nd trace line") among the fourth trace lines 240t-1 and 240t-2 may be electrically connected to the 4-2nd electrode 240G2. One end of each of the 2-1st auxiliary electrodes 240s1 may be connected to the 4-1st trace line 240t-1. One end of each of the 2-2nd auxiliary electrodes 240s2 may be connected to the 4-2nd trace line 240t-2.

The 4-1st trace line 240t-1 and the 4-2nd trace line 240t-2 may be spaced apart from each other with the sensing area 200A therebetween. The 4-1st trace line 240t-1 and the first trace group 220tG1 may be spaced apart from each other with the sensing area 200A therebetween. Furthermore, the 4-2nd trace line 240t-2 and the second trace group 220tG2 may be spaced apart from each other with the sensing area 200A therebetween. The second trace group 220tG2 and the 4-1st trace line 240t-1 may be placed in one portion of the peripheral area 200NA placed on the left side of the sensing area 200A. The first trace group 220tG1 and the 4-2nd trace line 240t-2 may be placed in one portion of the peripheral area 200NA placed on the right side of the sensing area 200A.

Figure 10A:
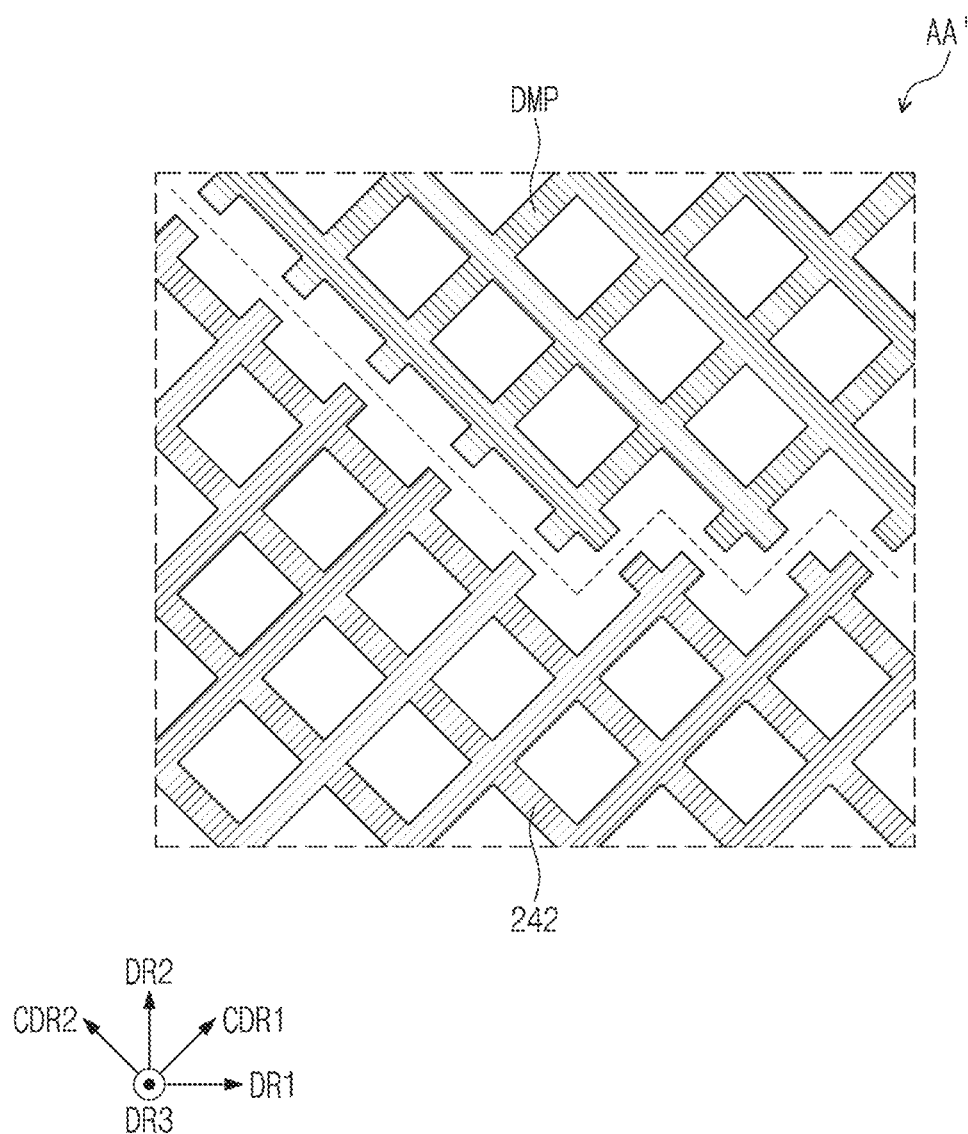
FIG. 10A is an enlarged plan view of the area AA' shown in FIG. 8A.
Figure 10B:
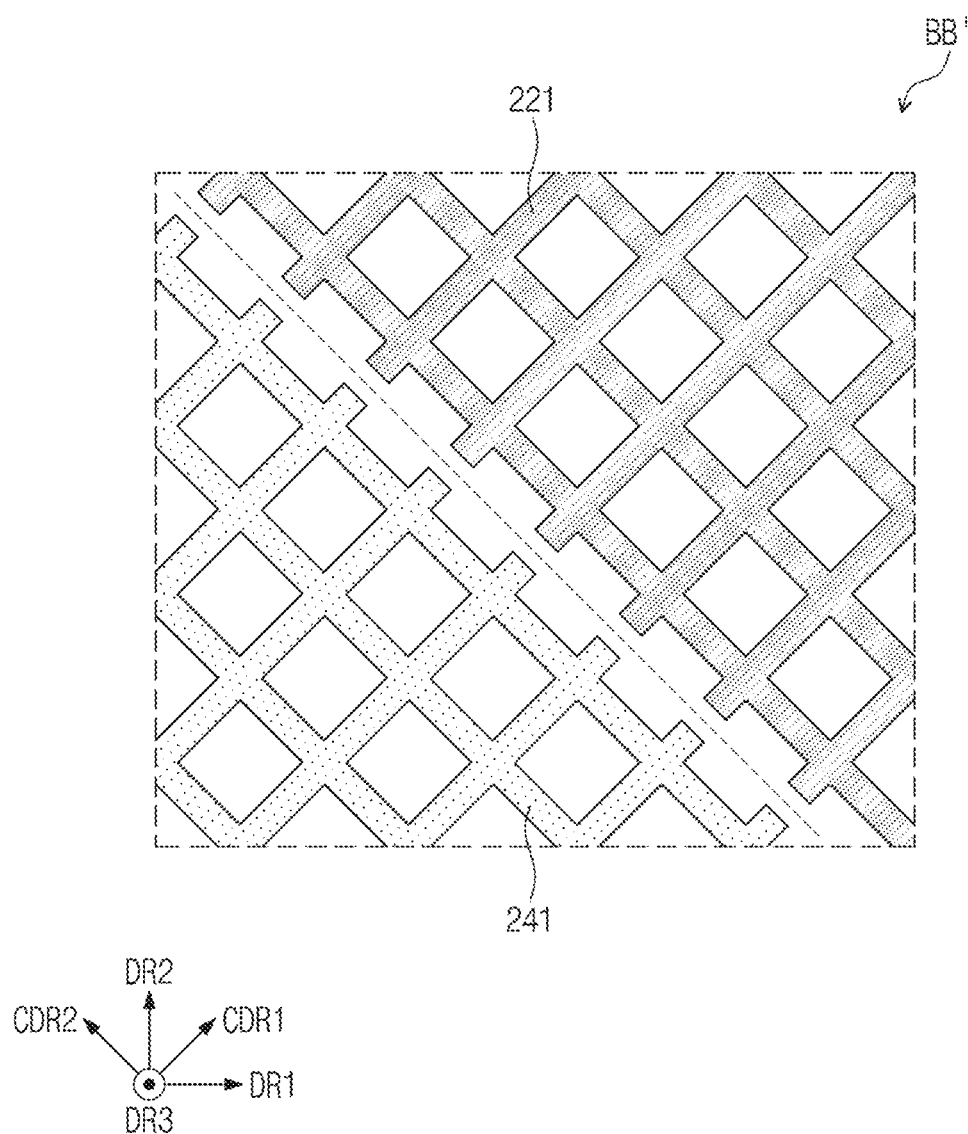
FIG. 10B is an enlarged plan view of the area BB' shown in FIG. 8B.

FIG. 10A is an enlarged plan view of the area AA' shown in FIG. 8A. FIG. 10B is an enlarged plan view of the area BB' shown in FIG. 8B.

Referring to FIGS. 8A, 8B, 10A, and 10B, each of the first electrodes 210, the second electrodes 220, the third electrodes 230, the fourth electrodes 240, and the dummy patterns DMP may have a mesh structure. Each of the mesh structures may include a plurality of mesh lines. Each of the plurality of mesh lines may have a shape extending in a direction (e.g., a set or predetermined direction) and may be connected to each other. The shape may have various shapes such as a straight line, a line with protrusions, or an uneven line. Openings in which no mesh structure is located may be defined (provided or formed) in each of the first electrodes 210, the second electrodes 220, the third electrodes 230, the fourth electrodes 240, and the dummy patterns DMP.

FIGS. 10A and 10B illustrate that the mesh structure includes mesh lines extending in a first cross direction CDR1 intersecting the first direction DR1 and the second direction DR2, and mesh lines extending in the second cross direction CDR2 intersecting the first cross direction CDR1. However, the extension direction of the mesh lines constituting the mesh structure is not particularly limited to the illustrations in FIGS. 10A and 10B. For example, the mesh structure may include only mesh lines extending in the first direction DR1 and the second direction DR2, or may include mesh lines extending in the first direction DR1, the second direction DR2, and the first cross direction CDR1, and the second cross direction CDR2. In other words, the mesh structure may be changed into various forms.

Figure 11:
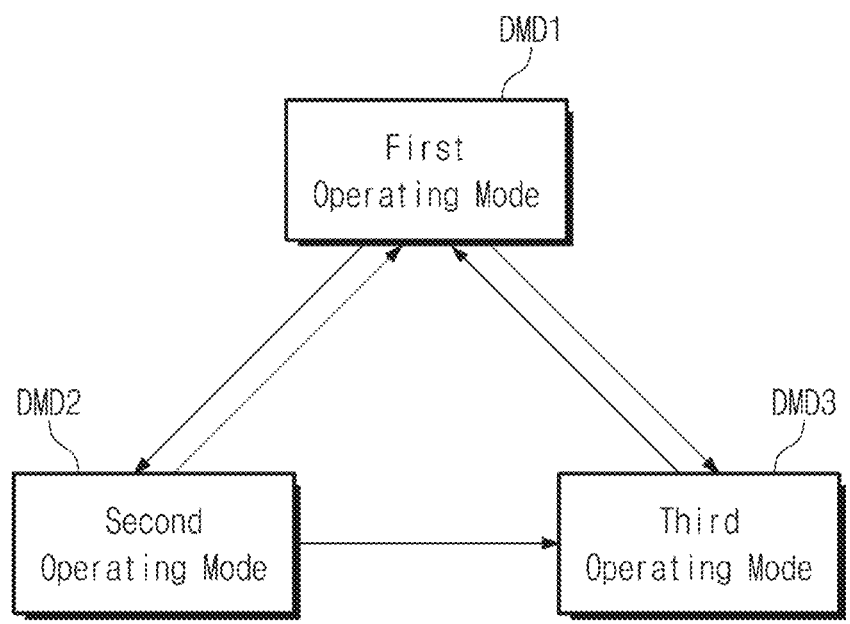
FIG. 11 is a diagram illustrating an operation of a sensor driver, according to some embodiments of the present disclosure.

FIG. 11 is a diagram showing an operation of a sensor driver 200C (see FIG. 4), according to some embodiments of the present disclosure.

Referring to FIGS. 4 and 11, the sensor driver 200C may be configured to selectively operate in one of a first operating mode DMD1, a second operating mode DMD2, or a third operating mode DMD3.

The first operating mode DMD1 may be referred to as a "touch and pen standby mode"; the second operating mode DMD2 may be referred to as a "touch activation and pen standby mode"; and, the third operating mode DMD3 may be referred to as a "pen activation mode". The first operating mode DMD1 may be in a mode for waiting for the first input 2000 and the second input 3000. The second operating mode DMD2 may be in a mode for sensing the first input 2000 and waiting for the second input 3000. The third operating mode DMD3 may be a mode for sensing the second input 3000.

According to some embodiments of the present disclosure, the sensor driver 200C may be driven first in the first operating mode DMD1. When the first input 2000 is sensed in the first operating mode DMD1, the sensor driver 200C may be switched (or changed) to the second operating mode DMD2. Alternatively, when the second input 3000 is sensed in the first operating mode DMD1, the sensor driver 200C may be switched (or changed) to the third operating mode DMD3.

According to some embodiments of the present disclosure, when the second input 3000 is sensed in the second operating mode DMD2, an operating mode of the sensor driver 200C may be switched to the third operating mode DMD3. When the first input 2000 is terminated (or not detected) in the second operating mode DMD2, an operating mode of the sensor driver 200C may be switched to the first operating mode DMD1. When the second input 3000 is terminated (or not detected) in the third operating mode DMD3, an operating mode of the sensor driver 200C may be switched to the first operating mode DMD1.

Figure 12A:
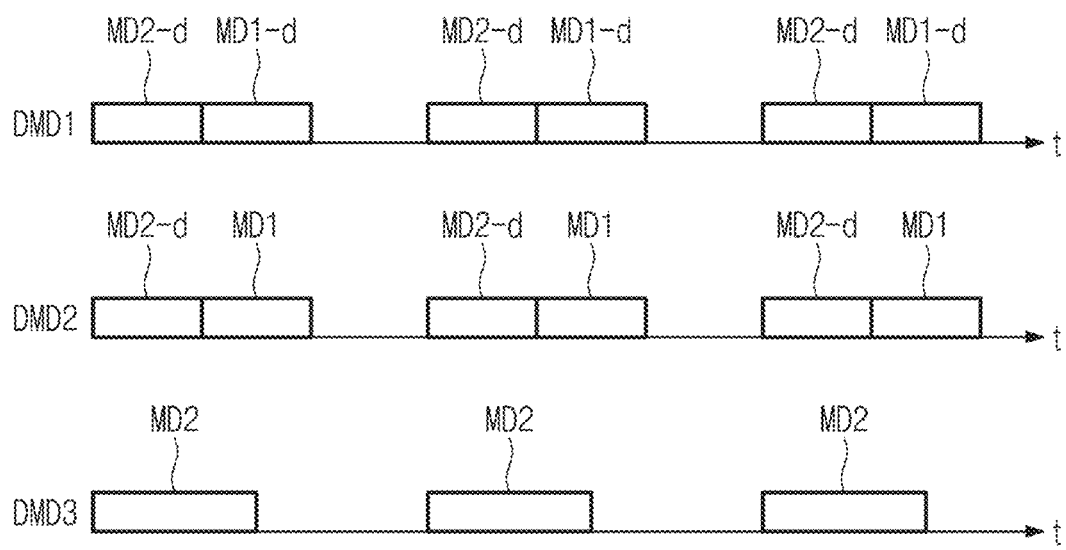
FIG. 12A is a diagram illustrating an operation of a sensor driver, according to some embodiments of the present disclosure.

FIG. 12A is a diagram showing an operation of a sensor driver 200C (see FIG. 4), according to some embodiments of the present disclosure.

Referring to FIGS. 4, 11, and 12A, operations in the first to third operating modes DMD1, DMD2, and DMD3 are shown in order of time (t).

In the first operating mode DMD1, the sensor driver 200C may be repeatedly driven in a second mode MD2-d and a first mode MD1-d. During the second mode MD2-d, the sensor layer 200 may perform a scan driving operation to detect the second input 3000. During the first mode MD1-d, the sensor layer 200 may perform a scan driving operation to detect the first input 2000. FIG. 12A illustrates that the sensor driver 200C operates in the first mode MD1-d continuously after the second mode MD2-d, but the order is not limited thereto.

In the second operating mode DMD2, the sensor driver 200C may be repeatedly driven in a second mode MD2-d and a first mode MD1. During the second mode MD2-d, the sensor layer 200 may perform a scan driving operation to detect the second input 3000. During the first mode MD1, the sensor layer 200 may perform a scan driving operation to detect coordinates by the first input 2000.

In the third operating mode DMD3, the sensor driver 200C may be driven in a second mode MD2. During the second mode MD2, the sensor layer 200 may perform a scan driving operation to detect coordinates by the second input 3000. In the third operating mode DMD3, the sensor driver 200C may not operate in the first mode MD1-d or MD1 until the second input 3000 is terminated (or not detected).

Referring to FIG. 6 together, in the first mode MD1-d and the first mode MD1, all of the third electrodes 230 and the fourth electrodes 240 may be grounded. Accordingly, touch noise entering through the third electrodes 230 and the fourth electrodes 240 may be prevented or reduced.

In the second mode MD2-d and the second mode MD2, one end of each of the third electrodes 230 and the fourth electrodes 240 may be floated. Moreover, in the second mode MD2-d and the second mode MD2, the other end of each of the third electrodes 230 and the fourth electrodes 240 may be grounded or floated. Accordingly, compensation of the sensing signal may be maximized or improved by the coupling between the first electrodes 210 and the third electrodes 230 and the coupling between the second electrodes 220 and the fourth electrodes 240.

Figure 12B:
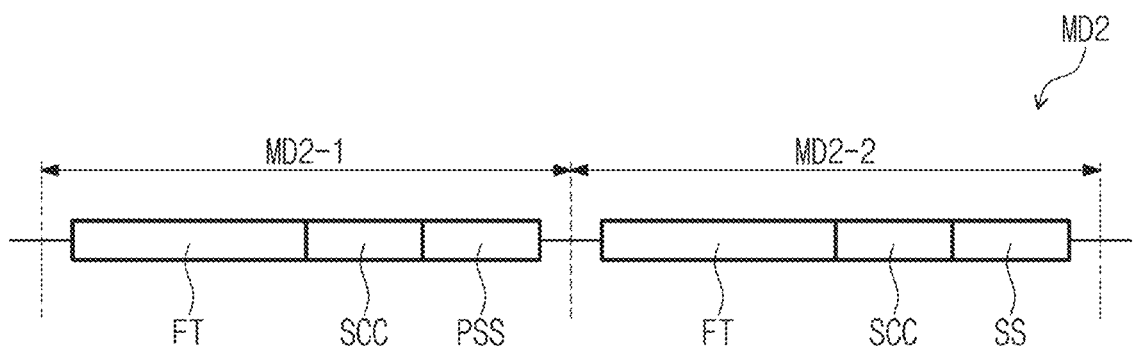
FIG. 12B is a diagram showing an operation of a second mode, according to some embodiments of the present disclosure.

FIG. 12B is a diagram showing an operation of the second mode MD2, according to some embodiments of the present disclosure.

Referring to FIG. 12B, the second mode MD2 may include a first driving mode MD2-1 and a second driving mode MD2-2. The first driving mode MD2-1 of the second mode MD2 may be referred to as a "proactive driving mode", and the second driving mode MD2-2 of the second driving mode MD2 may be referred to as a "main driving mode"

The first driving mode MD2-1 may include a touch driving mode FT, a charging driving mode SCC, and a pre-pen sensing driving mode PSS. The second driving mode MD2-2 may include the touch driving mode FT, the charging driving mode SCC, and a pen sensing driving mode SS.

The touch driving mode FT may be a mode driven to detect touches by a palm or a blade of a hand. However, only a touch is detected, and an operation corresponding to an input may not be executed. In other words, the touch driving mode FT may only detect that a touch of a palm or a blade of a hand is occurring, and may be a mode in which coordinates are recognized and an operation corresponding to the recognized result is not executed. In other words, according to some embodiments, during the touch driving mode FT, whether or not a touch occurs may be detected or determined, without regard for the location or coordinates of the touch. According to some embodiments of the present disclosure, the touch driving mode FT may be omitted in at least one of the first driving mode MD2-1 or the second driving mode MD2-2.

The charging driving mode SCC may be a mode in which a signal for charging a pen is provided. In the charging driving mode SCC, a magnetic field may be formed in the sensor layer 200. In this case, the pen adjacent to the sensor layer 200 may be charged. The charging driving mode SCC may be referred to as a driving mode to generate a magnetic field for charging the pen.

The pre-pen sensing driving mode PSS may be a mode for detecting an active area where the pen is located. For example, the sensor driver 200C may change a weighting value, which are applied to each of the signals received from the second electrodes 220, depending on a location of the active area. That is, the pre-pen sensing driving mode PSS may be a mode for determining the weighting value. The weighting value may be at least one of a weight or a gain.

The pen sensing driving mode SS may be a mode for detecting the location of the pen. For example, the sensor driver 200C may change one of the weight and the gain and may detect pen coordinates based on signals received from the first electrodes 210 and the second electrodes 220.

Figure 13:
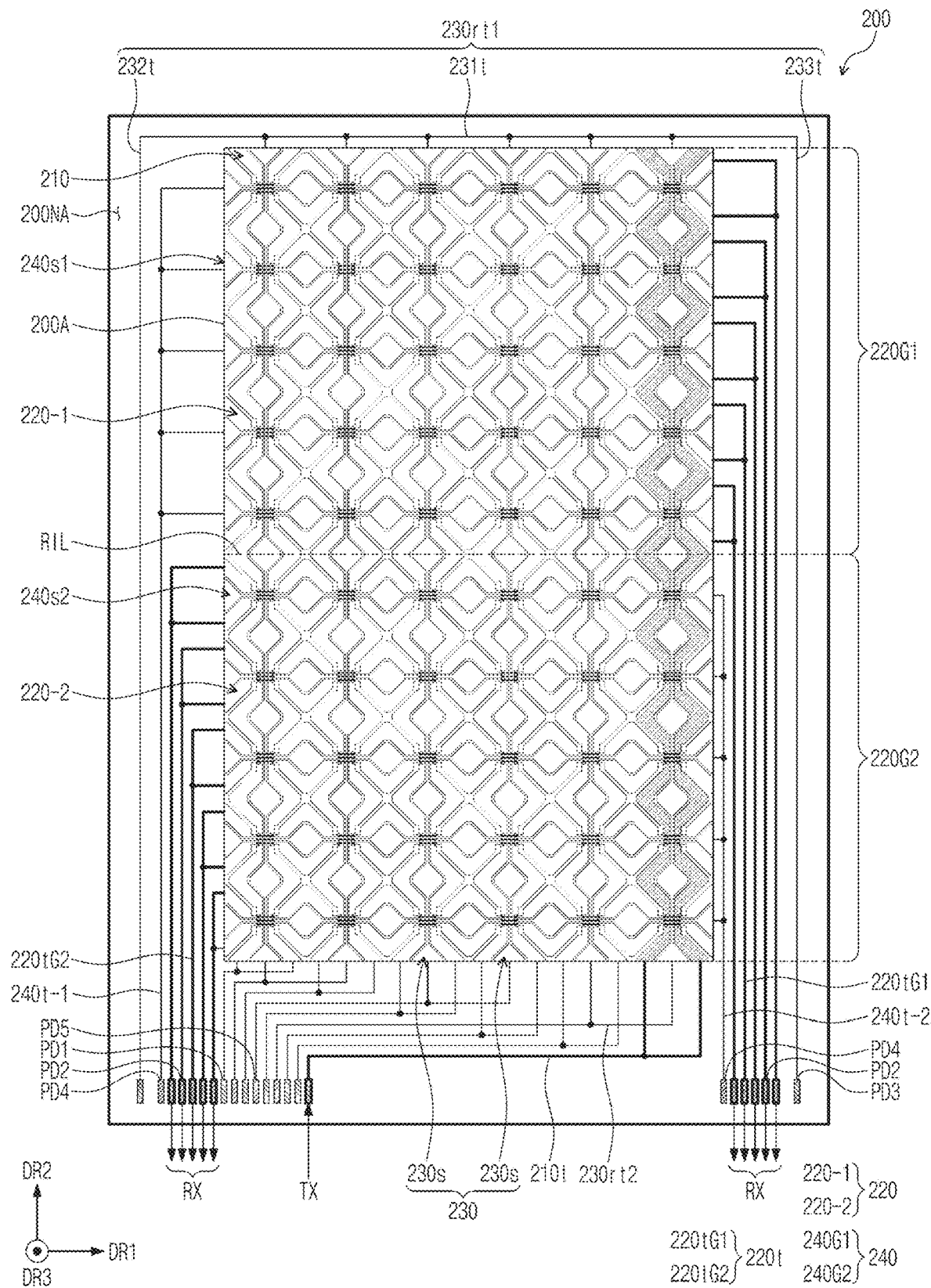
FIG. 13 is a diagram for describing a first mode, according to some embodiments of the present disclosure.

FIG. 13 is a diagram for describing a first mode, according to some embodiments of the present disclosure.

Referring to FIGS. 12A and 13, the first mode MD1-d of the first operation mode DMD1 and the first mode MD1 of the second operation mode DMD2 may include a mutual capacitance detection mode. FIG. 13 is a diagram for describing a mutual capacitance detection mode in the first mode MD1-d and the first mode MD1.

In the mutual capacitance detection mode, the sensor driver 200C may sequentially provide a transmission signal TX to the first electrodes 210, and may detect coordinates for the first input 2000 by using a reception signal RX detected through the second electrodes 220. For example, the sensor driver 200C may be configured to calculate input coordinates by sensing changes in mutual capacitance between the first electrodes 210 and the second electrodes 220.

FIG. 13 illustrates that the transmission signal TX is provided to the one first electrode 210, and the reception signal RX is output from the second electrodes 220. To clarify the expression of a signal, FIG. 13 illustrates that only the one first electrode 210 to which the transmission signal TX is provided is hatched. The sensor driver 200C may detect input coordinates of the first input 2000 by sensing a change in capacitance between the first electrode 210 and each of the second electrodes 220.

In a mutual capacitance detection mode, both the third electrodes 230 and the fourth electrodes 240 may be grounded. Accordingly, noise may not be introduced through the third electrodes 230 and the fourth electrodes 240.

According to some embodiments of the present disclosure, at least one of the first mode MD1-d or the first mode MD1 may further include a self-capacitance detection mode. In the self-capacitance detection mode, the sensor driver 200C may be configured to output driving signals to the first electrodes 210 and the second electrodes 220 and to calculate input coordinates by sensing changes in capacitance between the first electrodes 210 and the second electrodes 220.

Figure 14:
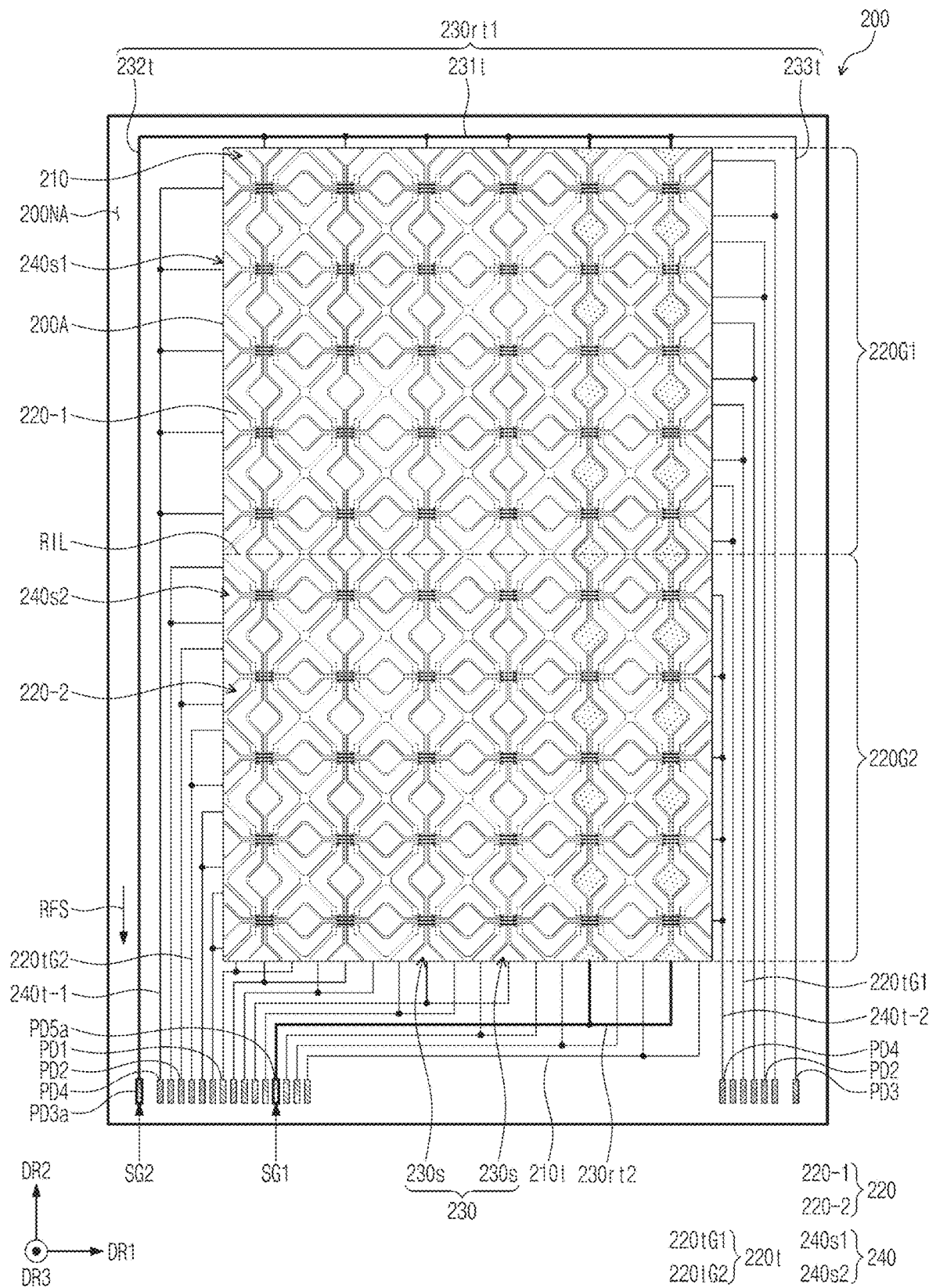
FIG. 14 is a diagram for describing a second mode, particularly a charging driving mode, according to some embodiments of the present disclosure.
Figure 15A:
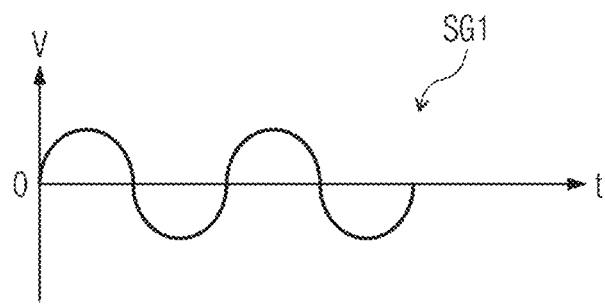
FIG. 15A is a graph showing a waveform of a first signal, according to some embodiments of the present disclosure.
Figure 15B:
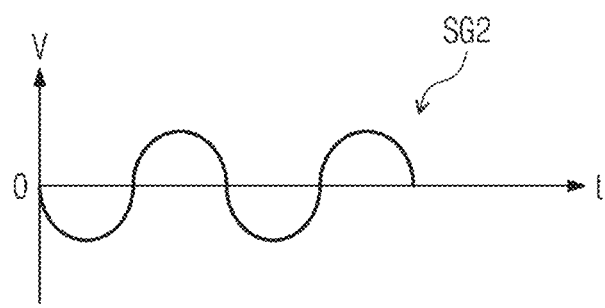
FIG. 15B is a graph showing a waveform of a second signal, according to some embodiments of the present disclosure.

FIG. 14 is a diagram for describing a second mode, particularly a charging driving mode, according to some embodiments of the present disclosure. FIG. 15A is a graph showing a waveform of a first signal, according to some embodiments of the present disclosure. FIG. 15B is a graph showing a waveform of a second signal, according to some embodiments of the present disclosure.

Referring to FIGS. 12B, 14, 15A, and 15B, the charging driving mode SCC may include a searching charging driving mode and a tracking charging driving mode.

The searching charging driving mode may be a driving mode before a location of the pen is sensed. Accordingly, a first signal SG1 or a second signal SG2 may be provided to all channels included in the sensor layer 200. In other words, the entire area of the sensor layer 200 may be scanned in the searching charging driving mode. When the pen PN is sensed in the searching charging driving mode, the sensor layer 200 may be driven for tracking charging. For example, in the tracking charging driving mode, the sensor driver 200C may sequentially output the first signal SG1 and the second signal SG2 to an area, which overlaps a point where the pen PN is sensed, not the entire sensor layer 200.

In the charging driving mode, the sensor driver 200C may apply the first signal SG1 to one of third pads PD3 and fifth pads PD5 and may apply the second signal SG2 to the other pad. The second signal SG2 may be a reverse signal of the first signal SG1. For example, the first signal SG1 may be a sinusoidal signal.

Because the first signal SG1 and the second signal SG2 are applied to at least two pads, a current RFS may have a current path through one pad to the other pad. Furthermore, because the first signal SG1 and the second signal SG2 are sinusoidal signals having a reverse-phase relationship to each other, the direction of the current RFS may change periodically. According to some embodiments of the present disclosure, the first signal SG1 and the second signal SG2 may be square wave signals having a reverse-phase relationship to each other.

When the first signal SG1 and the second signal SG2 have a reverse-phase relationship, noise caused by the first signal SG1 in the display layer 100 (see FIG. 3) may be canceled out with noise caused by the second signal SG2. Accordingly, a flicker may not occur in the display layer 100, and the display quality of the display layer 100 may be relatively improved.

According to some embodiments of the present disclosure, the first signal SG1 may be a sinusoidal signal. However, embodiments according to the present disclosure are not limited thereto, and the first signal SG1 may be a square wave signal. Besides, the second signal SG2 may have a constant voltage (e.g., a set or predetermined constant voltage). For example, the second signal SG2 may be a ground voltage. In other words, it is identified that a pad to which the second signal SG2 is applied is grounded. In this case, the current RFS may flow from one pad to the other pad. Also, because the first signal SG1 is a sinusoidal wave signal or square wave signal even when the other pad is grounded, the direction of the current RFS may change periodically.

Referring to FIG. 14, the second signal SG2 is provided through one third pad PD3a connected to one third trace line 230rt1, and the first signal SG1 is provided through one fifth pad PD5a connected to the third electrode 230. The current RFS may flow through a current path defined by a fifth pad PD5a, a fifth trace line 230rt2 connected to the fifth pad PD5a, the third electrode 230, a portion of the third trace line 230rt1 connected to a third pad PD3a, and the third pad PD3a. The current path may have the form of a coil. Accordingly, in the charging driving mode of the second mode, the resonant circuit of the pen PN may be charged by the current path.

Figure 1B:
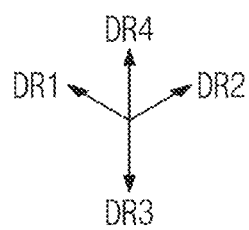

According to some embodiments of the present disclosure, a current path of the loop coil pattern may be implemented by the components included in the sensor layer 200. Accordingly, the electronic device 1000 (see FIG. 1) may charge the pen PN by using the sensor layer 200. Accordingly, because there is no need to add a separate configuration having a coil for charging the pen PN, the thickness, weight, and flexibility of the electronic device 1000 may not increase.

In the charging driving mode, the first electrodes 210, the second electrodes 220, and the fourth electrodes 240 may be grounded, or may be electrically floated. Alternatively, a constant voltage may be applied to the first electrodes 210, the second electrodes 220, and the fourth electrodes 240. In particular, the first electrodes 210, the second electrodes 220, and the fourth electrodes 240 may be floated. In this case, the current RFS may not flow to the first electrodes 210, the second electrodes 220, and the fourth electrodes 240.

Figure 16:
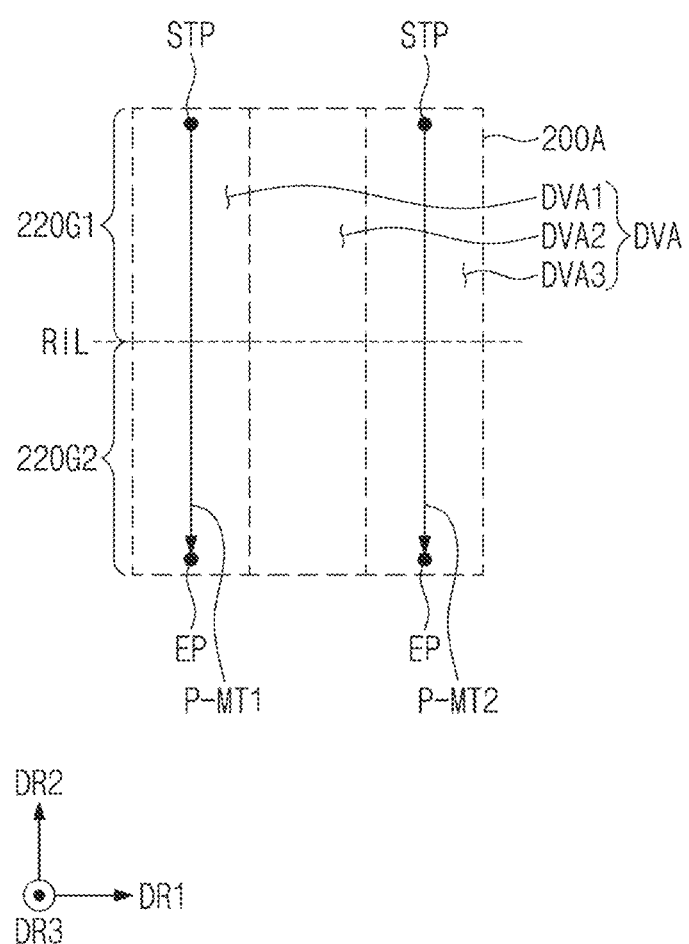
FIG. 16 is a diagram showing division areas, according to some embodiments of the present disclosure.

FIG. 16 is a diagram showing division areas, according to some embodiments of the present disclosure.

Referring to FIGS. 6 and 16, a sensing area 200A of the sensor layer 200 may include a plurality of division areas DVA defined in the first direction DR1. For example, the plurality of division areas DVA may include a first outer division area DVA1, a central division area DVA2, and a second outer division area DVA3.

According to some embodiments of the present disclosure, at least one of a gain or a weight, which are applied to each of signals received from the second electrodes 220, may be changed depending on an active area, in which a pen is located, from among the division areas DVA. For example, depending on an active area, at least one of a gain or a weight applied to each of signals received from the first electrode group 220G1 located on the boundary RIL may be adjusted; at least one of a gain or a weight applied to each of signals received from the second electrode group 220G2 located below the boundary RIL may be adjusted; and, at least one of the gain or the weight applied to each of the signals received from the first electrode group 220G1 and at least one of the gain or the weight applied to each of the signals received from the second electrode group 220G2 may be adjusted.

Figure 17:
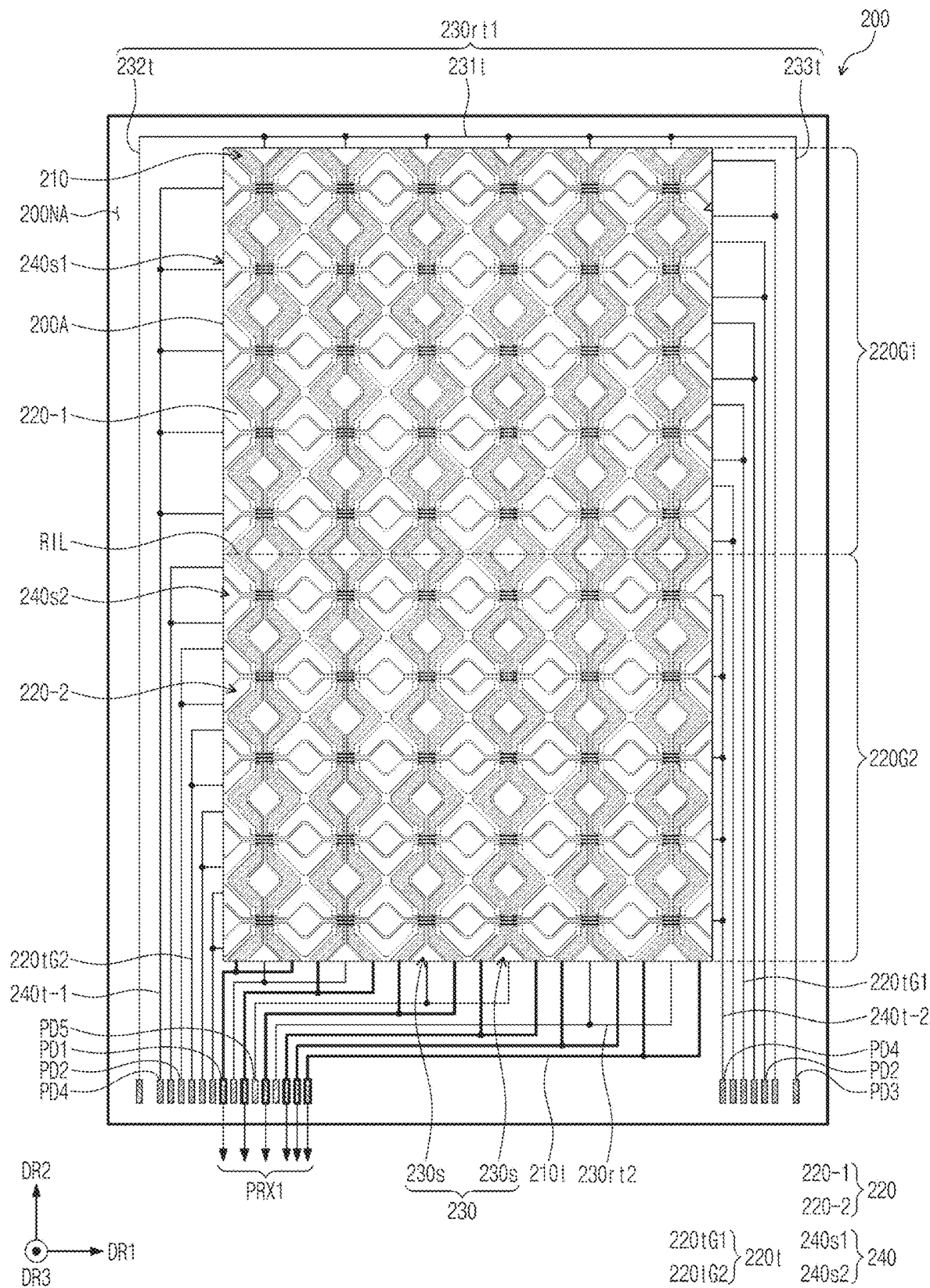
FIG. 17 is a diagram for describing a second mode, particularly a pre-pen sensing mode, according to some embodiments of the present disclosure.

FIG. 17 is a diagram for describing a second mode, particularly a pre-pen sensing mode, according to some embodiments of the present disclosure.

Referring to FIGS. 4, 16, and 17, a pen sensing driving mode may include the pre-pen sensing driving mode PSS (see FIG. 12B). Referring to FIG. 17, in the pre-pen sensing driving mode PSS, the sensor driver 200C may be configured to detect an active area, in which a pen is located, from among the division areas DVA based on signals received from the sensor layer 200. The division areas DVA are defined sequentially in the first direction DR1. Accordingly, the active area may be detected based on the location in the first direction DR1.

According to some embodiments of the present disclosure, the sensor driver 200C may receive first reception signals PRX1 from the first electrodes 210 and may detect the active area based on the first reception signal PRX1. In other words, in the pre-pen sensing driving mode PSS, a signal may not be received by the second electrodes 220. In this case, current consumption of the electronic device 1000 may be reduced.

The sensor driver 200C is configured to change at least one of a gain or a weight applied to each of the first electrode group 220G1 or the second electrode group 220G2 depending on the location of the active area. For example, at least one of the gain or the weight may be adjusted such that a sensitivity difference between signals received from the second electrodes 220, which are adjacent to the boundary RIL where the routing direction is changed, from among signals received from the second electrodes 220 is reduced or eliminated. Accordingly, the phenomenon that coordinate accuracy is decreased due to the sensitivity difference may be reduced or eliminated. In other words, the sensitivity difference according to a change in a routing direction may be corrected, thereby improving pen detection accuracy.

According to some embodiments of the present disclosure, the sensor driver 200C may receive reception signals from both the first electrodes 210 and the second electrodes 220. Afterward, the sensor driver 200C may detect the active area based on the reception signals.

Figure 18:
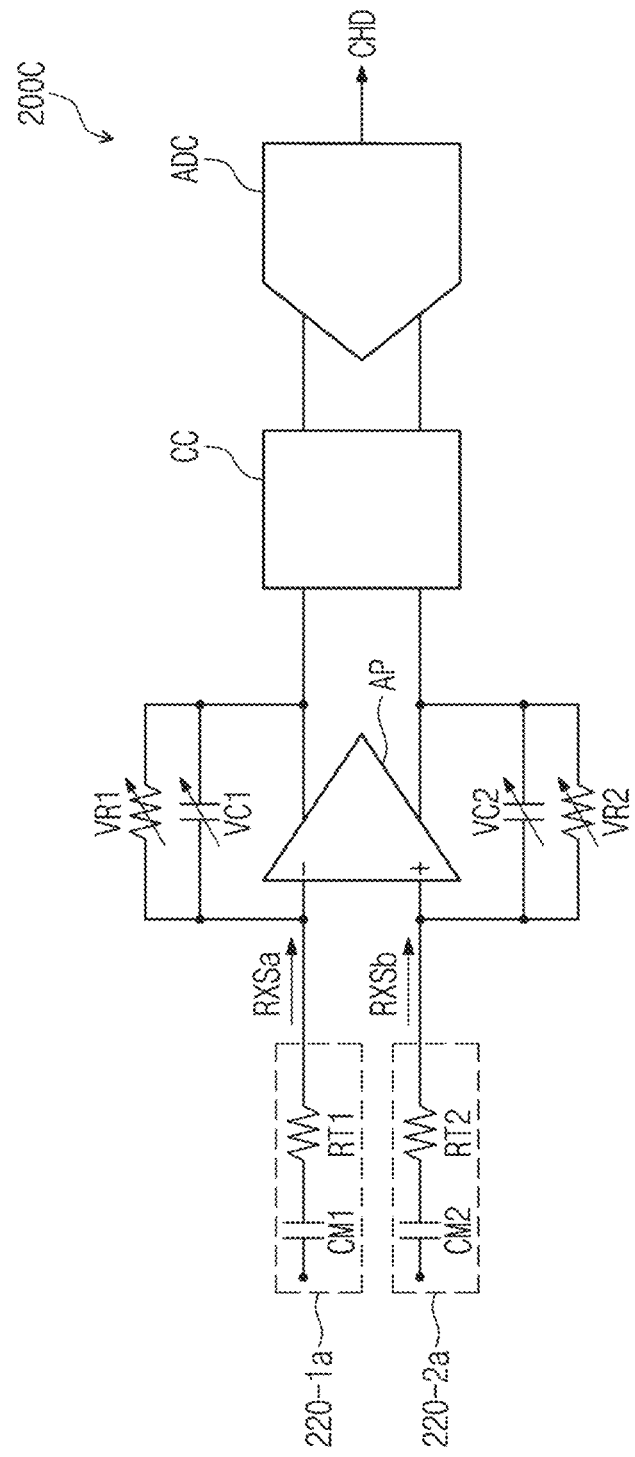
FIG. 18 is a diagram showing a sensor driver, according to some embodiments of the present disclosure.

FIG. 18 is a diagram showing a sensor driver 200C, according to some embodiments of the present disclosure.

Referring to FIGS. 17 and 18, the sensor driver 200C, one second electrode 220-1a, and another second electrode 220-2a are shown. The one second electrode 220-1a may be included in the first electrode group 220G1, and the other second electrode 220-2a may be included in the second electrode group 220G2.

The sensor driver 200C may include a charge voltage amplifier AP, a first variable capacitor VC1, a first variable resistor VR1, a second variable capacitor VC2, a second variable resistor VR2, a current conveyor CC, and an analog-to-digital converter ADC. The components included in the sensor driver 200C are not limited to the components described above. At least some of the above-described components may be omitted, and other components may be added. Moreover, the connection order of the components included in the sensor driver 200C may also be changed. For example, the current conveyor CC may be placed between the charge voltage amplifier AP and the one second electrode 220-1a and between the charge voltage amplifier AP and the other second electrode 220-2a.

According to some embodiments of the present disclosure, the one second electrode 220-1a may be electrically connected to an inverting terminal of the charge voltage amplifier AP. The other second electrode 220-2a may be electrically connected to a non-inverting terminal of the charge voltage amplifier AP. For example, two second electrodes adjacent to each other or spaced apart from each other by a distance (e.g., a set or predetermined distance) may be electrically connected to the charge voltage amplifier AP.

According to some embodiments of the present disclosure, each of the first variable capacitor VC1 and the first variable resistor VR1 may be connected in parallel to the inverting terminal and an output terminal of the charge voltage amplifier AP. Each of the second variable capacitor VC2 and the second variable resistor VR2 may be connected in parallel to the non-inverting terminal and the output terminal of the charge voltage amplifier AP.

According to some embodiments of the present disclosure, the sensor driver 200C may adjust a gain by adjusting at least one of the first variable capacitor VC1, the first variable resistor VR1, the second variable capacitor VC2, or the second variable resistor VR2. For example, a first capacitor CM1 and a first resistor RT1 may be defined (formed or provided) in the one second electrode 220-1a. A second capacitor CM2 and a second resistor RT2 may be defined in the other second electrode 220-2a.

The gain of the one second electrode 220-1a may correspond to the minimum value of a ratio of the first capacitor CM1/the first variable capacitor VC1 and the first variable resistor VR1/the first resistor RT1. Moreover, the gain of the other second electrode 220-2a may correspond to the minimum value of the ratio of the second capacitor CM2/the second variable capacitor VC2 and the second variable resistor VR2/the second resistor RT2.

According to some embodiments of the present disclosure, a first signal RXSa received from the one second electrode 220-1a and a second signal RXSb received from the other second electrode 220-2a may be amplified with different gain values. Accordingly, at least one of the gain or the weight may be adjusted such that a sensitivity difference between signals received from the second electrodes 220, which are adjacent to the boundary RIL where the routing direction is changed, is reduced or eliminated. Accordingly, the phenomenon that coordinate accuracy may be decreased due to the sensitivity difference may be reduced or eliminated.

Signals output from the charge voltage amplifier AP may be provided to the current conveyor CC. For example, signs of two channels (e.g., the first signal RXSa received from the one second electrode 220-1a and the second signal RXSb received from the other second electrode 220-2a) with different routing directions from each other may be opposite to each other. Accordingly, the current conveyor CC may process the signals output from the charge voltage amplifier AP for differential sensing.

The analog-to-digital converter ADC may receive a signal provided from the current conveyor CC. The analog-to-digital converter ADC may sample a maximum value point of the received signal and may convert the sampled result into a digital signal. The analog-to-digital converter ADC may output a code CHD for converting an analog signal into the digital signal.

Figure 19:
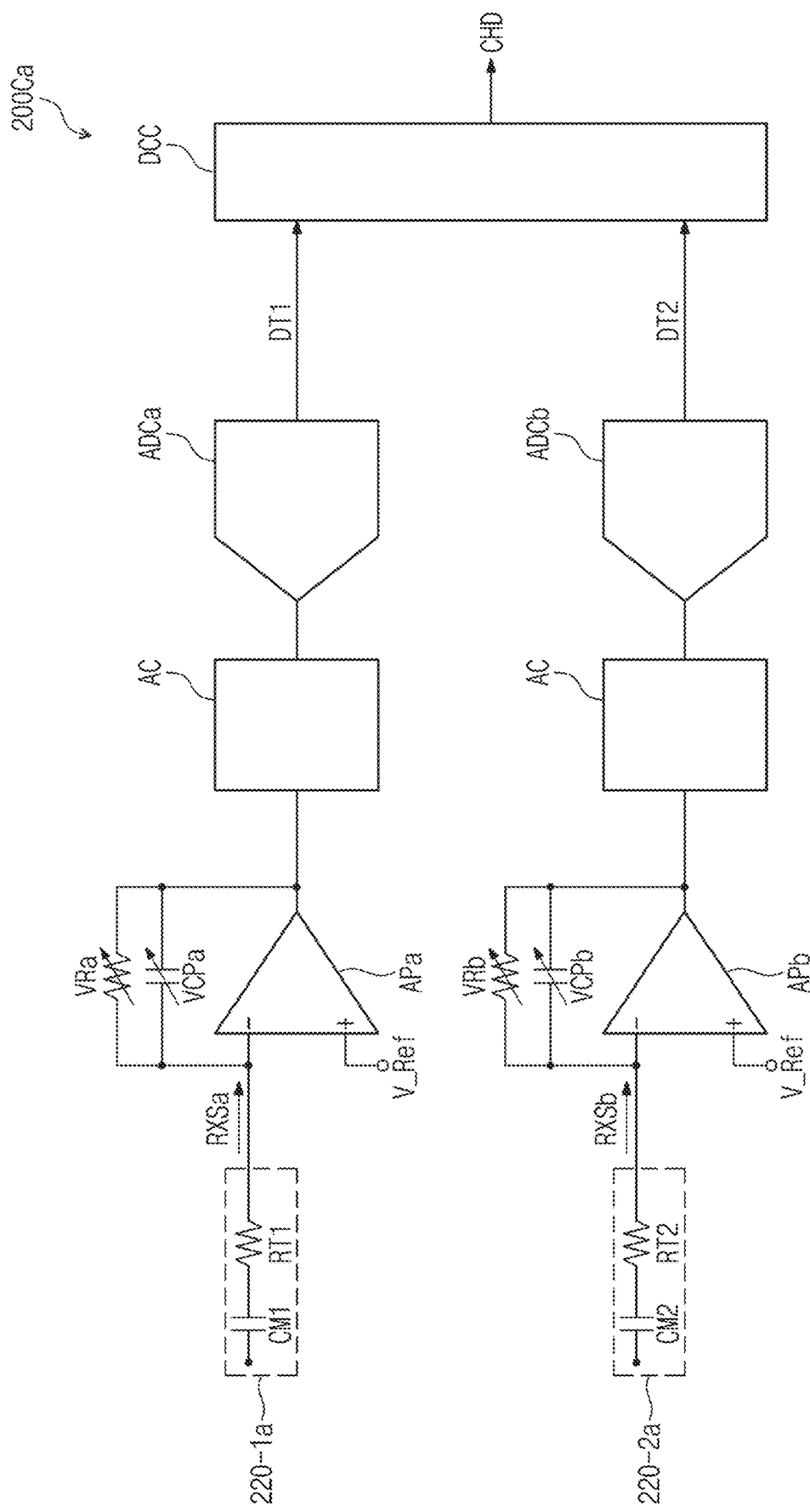
FIG. 19 is a diagram showing a sensor driver, according to some embodiments of the present disclosure.

FIG. 19 is a diagram showing a sensor driver 200Ca, according to some embodiments of the present disclosure.

Referring to FIGS. 17 and 19, the sensor driver 200Ca, one second electrode 220-1a, and another second electrode 220-2a are shown.

The sensor driver 200Ca includes first and second charge voltage amplifiers APa and APb, a first variable capacitor VCPa, a first variable resistor VRa, a second variable capacitor VCPb, a second variable resistor VRb, intermediate circuits AC, a first analog-to-digital converter ADCa, a second analog-to-digital converter ADCb, and a difference calculator DCC. The components included in the sensor driver 200Ca are not limited to the components described above. At least some of the above-described components may be omitted, and other components may be added.

According to some embodiments of the present disclosure, the one second electrode 220-1a may be electrically connected to an inverting terminal of the first charge voltage amplifier APa, and a reference voltage V_Ref may be provided to a non-inverting terminal of the first charge voltage amplifier APa. The other second electrode 220-2a may be electrically connected to an inverting terminal of the second charge voltage amplifier APb, and a reference voltage V_Ref may be provided to a non-inverting terminal of the second charge voltage amplifier APb. According to some embodiments of the present disclosure, each of the first variable capacitor VCPa and the first variable resistor VRa may be connected in parallel to the inverting terminal and an output terminal of the first charge voltage amplifier APa. Each of the second variable capacitor VCPb and the second variable resistor VRb may be connected in parallel to the inverting terminal and the output terminal of the second charge voltage amplifier APb.

According to some embodiments of the present disclosure, the sensor driver 200C may adjust a gain by adjusting at least one of the first variable capacitor VCPa, the first variable resistor VRa, the second variable capacitor VCPb, or the second variable resistor VRb. For example, a first capacitor CM1 and a first resistor RT1 may be defined (formed or provided) in the one second electrode 220-1a. A second capacitor CM2 and a second resistor RT2 may be defined in the other second electrode 220-2a.

The gain of the one second electrode 220-1a may correspond to the minimum value of a ratio of the first capacitor CM1/the first variable capacitor VCPa and the first variable resistor VRa/the first resistor RT1. Moreover, the gain of the other second electrode 220-2a may correspond to the minimum value of the ratio of the second capacitor CM2/the second variable capacitor VCPb and the second variable resistor VRb/the second resistor RT2.

According to some embodiments of the present disclosure, a first signal RXSa received from the one second electrode 220-1a and a second signal RXSb received from the other second electrode 220-2a may be amplified with different gain values. Accordingly, at least one of the gain or the weight may be adjusted such that a sensitivity difference between signals received from the second electrodes 220, which are adjacent to the boundary RIL where the routing direction is changed, is reduced or eliminated. Accordingly, the phenomenon that coordinate accuracy is decreased due to the sensitivity difference may be reduced or eliminated.

Signals output from the first and second charge voltage amplifiers APa and APb may be provided to the intermediate circuits AC. The intermediate circuits AC may be a circuit consisting of passive elements. For example, each of the intermediate circuits AC may include a low-pass filter, and the low-pass filter may consist of a resistor and a capacitor.

Signals output from the intermediate circuits AC may be output to the first and second analog-to-digital converters ADCa and ADCb. Each of the first and second analog-to-digital converters ADCa and ADCb may sample a maximum value point of the received signal and may convert the sampled result into a digital signal. The first analog-to-digital converter ADCa may output first data DT1. The second analog-to-digital converter ADCb may output second data DT2.

The difference calculator DCC may receive the first data DT1 and the second data DT2. When signs of the first data DT1 and the second data DT2 are the same as each other, the difference calculator DCC may output the code CHD based on a difference between the first data DT1 and the second data DT2. Alternatively, when the signs of the first data DT1 and the second data DT2 are different from each other, the difference calculator DCC may output the code CHD based on the sum of the first data DT1 and the second data DT2.

Figure 20:
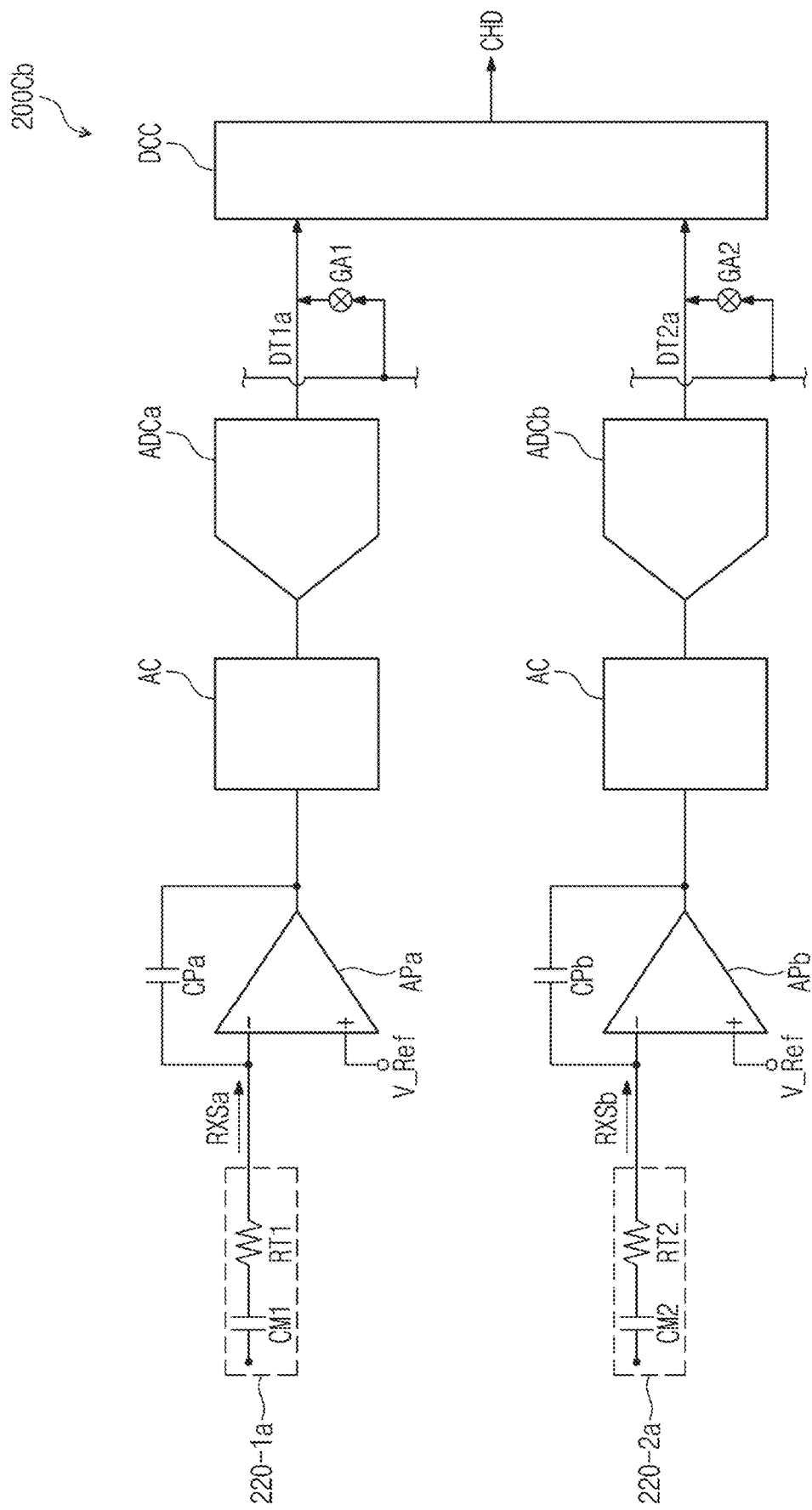
FIG. 20 is a diagram showing a sensor driver, according to some embodiments of the present disclosure.

FIG. 20 is a diagram showing a sensor driver 200Cb, according to some embodiments of the present disclosure.

Referring to FIGS. 17 and 20, the sensor driver 200Cb, one second electrode 220-1a, and another second electrode 220-2a are shown.

the sensor driver 200Cb may include the first and second charge voltage amplifiers APa and APb, a first capacitor CPa, a second capacitor CPb, the intermediate circuits AC, the first analog-to-digital converter ADCa, the second analog-to-digital converter ADCb, and the difference calculator DCC. The components included in the sensor driver 200Cb are not limited to the components described above. At least some of the above-described components may be omitted, and other components may be added.

According to some embodiments of the present disclosure, the first capacitor CPa may be connected in parallel to an inverting terminal and output terminal of the first charge voltage amplifier APa. The second capacitor CPb may be connected in parallel to an inverting terminal and output terminal of the second charge voltage amplifier APb. The first capacitor CPa and the second capacitor CPb may have non-variable capacitance, and the gain of each of the first charge voltage amplifier APa and the second charge voltage amplifier APb may be fixed.

Signals output from the first and second charge voltage amplifiers APa and APb may be provided to the intermediate circuits AC. Each of the intermediate circuits AC may include a low-pass filter, and the low-pass filter may include a resistor and a capacitor. Signals output from the intermediate circuits AC may be output to the first and second analog-to-digital converters ADCa and ADCb. Each of the first and second analog-to-digital converters ADCa and ADCb may sample a maximum value point of the received signal and may convert the sampled result into a digital signal. The first analog-to-digital converter ADCa may output first data DT1a. The second analog-to-digital converter ADCb may output second data DT2a.

According to some embodiments of the present disclosure, a first weight GA1 may be applied to the first data DT1a, and a second weight GA2 may be applied to the second data DT2a. The first data DT1a generated from the first signal RXSa received from the one second electrode 220-1a and the second data DT2a generated from the second signal RXSb received from the other second electrode 220-2a may be adjusted because different weights are applied. Accordingly, the weight may be adjusted such that a sensitivity difference between signals received from the second electrodes 220, which are adjacent to the boundary RIL where the routing direction is changed, is reduced or eliminated. Accordingly, the phenomenon that coordinate accuracy is decreased due to the sensitivity difference may be reduced or eliminated.

First weighted data obtained by applying the first weight GA1 to the first data DT1a and second weighted data obtained by applying the second weight GA2 to the second data DT2a may be provided to the difference calculator DCC. The difference calculator DCC may calculate the first weighted data and the second weighted data and may output the code CHD.

Figure 21:
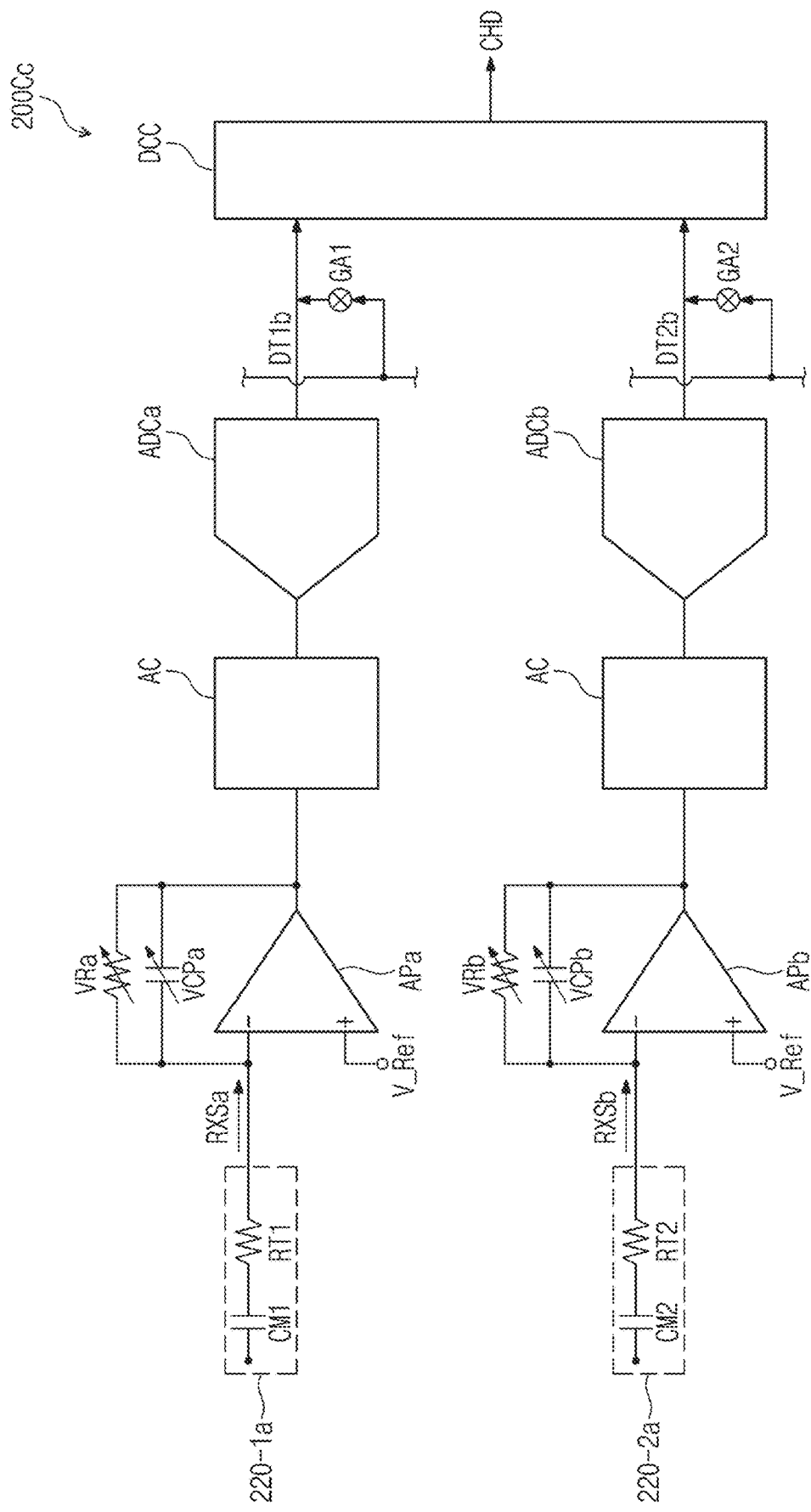
FIG. 21 is a diagram showing a sensor driver, according to some embodiments of the present disclosure.

FIG. 21 is a diagram showing a sensor driver 200Cc, according to some embodiments of the present disclosure. In the description of FIG. 21, the same reference numerals are assigned to the same components described with reference to FIGS. 19 and 20, and thus some repetitive description of the same or similar components may be omitted to avoid redundancy.

Referring to FIGS. 17 and 21, the sensor driver 200Cc, one second electrode 220-1a, and another second electrode 220-2a are shown.

The sensor driver 200Cc includes the first and second charge voltage amplifiers APa and APb, the first variable capacitor VCPa, the first variable resistor VRa, the second variable capacitor VCPb, the second variable resistor VRb, the intermediate circuits AC, the first analog-to-digital converter ADCa, the second analog-to-digital converter ADCb, and the difference calculator DCC.

According to some embodiments of the present disclosure, the sensor driver 200Cc may adjust a gain by adjusting at least one of the first variable capacitor VCPa, the first variable resistor VRa, the second variable capacitor VCPb, or the second variable resistor VRb. Moreover, the first weight GA1 may be applied to the first data DT1b output from the first analog-to-digital converter ADCa. The second weight GA2 may be applied to the second data DT2b output from the second analog-to-digital converter ADCb.

According to some embodiments of the present disclosure, a first signal RXSa received from the one second electrode 220-1a and a second signal RXSb received from the other second electrode 220-2a may be amplified with different gain values, and different weights may be applied. Accordingly, at least one of the gain or the weight may be adjusted such that a sensitivity difference between signals received from the second electrodes 220, which are adjacent to the boundary RIL where the routing direction is changed, is reduced or eliminated. Accordingly, the phenomenon that coordinate accuracy is decreased due to the sensitivity difference may be reduced or eliminated.

FIG. 22 is a diagram showing gain values corresponding to channels, according to some embodiments of the present disclosure. FIG. 23 is a diagram showing gain values corresponding to channels, according to some embodiments of the present disclosure.

Referring to FIGS. 4, 6, 22, and 23, a gain value applied to signals received from channels (e.g., the first electrodes 210, the first electrode group 220G1, and the second electrode group 220G2) may be stored in a memory within the sensor driver 200C or a memory communicating with the sensor driver 200C, but embodiments according to the present disclosure are not particularly limited thereto.

In FIG. 22, the gain values corresponding to the channels before the pre-pen sensing driving mode PSS (e.g., before an active area where the pen is located is detected) are described. For example, a gain value applied to signals received from the first electrodes 210 may be GAIN_A, and a gain value applied to signals received from the first electrode group 220G1 and the second electrode group 220G2 among the second electrodes 220 may be GAIN_B.

Afterward, when the active area where the pen is located is detected, the gain value of at least one of the first electrode group 220G1 or the second electrode group 220G2 may be adjusted according to the location of the active area. An example of gain values adjusted depending on the active area is shown in FIG. 23. Embodiments according to the present disclosure are not limited to the gain adjustment pattern or amount as illustrated in FIG. 23.

Referring to FIG. 23, the gain value applied to signals received from the first electrodes 210 may not be changed to GAIN_A. Furthermore, when the active area is the central division area DVA2, the gain value applied to the signals received from the first electrode group 220G1 and the second electrode group 220G2 may be maintained as GAIN_B.

When active area is the first outer division area DVA1, the gain value applied to the signal received from the first electrode group 220G1 may be changed from GAIN_B to GAIN_1, and the gain value applied to the signal received from the second electrode group 220G2 may be maintained as GAIN_B. When the active area is the second outer division area DVA3, the gain value applied to the signal received from the first electrode group 220G1 may be maintained as GAIN_B, and the gain value applied to the signal received from the second electrode group 220G2 may be changed from GAIN_B to GAIN_2. Each of GAIN_1 and GAIN_2 may have a value greater than GAIN_B. GAIN_1 and GAIN_2 may have values capable of reducing a deviation of sensitivity. GAIN_1 and GAIN_2 may be the same as each other or may be different from each other.

In FIGS. 22 and 23, adjusting a gain is described as an example, but the description may be substantially applied equally to the weight described with reference to FIG. 20. The weight may be a value that is multiplied by the data DT1a or DT2a (see FIG. 20) output from the analog-to-digital converter ADCa or ADCb (see FIG. 20). For example, when the active area is the first outer division area DVA1, the weight applied to the signal received from the first electrode group 220G1 may be increased, and the weight applied to the signal received from the second electrode group 220G2 may be maintained. When the active area is the second outer division area DVA3, the weight applied to the signal received from the first electrode group 220G1 may be maintained, and the weight applied to the signal received from the second electrode group 220G2 may be increased. When the weight is adjusted, data differences due to sensitivity differences may be relatively reduced. Accordingly, the phenomenon that coordinate accuracy is decreased due to the sensitivity difference may be reduced or eliminated.

According to some embodiments of the present disclosure, first gains applied to signals received from some second electrodes 220-1 included in the first electrode group 220G1 may be the same as each other. Alternatively, first weights applied to signals received from the second electrodes 220-1 may be the same as each other. Moreover, second gains applied to signals received from some of the other second electrodes 220-2 included in the second electrode group 220G2 may be the same as each other. Alternatively, second weights applied to signals received from the other second electrodes 220-2 may be the same as each other.

When the pen is located in the central division area DVA2, the first gain may be the same as the second gain, and the first weight may be the same as the second weight. When the pen is located in the first outer division area DVA1 or the second outer division area DVA3, the first gain may be different from the second gain. When the pen is located in the first outer division area DVA1 and the second outer division area DVA3, the first weight may be different from the second weight.

Figure 24A:
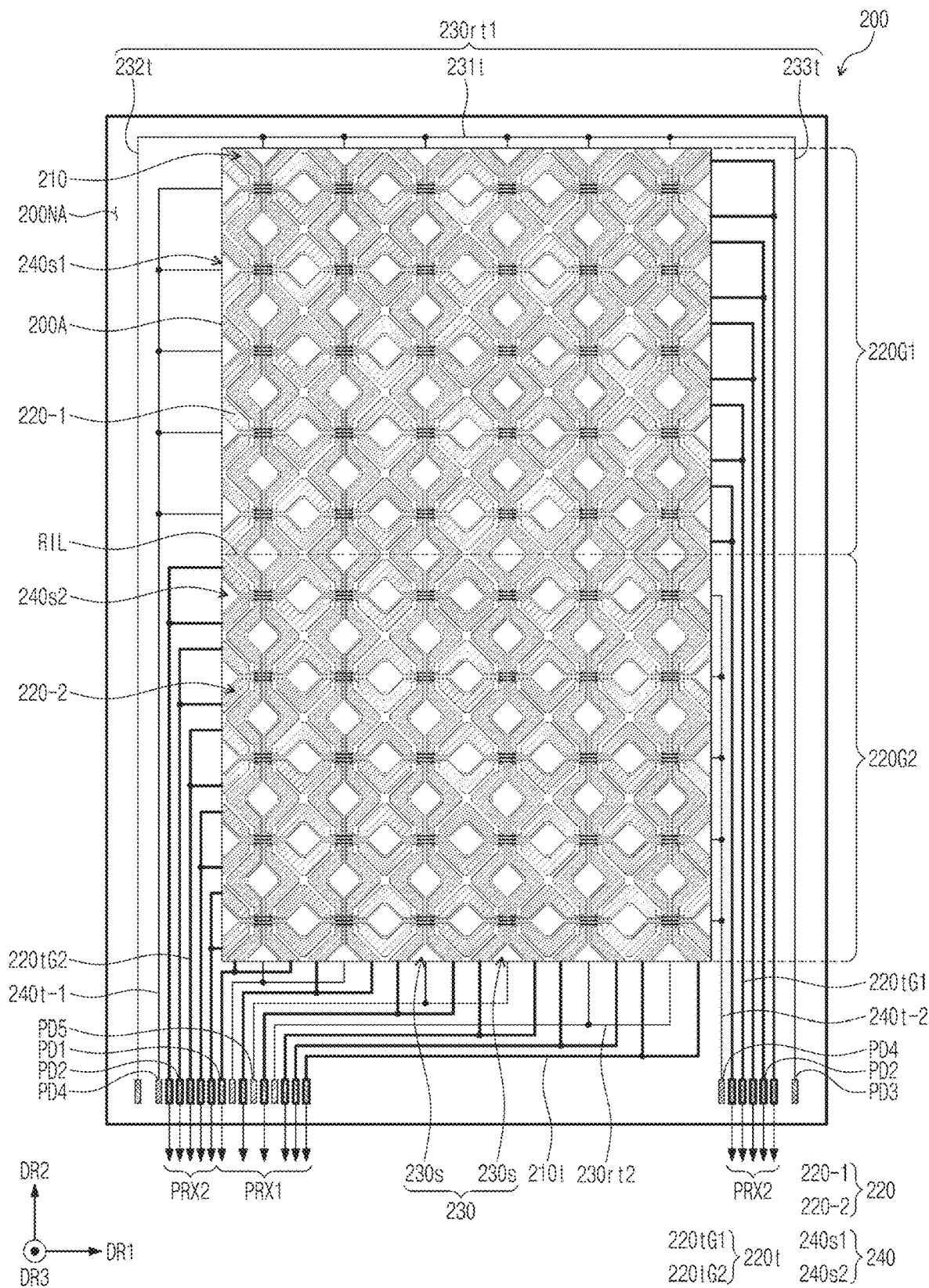
FIG. 24A is a diagram for describing a second mode, according to some embodiments of the present disclosure.

FIG. 24A is a diagram for describing a second mode, according to some embodiments of the present disclosure.

Figure 24B:
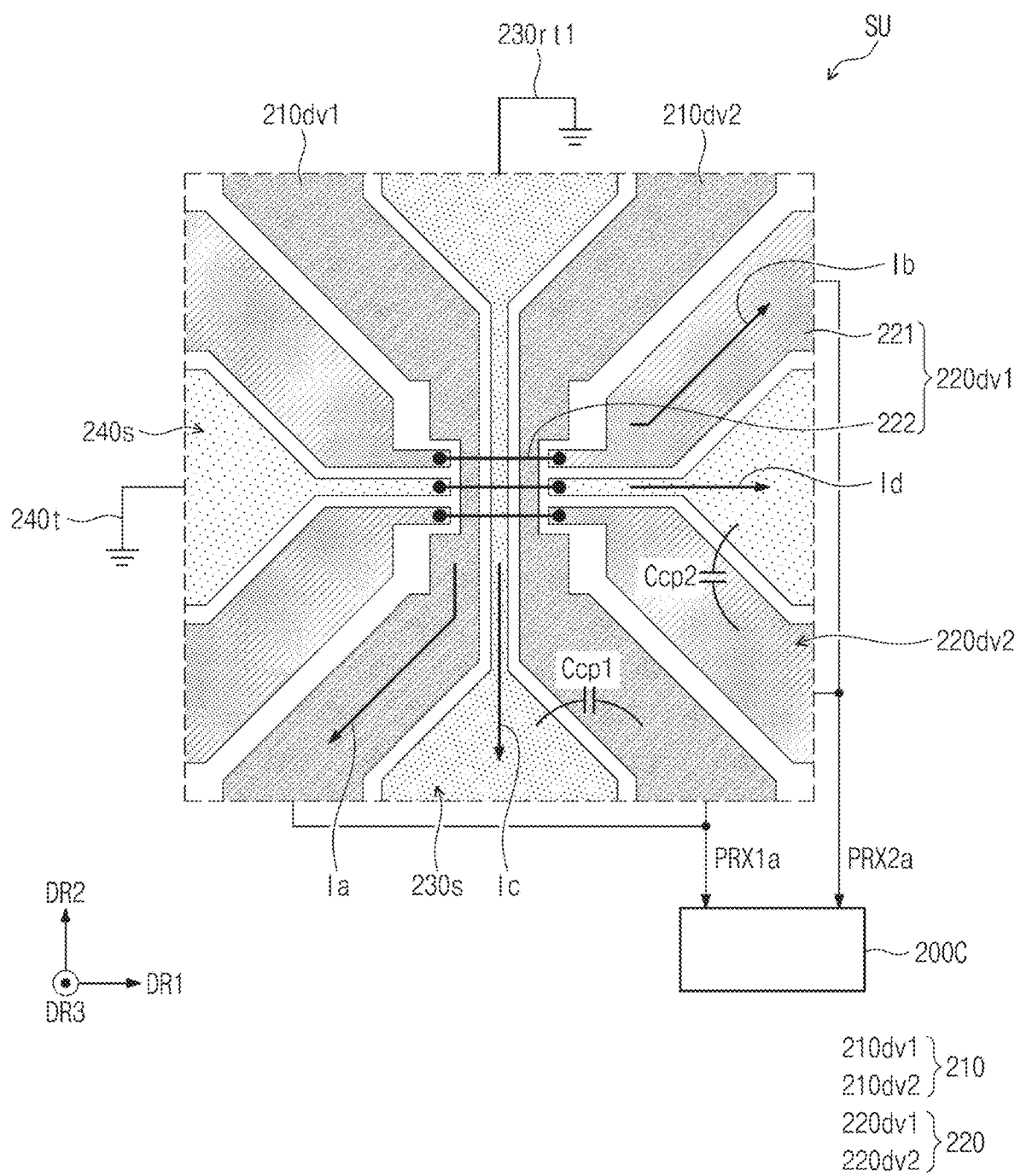
FIG. 24B is a diagram for describing a second mode based on a sensing unit, according to some embodiments of the present disclosure.

FIG. 24B is a diagram for describing a second mode based on a sensing unit, according to some embodiments of the present disclosure.

Referring to FIGS. 4, 24A, and 24B, a second mode may include a charging driving mode and a pen sensing driving mode. FIGS. 24A and 24B are diagrams for describing the pen sensing driving mode. FIG. 24B shows the one sensing units SU through which first to fourth induced currents Ia, Ib, Ic, and Id generated by the pen PN flow.

An RLC resonant circuit of the pen PN may emit a magnetic field at a resonant frequency while discharging charged charges. Due to the magnetic field provided by the pen PN, the first induced current Ia may be generated in the first electrode 210, and the second induced current Ib may be generated in the second electrode 220. Moreover, the third induced current Ic may be generated in the first auxiliary electrode 230s of the third electrode 230, and the fourth induced current Id may also be generated in the second auxiliary electrode 240s of the fourth electrode 240.

A first coupling capacitor Ccp1 may be formed between the first auxiliary electrode 230s and the first electrode 210. A second coupling capacitor Ccp2 may be formed between the second auxiliary electrode 240s and the second electrode 220. The third induced current Ic may be delivered to the first electrode 210 through the first coupling capacitor Ccp1. The fourth induced current Id may be delivered to the second electrode 220 through the second coupling capacitor Ccp2.

The sensor driver 200C may receive a first reception signal PRX1a, which is based on the first induced current Ia and the third induced current Ic, from the first electrode 210 and may receive a second reception signal PRX2a, which is based on the second induced current Ib and the fourth induced current Id, from the second electrode 220. The sensor driver 200C may detect input coordinates of the pen PN based on the first reception signal PRX1a and the second reception signal PRX2a.

The sensor driver 200C may receive the first reception signal PRX1a from the first electrodes 210 and may receive the second reception signal PRX2a from the second electrodes 220. In this case, all ends of the third electrodes 230 and the fourth electrodes 240 may be floated. Accordingly, compensation of the sensing signal may be maximized by the coupling between the first electrodes 210 and the third electrodes 230 and the coupling between the second electrodes 220 and the fourth electrodes 240. Besides, the other ends of the third electrodes 230 and the fourth electrodes 240 may be grounded or floated. Accordingly, the third induced current Ic and the fourth induced current Id may be sufficiently delivered to the first electrodes 210 and the second electrodes 220 by the coupling between the first electrodes 210 and the third electrodes 230 and by the coupling between the second electrodes 220 and the fourth electrodes 240.

According to some embodiments of the present disclosure, the routing directions of an electrode and an auxiliary electrode of the sensor layer 200 in which layers are overlapped may be different. For example, the routing direction of the first electrode 210 may be different from the routing direction of the first auxiliary electrode 230s. Also, the routing direction of the second electrode 220 may be different from the routing direction of the second auxiliary electrode 240s. For example, in FIG. 24B, the first electrode 210 and the first trace line 210t may be connected in a lower portion of the sensing unit SU. The first auxiliary electrode 230s and the third trace line 230rt1 may be connected in an upper portion of the sensing unit SU. The second electrode 220 and the second trace line 220t may be connected on the left side of the sensing unit SU. The second auxiliary electrode 240s and the fourth trace line 240t may be connected on the right side of the sensing unit SU.

Figure 25:
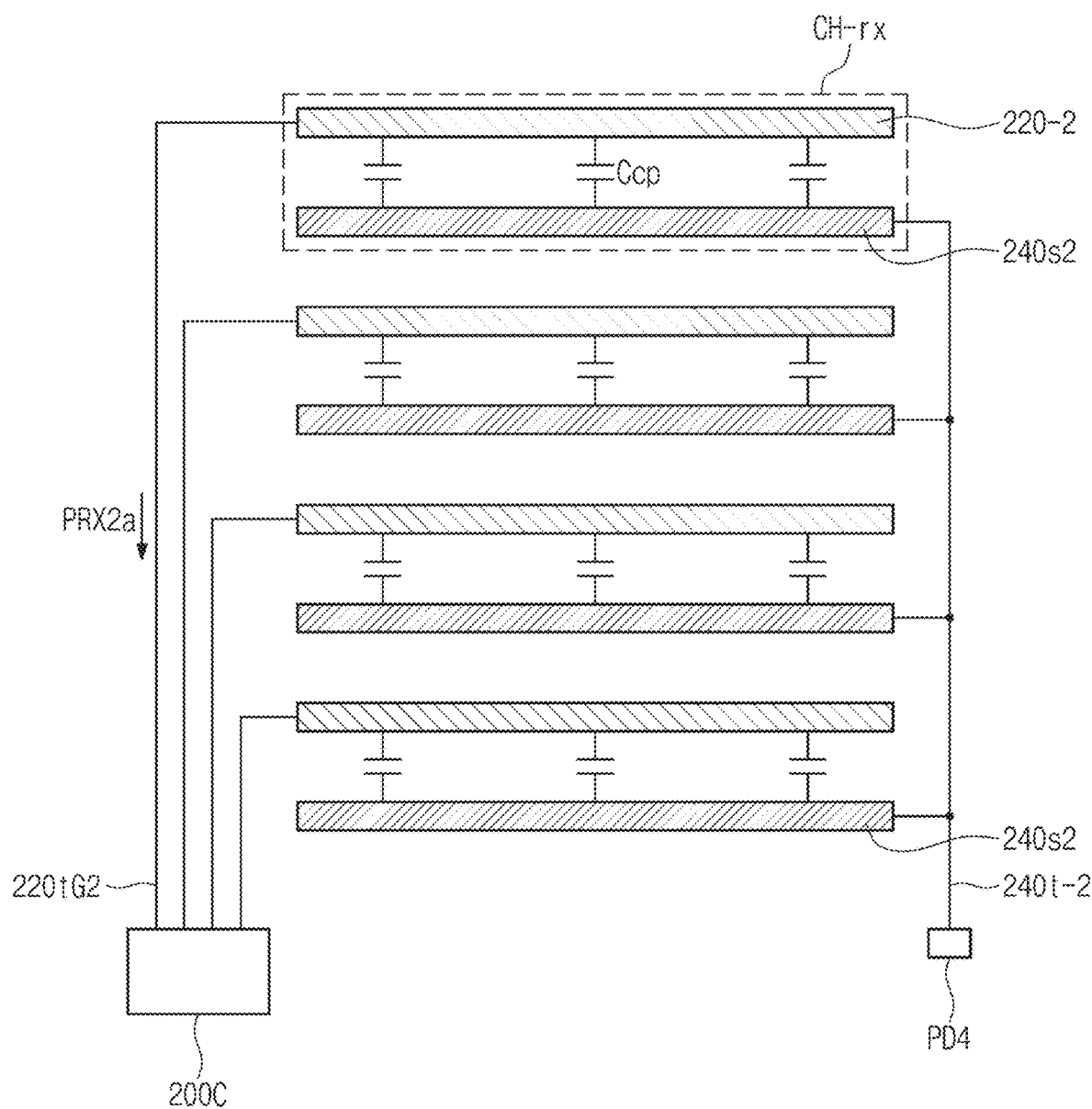
FIG. 25 is a diagram schematically showing four channels, according to some embodiments of the present disclosure.

FIG. 25 is a diagram schematically showing four channels CH-rx, according to some embodiments of the present disclosure.

Referring to FIGS. 24A and 25, the one channel CH-rx may include a second electrode 220-2 and a second auxiliary electrode 240s2 that overlaps the second electrode 220-2. For example, when viewed in the third direction DR3 (see FIG. 24A) (e.g., in a plan view), the second electrode 220 and the second auxiliary electrode 240s2 may overlap each other. The second electrode 220-2 may output the second reception signal PRX2a to the sensor driver 200C, and the second auxiliary electrode 240s2 may be connected to the second electrode 220-2 in a coupling method.

According to some embodiments of the present disclosure, in a pen sensing driving mode, the second auxiliary electrode 240s2 may be electrically connected to a ground. For example, the fourth pad PD4, which is electrically connected to the second auxiliary electrode 240s2, may be grounded. That is, the second auxiliary electrode 240s2 may be directly connected to the ground through the fourth trace line 240t-2 and the fourth pad PD4.

A plurality of coupling capacitors Ccp may be defined between the second electrode 220-2 and the second auxiliary electrode 240s2. In a sensing mode, the sensor driver 200C may receive the induced current flowing toward the second electrode 220-2 from the second auxiliary electrode 240s2 through the coupling capacitors Ccp.

Figure 26A:
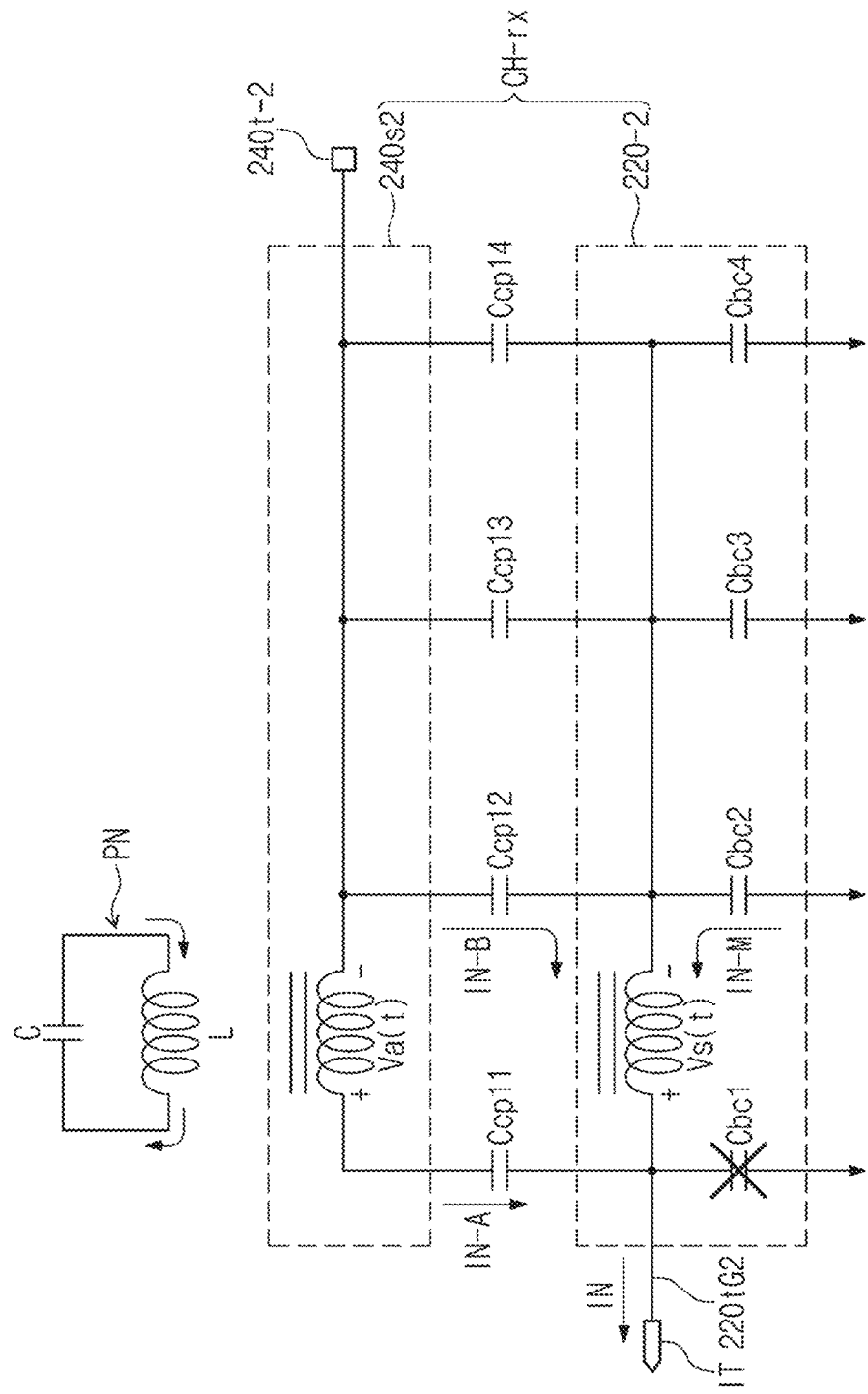
FIG. 26A is an equivalent circuit diagram showing a relationship between one channel and a pen, according to some embodiments of the present disclosure.
Figure 26B:
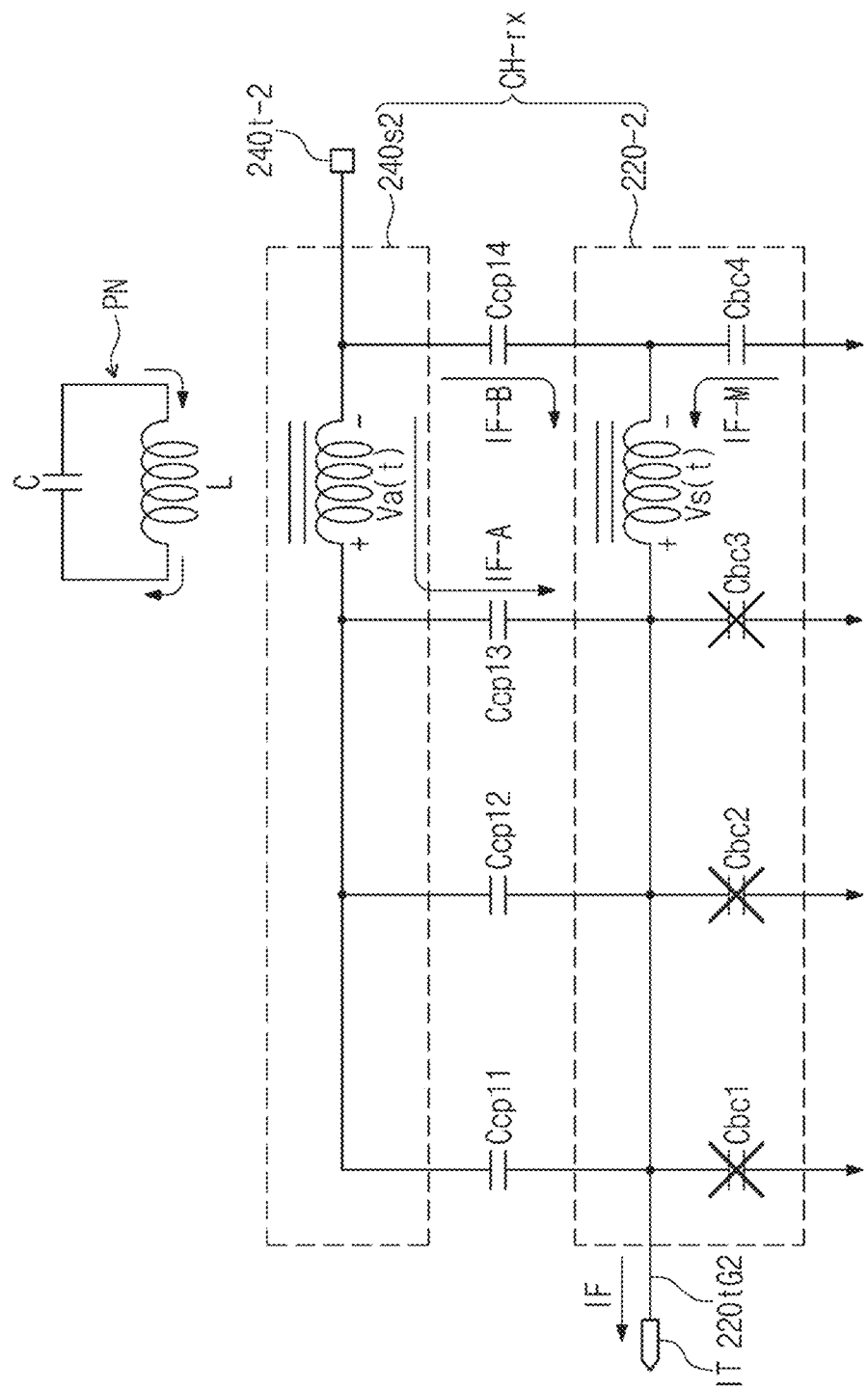
FIG. 26B is an equivalent circuit diagram showing a relationship between one channel and a pen, according to some embodiments of the present disclosure.

FIG. 26A is an equivalent circuit diagram showing a relationship between one channel and a pen, according to some embodiments of the present disclosure. FIG. 26B is an equivalent circuit diagram showing a relationship between one channel and a pen, according to some embodiments of the present disclosure.

Referring to FIGS. 9, 25, 26A and 26B, the one channel CH-rx may include the second electrode 220-2 connected to an input terminal IT, and the second auxiliary electrode 240s2 of the fourth electrode 240 that is connected to the second electrode 220-2 in a coupling method.

A plurality of coupling capacitors Ccp11, Ccp12, Ccp13, and Ccp14 may be defined between the second electrode 220-2 and the second auxiliary electrode 240s2. Moreover, capacitors Cbc1, Cbc2, Cbc3, and Cbc4 are defined in the second electrode 220-2. The capacitors Cbc1, Cbc2, Cbc3, and Cbc4 may be referred to as "parasitic capacitors" or "base capacitors".

The input terminal IT may correspond to one pad (e.g., the second pad PD2) electrically connected between the sensor driver 200C and the second electrode 220-2. One end of the second auxiliary electrode 240s2 may be electrically connected to the fourth trace line 240t-2. The other end of the second auxiliary electrode 240s2 may be floated.

Referring to FIG. 26A, when the pen PN is close to the one channel CH-rx, first induced electromotive force Vs(t) may be generated in the second electrode 220-2 by the magnetic field generated from the pen PN, and second induced electromotive force Va(t) may be generated in the second auxiliary electrode 240s2. The first induced current IN-M and the third induced current IN-B may be generated by the first induced electromotive force Vs(t), and the second induced current IN-A may be generated by the second induced electromotive force Va(t). Therefore, the total induced current IN input to the input terminal IT may correspond to the sum of the first to third induced currents IN-M, IN-A, and IN-B.

For example, it is assumed that the capacitance of each of the capacitors Cbc1, Cbc2, Cbc3, and Cbc4 is Cb, and it is assumed that the capacitance of each of the coupling capacitors Ccp11, Ccp12, Ccp13, and Ccp14 is Cc.

The first induced current IN-M over time may be expressed by the equation below.

$$\overline{3Cb\frac{dVs(t)}{dt}}$$

The second induced current IN-A over time may be expressed by the equation below.

$$\overline{Cc\frac{dVa(t)}{dt}}$$

The third induced current IN-B over time may be expressed by the equation below.

$$\overline{3Cc\frac{dVs(t)}{dt}}$$

The first induced current IN-M may be the induced current caused by at least part of the capacitors Cbc1, Cbc2, Cbc3, and Cbc4 and may be referred to as an auxiliary-induced current. The first induced current IN-M generated at the first electrode 210 may be referred to as a "first auxiliary-induced current". The first induced current IN-M generated in the second electrode 220 may be referred to as a "second auxiliary-induced current". Each of the second induced current IN-A and the third induced current IN-B may be the induced current due to at least part of the coupling capacitors Ccp11, Ccp12, Ccp13, and Ccp14, and may be referred to as a "coupling induced current".

Referring to FIG. 26B, when the pen PN is close to the one channel CH-rx, the first induced electromotive force Vs(t) may be generated in the second electrode 220-2 by the magnetic field generated from the pen PN, and the second induced electromotive force Va(t) may be generated in the second auxiliary electrode 240s2. Because all voltages at both ends of each of the capacitors Cbc1, Cbc2, and Cbc3 placed between the first induced electromotive force Vs(t) and the input terminal IT are grounded, a current may not flow through the capacitors Cbc1, Cbc2, and Cbc3.

The first induced current IF-M and the third induced current IF-B may be generated by the first induced electromotive force Vs(t), and a second induced current IF-A may be generated by the second induced electromotive force Va(t). Therefore, the total induced current IF input to the input terminal IT may correspond to the sum of the first to third induced currents IF-M, IF-A, and IF-B.

For example, it is assumed that the capacitance of each of the capacitors Cbc1, Cbc2, Cbc3, and Cbc4 is Cb, and it is assumed that the capacitance of each of the coupling capacitors Ccp11, Ccp12, Ccp13, and Ccp14 is Cc.

The first induced current IF-M over time may be expressed by the equation below.

$$\overline{Cb\frac{dVs(t)}{dt}}$$

The second induced current IF-A over time may be expressed by the equation below.

$$\overline{3Cc\frac{dVa(t)}{dt}} \quad (5)$$

The third induced current IF-B over time may be expressed by the equation below.

$$\overline{Cc\frac{dVs(t)}{dt}}$$

The second induced current IF-A and the third induced current IF-B generated in the second auxiliary electrode 240s2 may be additionally generated by the coupling capacitors Ccp11, Ccp12, Ccp13, and Ccp14. Therefore, compared to a case where the second auxiliary electrode 240s2 is not present, the total induced current IF may be increased, and the total induced current IF may be great enough to sense the pen's input.

Figure 27:
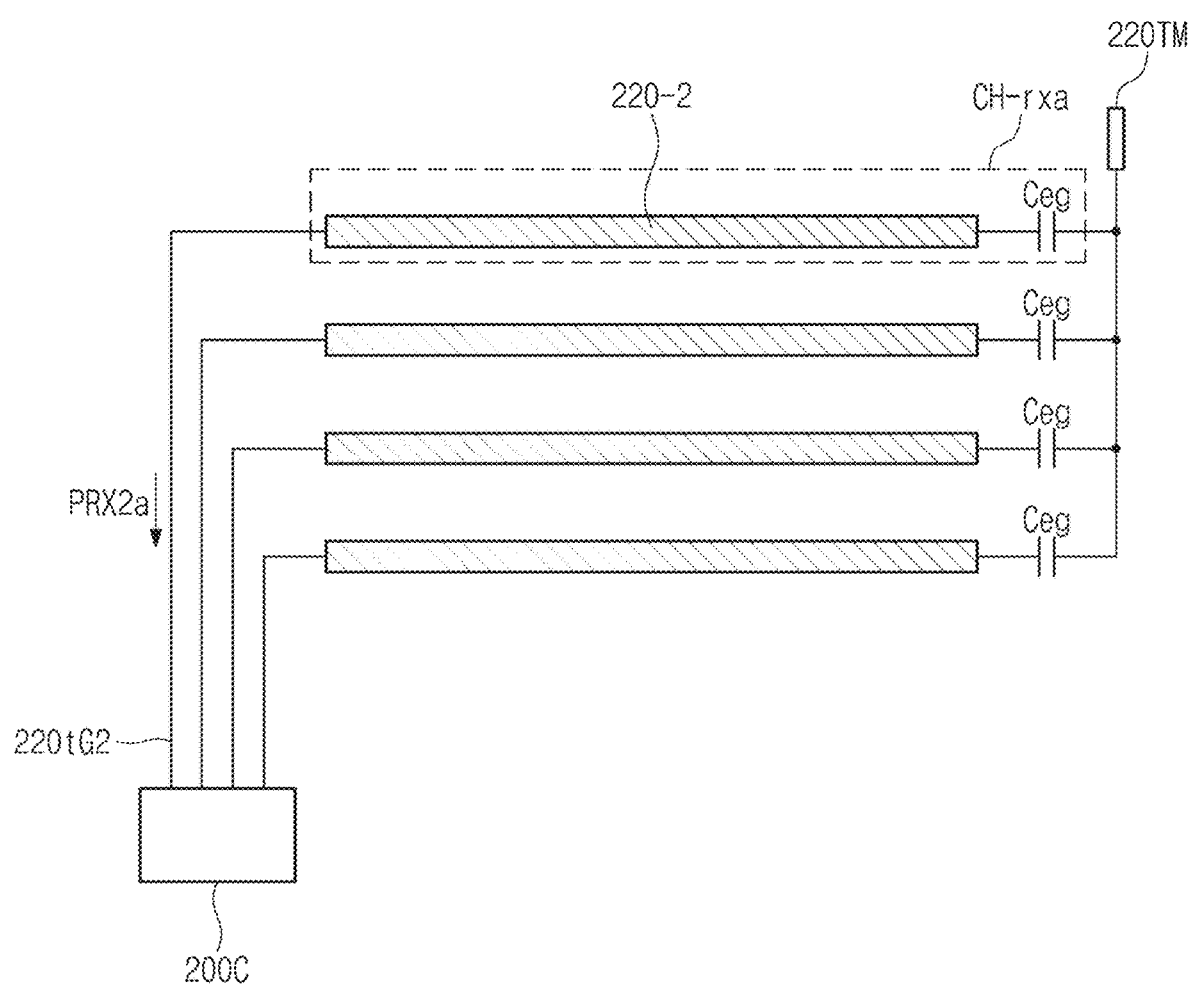
FIG. 27 is a diagram schematically showing four channels, according to some embodiments of the present disclosure.
Figure 28A:
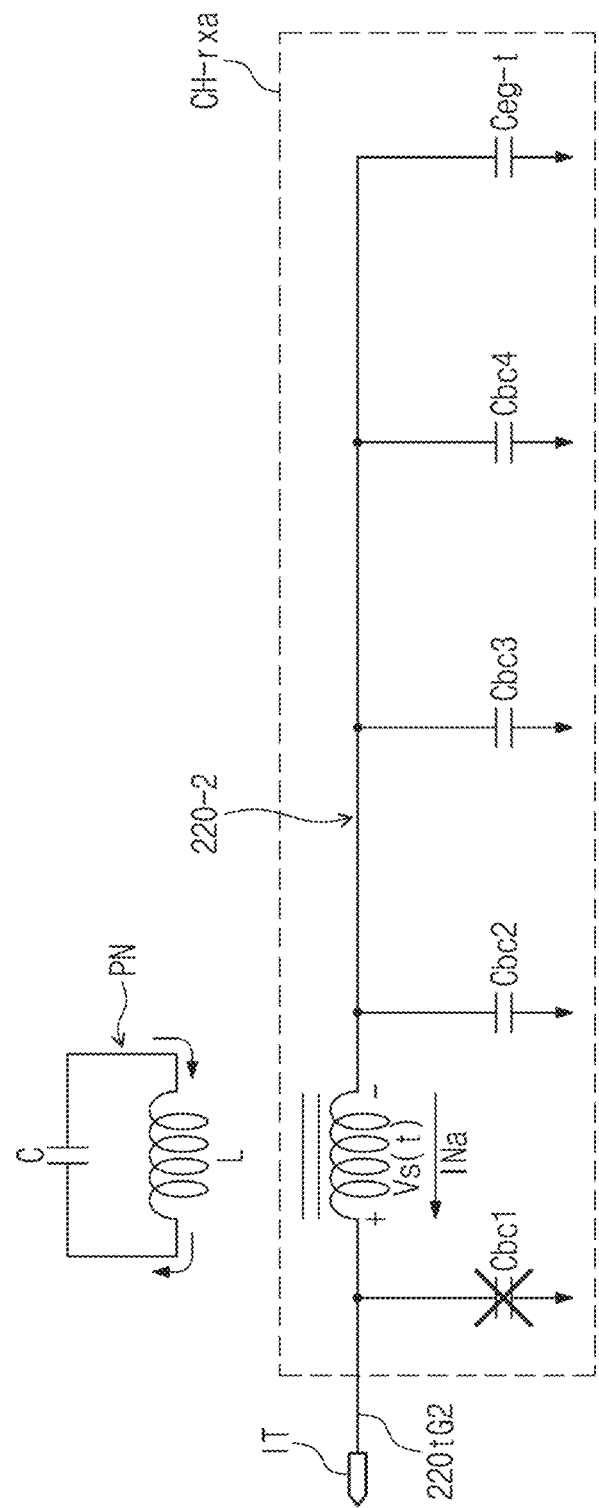
FIG. 28A is an equivalent circuit diagram showing a relationship between one channel and a pen, according to some embodiments of the present disclosure.
Figure 28B:
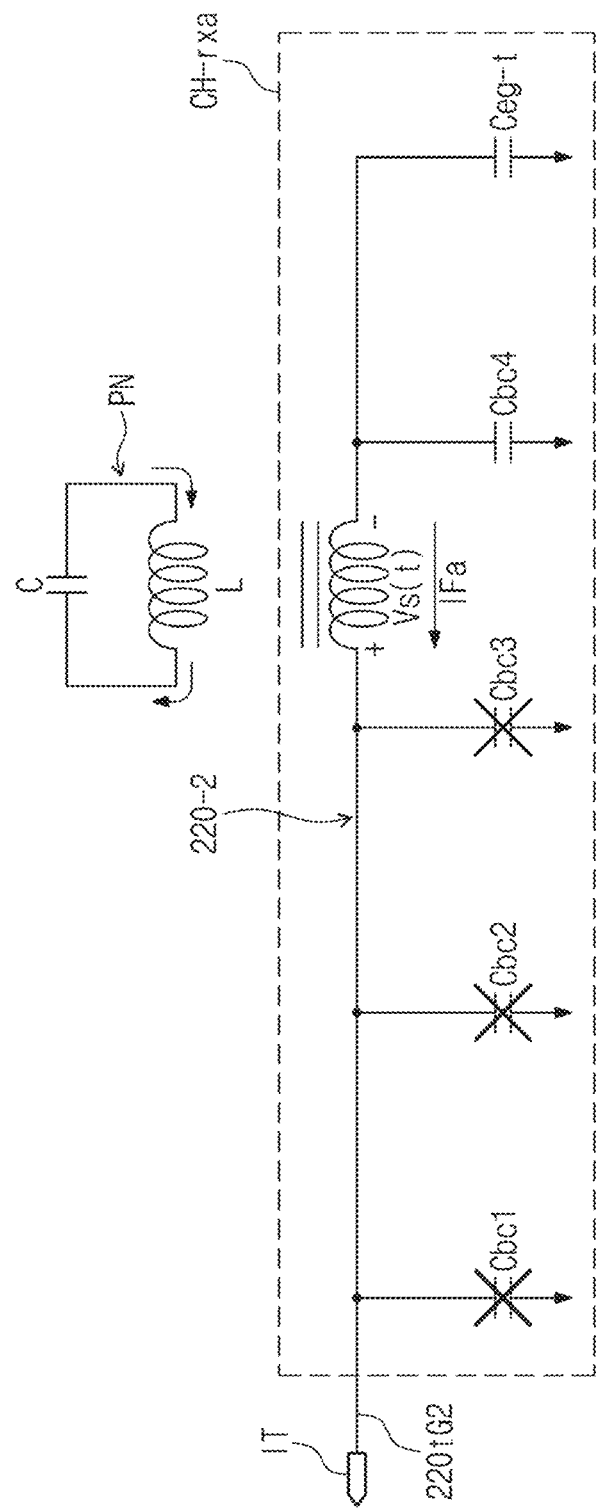
FIG. 28B is an equivalent circuit diagram showing a relationship between one channel and a pen, according to some embodiments of the present disclosure.

FIG. 27 is a diagram schematically showing four channels, according to some embodiments of the present disclosure. FIG. 28A is an equivalent circuit diagram showing a relationship between one channel and a pen, according to some embodiments of the present disclosure. FIG. 28B is an equivalent circuit diagram showing a relationship between one channel and a pen, according to some embodiments of the present disclosure.

Referring to FIGS. 24A and 27, one channel CH-rxa may include the second electrode 220-2 and an edge capacitor Ceg electrically connected to the second electrode 220-2. In a pen sensing driving mode, all of the second electrodes 220-2 may be electrically connected to a one terminal 220TM through the edge capacitor Ceg. The terminal 220TM may be grounded, or a bias voltage may be applied to the terminal 220TM.

Referring to FIGS. 27 and 28A, the one channel CH-rxa may consist of one second electrode 220-2 connected to the input terminal IT. The input terminal IT may correspond to a pad electrically connected between the sensor driver 200C and the second electrode 220-2.

The capacitors Cbc1, Cbc2, Cbc3, and Cbc4 are defined in the second electrode 220-2. The capacitors Cbc1, Cbc2, Cbc3, and Cbc4 may be referred to as "parasitic capacitors" or "base capacitors". Furthermore, the second electrode 220-2 may be electrically connected to an edge capacitor Ceg-t. According to some embodiments of the present disclosure, the capacitance of the edge capacitor Ceg-t may be greater than the capacitance of each of the capacitors Cbc1, Cbc2, Cbc3, and Cbc4.

Referring to FIG. 28A, when the pen PN is close to the one channel CH-rxa, the first induced electromotive force Vs(t) may be generated in the second electrode 220-2 by the magnetic field generated from the pen PN. Accordingly, an induced current INa may be generated in the one channel CH-rxa. One of a non-inverting terminal and an inverting terminal of a charge voltage amplifier may be electrically connected to the input terminal IT, and the other thereof may be grounded. In this case, it is identified that the input terminal IT is grounded. Accordingly, all of the voltages on both ends of the capacitor Cbc1 among the capacitors Cbc1, Cbc2, Cbc3, and Cbc4 are grounded, and thus a current may not flow into the capacitor Cbc1.

Assuming that the capacitance of each of the capacitor Cbc2, Cbc3, and Cbc4 is Cb, and the capacitance of the edge capacitor Ceg-t is Ce, the induced current INa over time may be expressed by the equation below.

$$\overline{(3Cb+Ce)\frac{dVs(t)}{dt}}$$

Referring to FIG. 28B, when the pen PN is close to the one channel CH-rxa, the induced current IFa may be generated in the one channel CH-rxa by the magnetic field generated from the pen PN. All of the voltages of both ends of each of the first to third capacitors Cbc1, Cbc2, and Cbc3 among the capacitors Cbc1, Cbc2, Cbc3, and Cbc4 are grounded, and thus a current may not flow through the capacitors Cbc1, Cbc2, and Cbc3. Assuming that the capacitance of the capacitor Cbc4 is Cb and the capacitance of the edge capacitor Ceg-t is Ce, the induced current IFa over time may be expressed by the equation below.

$$\overline{(Cb+Ce)\frac{dVs(t)}{dt}}$$

Referring to FIGS. 28A and 28B, the magnitude of a current may be improved by the edge capacitor Ceg-t. Therefore, compared to a case where the edge capacitor Ceg-t is not present, the total induced current IFa may be increased, and the total induced current IFa may be great enough to sense the pen's input.

Figure 29:
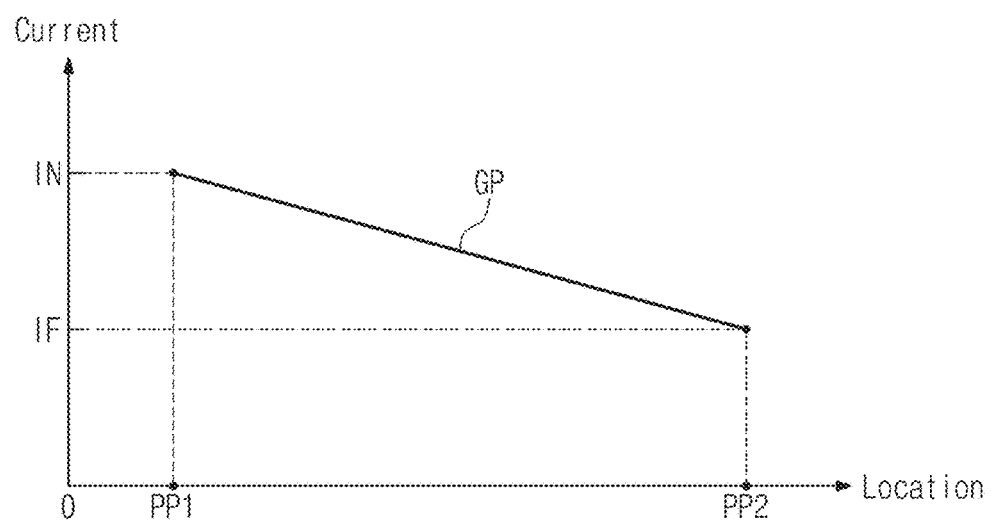
FIG. 29 is a graph showing a current magnitude according to a pen's location for one channel.

FIG. 29 is a graph showing a current magnitude according to a pen's location for one channel.

Referring to FIG. 29, a first point PP1 may correspond to a location of the pen PN shown in FIGS. 26A and 28A, and a second point PP2 may correspond to the location of the pen PN shown in FIGS. 26B and 28B.

As described with reference to FIGS. 25 and 26B, the second induced current IF-A and the third induced current IF-B generated in the second auxiliary electrode 240s2 may be additionally generated by the coupling capacitors Ccp11, Ccp12, Ccp13, and Ccp14. Therefore, the total induced current IF may be increased, and the total induced current IF may be great enough to sense the pen's input.

As described with reference to FIGS. 27 and 28B, the total capacitance may be compensated for (or improved) by the edge capacitor Ceg-t. Therefore, the total induced current IFa may be increased, and the total induced current IFa may be great enough to sense the pen's input.

Figure 30:
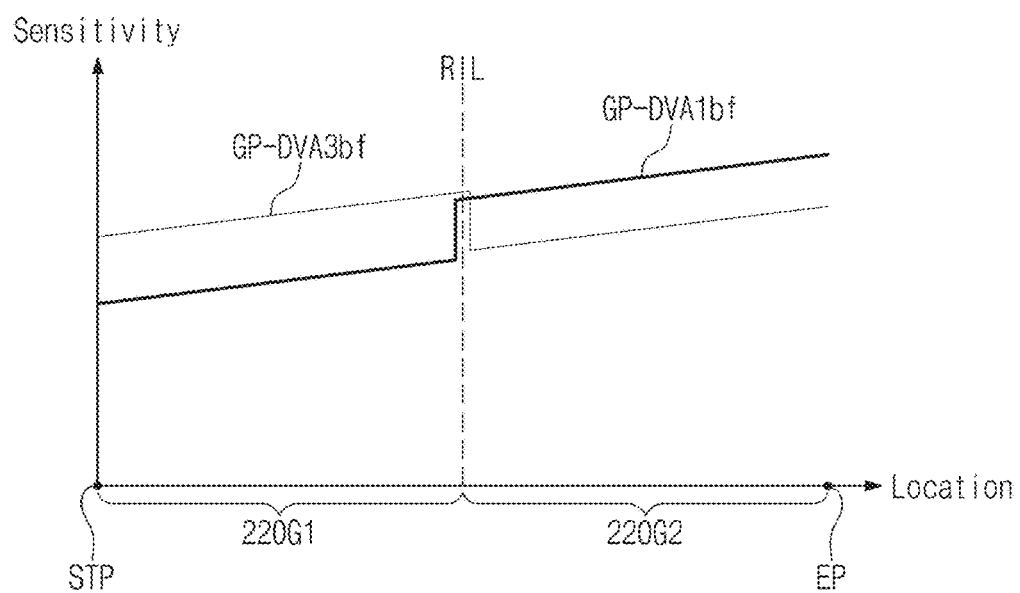
FIG. 30 is a graph showing sensitivity according to locations of a plurality of channels, according to a comparative example of the present disclosure.

FIG. 30 is a graph showing sensitivity according to locations of a plurality of channels, according to a comparative example of the present disclosure.

FIG. 16 illustrates a first trajectory P-MT1 from a start point STP to an end point EP in the first outer division area DVA1, and a second trajectory P-MT2 from a start point STP to an end point EP in the second outer division area DVA3. The first trajectory P-MT1 and the second trajectory P-MT2 may pass through the first electrode group 220G1, the boundary RIL between the first electrode group 220G1 and the second electrode group 220G2, and the second electrode group 220G2, Referring to FIGS. 16 and 30, a graph illustrating the sensitivity of each of signals received from the second electrodes 220 while a gain and a weight are not adjusted is shown. A first graph GP-DVA1bf may correspond to a sensitivity change according to the first trajectory P-MT1 in the first outer division area DVA1, and a second graph GP-DVA3*bf* may correspond to a sensitivity change according to the second trajectory P-MT2 in the second outer division area DVA3.

Referring to FIG. 30, it may be identified that the sensitivity changes rapidly based on the boundary RIL because the gain and the weight are not adjusted. In this case, coordinate accuracy based on the boundary RIL may be relatively reduced or undesirable. According to some embodiments of the present disclosure, an active area may be detected, and thus at least one of the gain or the weight may be adjusted. Therefore, an extent to which sensitivity is changed at the boundary RIL may be relatively reduced or eliminated.

Figure 31:
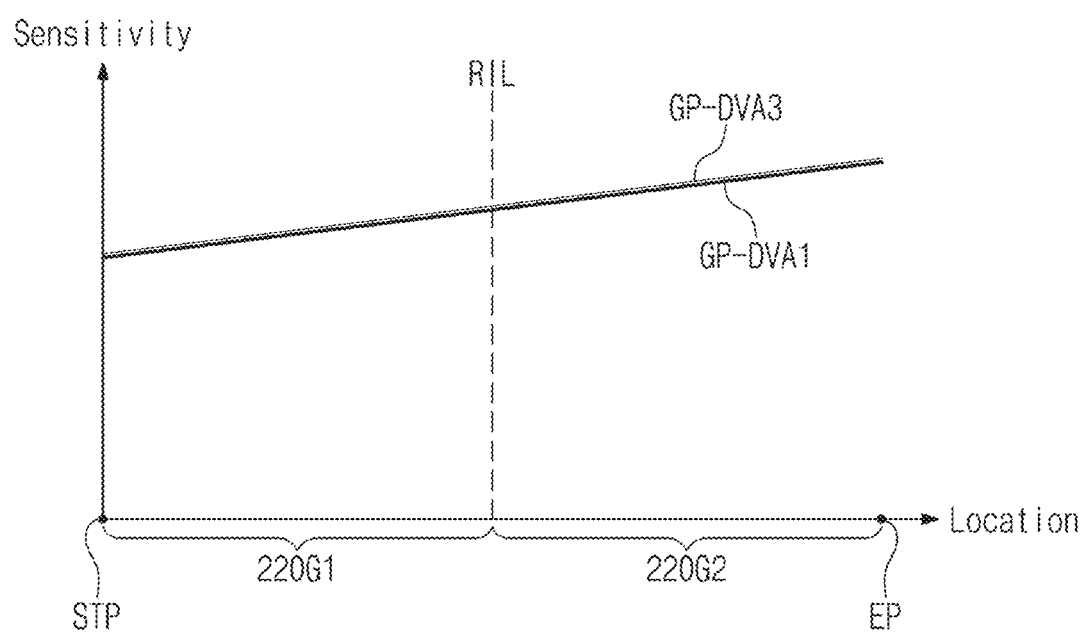
FIG. 31 is a graph showing sensitivity according to locations of a plurality of channels, according to some embodiments of the present disclosure.

FIG. 31 is a graph showing sensitivity according to locations of a plurality of channels, according to some embodiments of the present disclosure.

FIG. 31 illustrates a graph indicating the sensitivity of a signal received from the second electrodes 220 while at least one of a gain or a weight is adjusted. A first graph GP-DVA1 may correspond to a sensitivity change according to the first trajectory P-MT1 in the first outer division area DVA1, and a second graph GP-DVA3 may correspond to a sensitivity change according to the second trajectory P-MT2 in the second outer division area DVA3.

At least one of a gain or a weight may be adjusted to adjust sensitivities of signals received from the first electrode group 220G1 and the second electrode group 220G2 divided based on the boundary RIL such that the sensitivities are substantially the same as each other or a difference between the sensitivities is reduced. Therefore, the sensitivity may be adjusted by using the same (or substantially the same) slope even at the boundary RIL, thereby relatively improving coordinate detection accuracy.

Figures 32, 33:
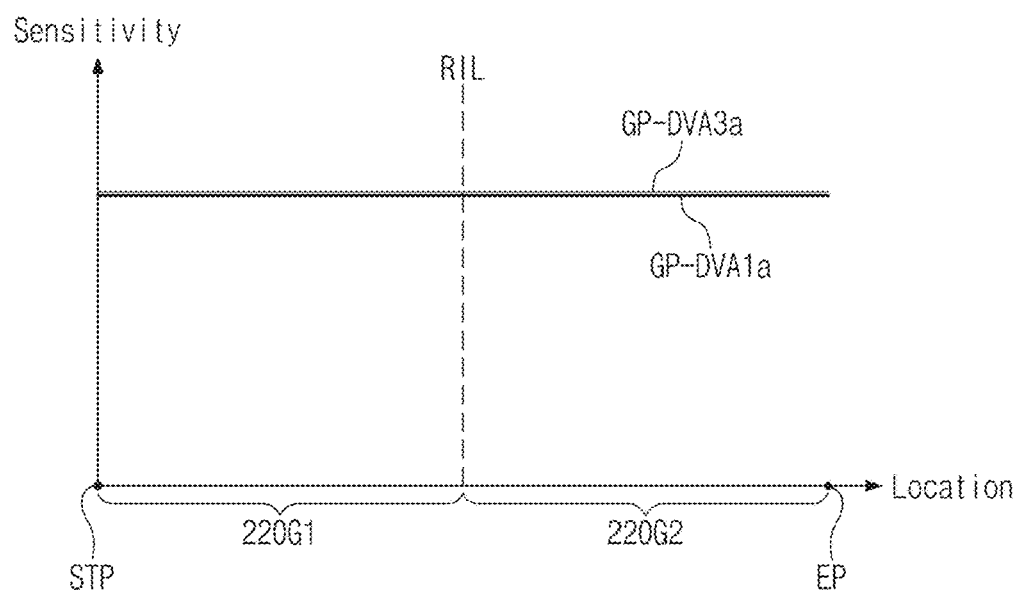
FIG. 32 is a diagram showing gain values corresponding to channels, according to some embodiments of the present disclosure.
FIG. 33 is a graph showing sensitivity according to locations of a plurality of channels, according to some embodiments of the present disclosure.

FIG. 32 is a diagram showing gain values corresponding to channels, according to some embodiments of the present disclosure. FIG. 33 is a graph showing sensitivity according to a pen location for a plurality of channels, according to some embodiments of the present disclosure.

Referring to FIGS. 6, 32, and 33, gains applied to signals received from the second electrodes 220-1 included in the first electrode group 220G1 and gains applied to signals received from the second electrodes 220-2 included in the second electrode group 220G2 may be determined.

For example, when an active area is the first outer division area DVA1, gain values applied to signals received from the second electrodes 220-1 and the second electrodes 220-2 may be determined as GAIN_1*a*, GAIN_1*b*, GAIN_1*c*, and GAIN_1*d*, respectively. GAIN_1*a*, GAIN_1*b*, GAIN_1*c*, and GAIN_1*d* may be different from each other; some of GAIN_1*a*, GAIN_1*b*, GAIN_1*c*, and GAIN_1*d* may be the same as each other; and some of GAIN_1*a*, GAIN_1*b*, GAIN_1*c*, and GAIN_1*d* may be different from each other. For example, GAIN_1*a* may be greatest, and GAIN_1*d* may be smallest. When an active area is the central outer division area DVA2, gain values applied to signals received from the second electrodes 220-1 and the second electrodes 220-2 may be determined as GAIN_2*a*, GAIN_2*b*, GAIN_2*c*, and GAIN_1*d*, respectively. GAIN_2*a*, GAIN_2*b*, GAIN_2*c*, and GAIN_2*d* may be different from each other; some of GAIN_2*a*, GAIN_2*b*, GAIN_2*c*, and GAIN_2*d* may be the same as each other; and some of GAIN_2*a*, GAIN_2*b*, GAIN_2*c*, and GAIN_2*d* may be different from each other. When an active area is the second outer division area DVA3, gain values applied to signals received from the second electrodes 220-1 and the second electrodes 220-2 may be determined as GAIN_3*a*, GAIN_3*b*, GAIN_3*c*, and GAIN_3*d*, respectively. GAIN_3*a*, GAIN_3*b*, GAIN_3*c*, and GAIN_3*d* may be different from each other; some of GAIN_3*a*, GAIN_3*b*, GAIN_3*c*, and GAIN_3*d* may be the same as each other; and some of GAIN_3*a*, GAIN_3*b*, GAIN_3*c*, and GAIN_3*d* may be different from each other.

Referring to FIGS. 16 and 33, a first graph GP-DVA1*a* may correspond to a sensitivity change according to the first trajectory P-MT1 in the first outer division area DVA1, and a second graph GP-DVA3*a* may correspond to a sensitivity change according to the second trajectory P-MT2 in the second outer division area DVA3.

According to some embodiments of the present disclosure, at least one of a gain or a weight may be determined with respect to signals received from the second electrodes 220-1 and the second electrodes 220-2. Accordingly, sensitivities of signals received from the first electrode group 220G1 and the second electrode group 220G2 may be substantially the same as each other, and a sensitivity difference according to a distance may also be eliminated. As a result, both the sensitivity difference according to a change in a routing direction and a sensitivity difference according to a pen location are corrected, thereby relatively improving pen detection accuracy.

Figure 34:
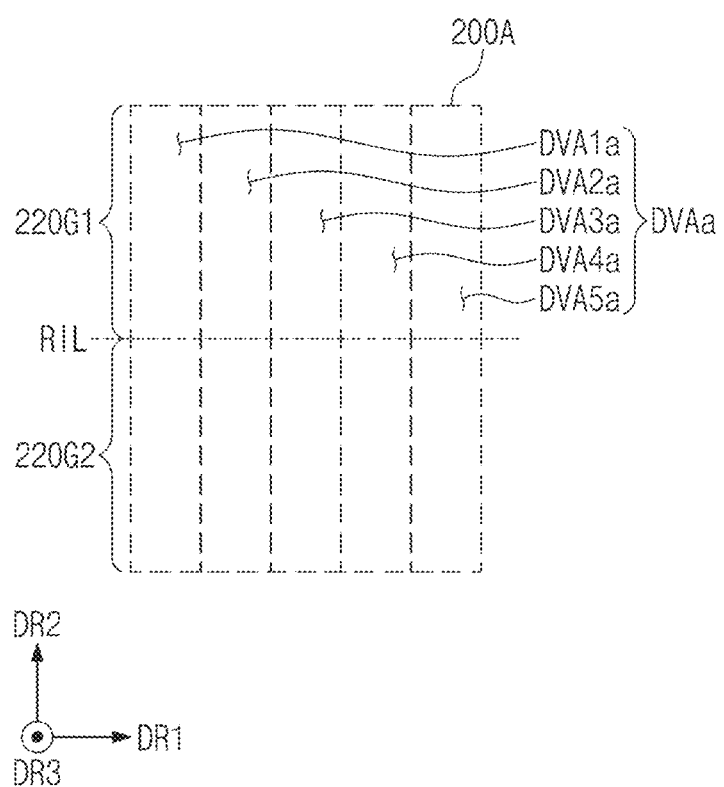
FIG. 34 is a diagram showing division areas, according to some embodiments of the present disclosure.

FIG. 34 is a diagram showing division areas, according to some embodiments of the present disclosure.

Referring to FIGS. 6 and 34, a sensing area 200A of the sensor layer 200 may include a plurality of division areas DVAa defined in the first direction DR1. For example, the plurality of division areas DVA may include a first outer division area DVA1*a*, a second outer division area DVA2*a*, a central division area DVA3*a*, a third outer division area DVA4*a*, and a fourth outer division area DVA5*a*.

According to some embodiments of the present disclosure, at least one of a gain or a weight, which are applied to each of signals received from the second electrodes 220 may be changed depending on an active area, in which a pen is located, from among the division areas DVAa. For example, depending on an active area, at least one of a gain or a weight applied to each of signals received from the first electrode group 220G1 located on the boundary RIL may be adjusted; at least one of a gain or a weight applied to each of signals received from the second electrode group 220G2 located below the boundary RIL may be adjusted; and, at least one of the gain or the weight applied to each of the signals received from the first electrode group 220G1 and at least one of the gain or the weight applied to each of the signals received from the second electrode group 220G2 may be adjusted.

According to some embodiments of the present disclosure, as an active area moves away from a routing area, at least one of a gain or a weight may be increased. For example, referring to FIGS. 6 and 34 together, in the first electrode group 220G1, a weight applied when the active area is the first outer division area DVA1*a* may be greater than a weight applied when the active area is the fourth outer division area DVA5*a*. Moreover, in the second electrode group 220G2, a weight applied when the active area is the first outer division area DVA1*a* may be smaller than a weight applied when the active area is the fourth outer division area DVA5*a*.

In FIG. 34, it is described that the number of division areas DVAa is 5. However, the number of division areas DVAa is not limited to the example described in this specification. For example, the number of division areas DVAa may be two or more, or more than five, and may not be particularly limited thereto. That is, the number of division areas DVAa may vary according to various embodiments, and any suitable number of division areas may be utilized according to the design of the display device.

Figure 35A:
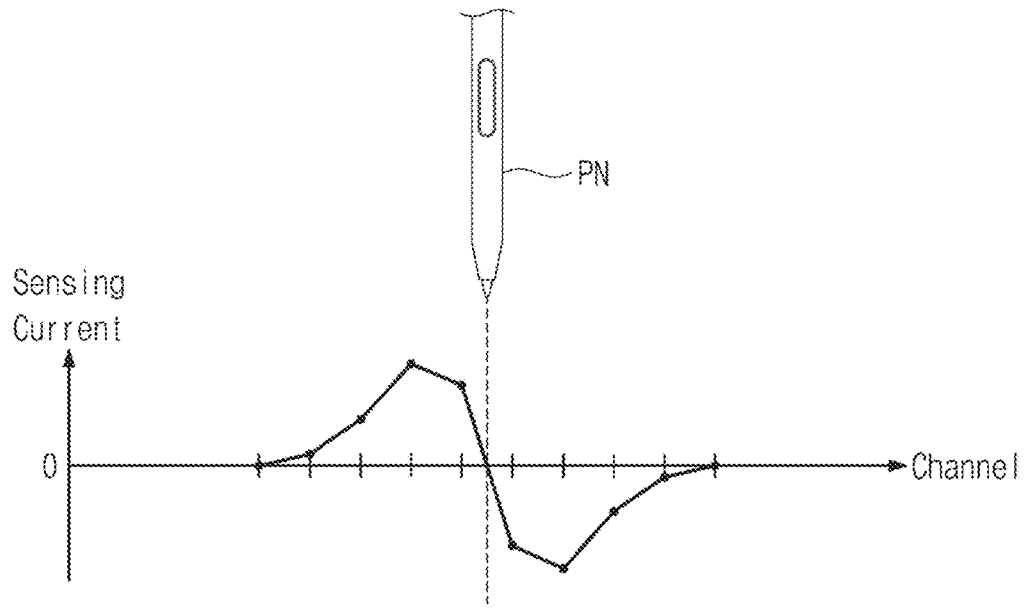
FIG. 35A is a diagram showing a current sensed at a plurality of channels, according to some embodiments of the present disclosure.
Figure 35B:
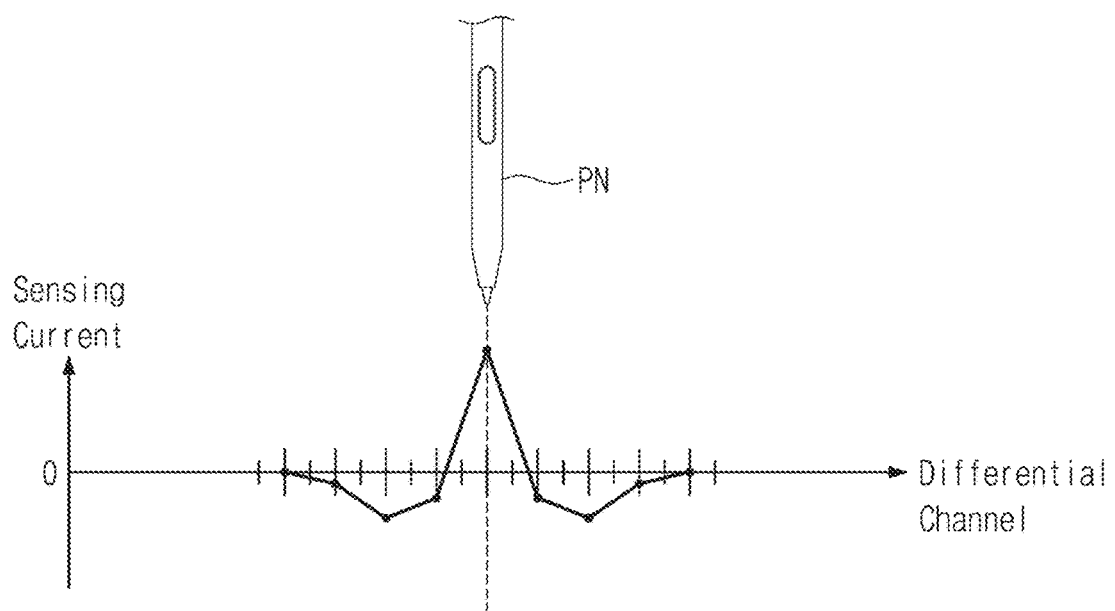
FIG. 35B is a diagram showing a current obtained from a differential pair of a plurality of channels, according to some embodiments of the present disclosure.
Figure 35C:
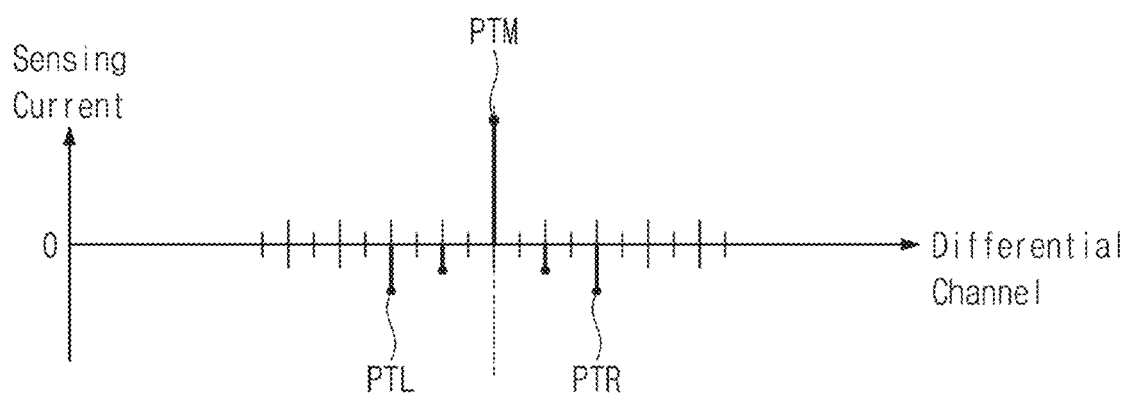
FIG. 35C is a diagram for describing a method for recognizing a pen location, according to some embodiments of the present disclosure.

FIG. 35A is a diagram showing a current sensed at a plurality of channels, according to some embodiments of the present disclosure. FIG. 35B is a diagram showing a current obtained from a differential pair of a plurality of channels, according to some embodiments of the present disclosure. FIG. 35C is a diagram for describing a method for recognizing a pen location, according to some embodiments of the present disclosure.

Referring to FIGS. 6 and 35A, a current sensed from the first electrodes 210 or the second electrodes 220 is shown in FIG. 35A. The first electrodes 210 may correspond to first channels, and the second electrodes 220 may correspond to second channels. In other words, FIG. 35A is a diagram showing the current sensed in the second channels, and FIG. 35B is a diagram showing the current obtained from a differential pair of the second channels.

Referring to FIG. 35A, directions of currents sensed from the second channels spaced from each other with a portion, in which the pen PN is located, therebetween may be different from each other. Accordingly, on the basis of the location of the pen PN, a direction of a current flowing into channels on the left side may be different from a direction of a current flowing into channels on the right side. Accordingly, the sensor driver 200C may sense currents flowing in different directions based on the location of the pen PN. Referring to FIG. 35B, the sensor driver 200C may sense currents by differentially sensing channels adjacent to each other or channels spaced apart from each other among the second channels. When the sensor driver 200C senses currents by using differential sensing, as shown in FIG. 29, a difference in a current magnitude according to a pen location for one channel may be compensated for.

Referring to FIG. 35C, points PTM, PTL, and PTR required for calculating location coordinates of the pen PN are selected from a sensing current value graph. In the points PTM, PTL, and PTR, the max value PTM of the sensing current value, the 'n' points PTL neighboring to the left side of the max value PTM, and the 'n' points PTR neighboring to the right side of the max value PTM may be selected. 'n' may be 1 or more. FIG. 35C shows that 'n' is 2. The sensor driver 200C may recognize a y-coordinate of the location of the pen PN by using the center of gravity method from the selected points PTM, PTL, and PTR. However, embodiments according to the present disclosure are not particularly limited thereto. For example, the sensor driver 200C may derive a trend line from the selected points PTM, PTL, and PTR and may also calculate the y-coordinate of the pen PN based on the maximum point of the trend line.

Although aspects of some embodiments of the present disclosure have been described for illustrative purposes, those skilled in the art will appreciate that various modifications, and substitutions are possible, without departing from the scope and spirit of embodiments according to the present disclosure as disclosed in the accompanying claims and their equivalents. Accordingly, the technical scope of embodiments according to the present disclosure is not limited to the detailed description of this specification, but should be defined by the claims and their equivalents.

As described above, it may be possible to sense an input by a pen as well as a touch input by using a sensor layer. Accordingly, because there is no need to add a separate component (e.g., a digitizer) for sensing a pen to an electronic device, an increase in the thickness of an electronic device, an increase in the weight of the electronic device, or a decrease in flexibility of the electronic device may not occur due to the addition of a digitizer. Moreover, a sensor driver may be implemented such that at least one of gains or weights applied to signals received from a first electrode group and a second electrode group, which have different routing directions from each other, varies depending on a location of the detected pen. Accordingly, a sensitivity difference according to a change in a routing direction may be corrected, thereby relatively improving pen detection accuracy.

While aspects of some embodiments of the present disclosure have been described with reference to some embodiments thereof, it will be apparent to those of ordinary skill in the art that various changes and modifications may be made thereto without departing from the spirit and scope of the present disclosure as set forth in the following claims and their equivalents.

What is claimed is:

1. An electronic device comprising:
    a sensor layer including a peripheral region having a first peripheral region and second peripheral region, and a main region between the first peripheral region and the second peripheral region; and
    a sensor driver configured to drive the sensor layer,
    wherein the sensor layer further comprises:
    a plurality of first sensing electrodes arranged along a first direction;
    a plurality of first electrodes arranged along the first direction, and overlapping the plurality of first sensing electrodes, respectively;
    a plurality of second sensing electrodes arranged along a second direction crossing the first direction; and
    a plurality of lines in the peripheral region and comprising:
    a first line electrically connected to one of the plurality of second sensing electrodes and in the first peripheral region;
    a second line electrically connected to another one of the plurality of second sensing electrodes and in the second peripheral region,
    a third line connected to a first end of one of the plurality of first electrodes; and
    a fourth line connected to a second end of the one of the plurality of first electrodes,
    wherein, in a driving mode to generate a magnetic field for charging a pen, the sensor driver is configured to apply a first signal to the third line and a second signal, different from the first signal, to the fourth line at a first time, and
    wherein, in a sensing mode to sense an input of the pen, the sensor driver is configured to apply a first weighting value to a first sensing signal received from the first line and a second weighting value, different from the first weighting value, to a second sensing signal received from the second line.

2. The electronic device of claim 1, wherein each of the first weighting value and the second weighting value is at least one of a gain and a weight.

3. The electronic device of claim 2, wherein the sensor driver is further configured to drive the sensor layer in a pre-pen sensing driving mode, and the sensor driver is configured to determine at least one of the gain or the weight applied to the first sensing signal and the second sensing signal.

4. The electronic device of claim 2, wherein the sensor driver includes a charge voltage amplifier electrically connected to at least one of the plurality of second sensing electrodes, and a resistor and a capacitor, which are connected to an input terminal and an output terminal of the charge voltage amplifier, and wherein the sensor driver is further configured to adjust the gain by changing at least one of the resistor or the capacitor.

5. The electronic device of claim 2, wherein the sensor driver includes an analog-to-digital converter electrically connected to at least one of the plurality of second sensing electrodes, and wherein the sensor driver is configured to apply the weight to a digital signal output from the analog-to-digital converter.

6. The electronic device of claim 2, wherein the main region comprises a plurality of division areas defined along the first direction, and the sensor driver is further configured to:

drive the sensor layer in a pre-pen sensing driving mode; and detect an active area of the sensor layer corresponding to the input from among the plurality of division areas that corresponds to a pen location according to the input.

7. The electronic device of claim 6, wherein the sensor driver is further configured to adjust at least one of the gain or the weight applied to at least one of the first sensing signal or the second sensing signal according to a location of the active area.

8. The electronic device of claim 6, wherein the main region comprises a first outer division area, a central division area, and a second outer division area aligned along the first direction, wherein the sensor driver is configured to control a first gain applied to the first sensing signal to be equal to a second gain applied to the second sensing signal based on the active area corresponding to the central division area, and wherein the sensor driver is configured to control a first weight applied to the first sensing signal to be equal to a second weight applied to the second sensing signal based on the active area corresponding to the central division area.

9. The electronic device of claim 8, wherein the sensor driver is configured to control the first gain applied to the first sensing signal to be different from the second gain applied to the second sensing signal based on the active area corresponding to the first outer division area or the second outer division area.

10. The electronic device of claim 8, wherein the sensor driver is configured to control the first weight applied to the first sensing signal to be different from the second weight applied to the second sensing signal based on the active area corresponding to the first outer division area or the second outer division area.

11. The electronic device of claim 1, wherein the one of the plurality of second sensing electrodes comprises a first portion and a second portion, and the first portion is closer to the first line than the second portion, wherein, in a sensing mode to sense input of the pen, based on an input from the pen being detected at the first portion, the sensor driver is configured to receive a first induced current induced by the magnetic field generated from the pen from the first line, based on an input from the pen being detected at the second portion, the sensor driver is configured to receive a second induced current induced by the magnetic field generated from the pen from the first line, and wherein an intensity of the first induced current is different from an intensity of the second induced current.

* * * * *